United States Patent
Nambu et al.

(10) Patent No.: US 7,123,534 B2
(45) Date of Patent: Oct. 17, 2006

(54) SEMICONDUCTOR MEMORY DEVICE HAVING SHORT REFRESH TIME

(75) Inventors: Hiroaki Nambu, Sagamihara (JP); Noriyuki Homma, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/943,895

(22) Filed: Sep. 20, 2004

(65) Prior Publication Data

US 2005/0063238 A1    Mar. 24, 2005

(30) Foreign Application Priority Data

Sep. 22, 2003   (JP) .............................. 2003-329555

(51) Int. Cl.
*G11C 7/00*   (2006.01)

(52) U.S. Cl. ...................... 365/222; 365/203; 365/210

(58) Field of Classification Search ................ 365/222, 365/185.07, 189.01, 189.12, 203, 210
See application file for complete search history.

(56) References Cited

U.S. PATENT DOCUMENTS

| | | | | |
|---|---|---|---|---|
| 5,193,072 A | * | 3/1993 | Frenkil et al. .............. | 365/222 |
| 5,835,401 A | * | 11/1998 | Green et al. ................ | 365/149 |
| 5,881,010 A | * | 3/1999 | Artieri ......................... | 365/222 |
| 6,154,409 A | * | 11/2000 | Huang et al. ................ | 365/222 |
| 6,535,445 B1 | * | 3/2003 | Lutley ......................... | 365/222 |
| 6,773,972 B1 | * | 8/2004 | Marshall et al. ............ | 438/176 |

FOREIGN PATENT DOCUMENTS

| | | |
|---|---|---|
| JP | 10-501363 | 5/1995 |
| JP | 2001-202775 | 1/2000 |
| WO | WO 95/33265 | 5/1995 |

* cited by examiner

*Primary Examiner*—Huan Hoang
(74) *Attorney, Agent, or Firm*—Reed Smith LLP; Stanley P. Fisher, Esq.; Juan Carlos A. Marquez, Esq.

(57) ABSTRACT

A semiconductor memory device in which memory cells are arranged at intersections between the word lines and the bit lines includes a control unit for selecting, in a second half of a cycle in which a first word line is selected from the word lines to conduct a read or write operation for a first memory cell coupled with the first word line, a second word line other than the first word line and refreshing memory cells corresponding to the second word line. The memory cell includes an amplifier section including two driver transistors of which gate and drain electrodes are respectively cross-coupled with each other and a switch section including selector transistors coupling the amplifier section with the bit lines according to a selection signal on the bit line. Either one of each transistor and each selector transistor is an n-channel transistor or a p-type transistor.

24 Claims, 38 Drawing Sheets

SEMICONDUCTOR MEMORY DEVICE HAVING SHORT REFRESH TIME

INCORPORATION BY REFERENCE

The present application claims priority from Japanese application JP2003-329555 filed on Sep. 22, 2003, the content of which is hereby incorporated by reference into this application.

BACKGROUND OF THE INVENTION

The present invention relates to a semiconductor memory device, and in particular, to a circuit technique suitable for a high-speed and highly-integrated semiconductor memory device.

The semiconductor memory devices includes a dynamic random access memory (DRAM), a static random access memory (SRAM), and a pseudo SRAM. The DRAM is designed using a volatile dynamic memory cell architecture and includes cells each including a single transistor and a single capacitor. The DRAM is volatile, that is, when power source voltage thereof is interrupted, the data stored therein is lost. To continuously keep charge in the capacitor, it is required to periodically refresh the memory. The SRAM is inspected by use of a volatile static memory cell architecture. It is not required to refresh data stored in the memory. As long as power is supplied thereto, the data is kept therein for a long period of time. The pseudo SRAM is designed according to a single-transistor and single-capacitor memory cell architecture, not the volatile dynamic memory architecture used for the DRAM. It is therefore required to periodically refresh the pseudo SRAM.

A known example of the pseudo SRAM includes pseudo four-transistor memory cells. To refresh the memory cells, a refresh pulse is supplied to word lines during a precharge level period of paired data lines (reference is to be made to, for example, JP-A-10-501363 (PCT) (FIG. 3) corresponding to WO95/33265).

In another known example of the pseudo SRAM a rewrite cycle is concealed in the read•write operation as below. While a sense amplifier connected to a pair of bit lines is operating (or is precharging bit lines), an access transistor is slightly turned on (reference is to be made to, for example, JP-A-2001-202775 (FIG. 1; paragraph 20)).

SUMMARY OF THE INVENTION

In the DRAM, to prevent an event in which the voltage of a storage node of the memory cell lowers due to, for example, a leakage current and information stored therein is destroyed, it is required to continuously and sequentially select all word lines to refresh all memory cells. Therefore, during the refresh cycle, the read or write operation cannot be conducted. This consequently reduces performance of a system using such a DRAM.

According to JP-A-10-501363 (PCT), the memory refresh operation is conducted by supplying a refresh pulse to the word lines during a period of time in which the data lines are at a precharge level. The memory refresh can be conducted without causing any delay in the access to memory cells. However, the transistors constituting pseudo four-transistor memory cells are n-channel metal-oxide semiconductor (MOS) transistors. However, application of MOS transistors having different types of conductivity to the memory cells has not been taken into consideration.

According to JP-A-2001-202775, one column of memory cells are refreshed at the same time by increasing potential of bit lines by $\Delta V$ relative to the power source voltage Vdd. However, the operation to increase the bit-line potential by $\Delta V$ differs from the recovery operation. That is, it cannot be considered that the memory refresh operation is conducted in the recovery operation.

It is therefore an object of the present invention to provide a technique which prevents reduction in performance of a system employing such a semiconductor memory device.

Another object of the present invention is to provide a technique capable of preventing reduction in performance of a system employing a semiconductor memory device in which the memory refresh operation is conducted within one cycle so that a read or write operation can be effectively conducted in any cycle.

The objects and novel features of the present invention will become apparent from the consideration of the following detailed description taken in conjunction with the accompanying drawings.

The representative aspects of present invention of this specification will be briefly described as follows.

That is, the refresh operation is conducted during a bit line recovery operation after an information read or write operation such that the refresh operation is conducted during one cycle without entirely using the cycle. Resultantly, a read or write operation can be effectively conducted in any cycle to thereby prevent reduction in performance of a system using the memory. For this purpose, there is provided a semiconductor memory device including a plurality of word lines, a plurality of bit lines arranged to intersect the word lines, a plurality of memory cells arranged at intersections between the word lines and the bit lines, and a control unit for selecting, in a second half of a cycle in which a first word line is selected from the word lines to conduct a read or write operation for a first memory cell coupled with the first word line, a second word line other than the first word line and refreshing memory cells corresponding to the second word line. The memory cell includes an amplifier section including two driver transistors of which gate electrodes and drain electrodes are respectively cross-coupled with each other, and a switch section including selector transistors coupling the amplifier section with the bit lines according to a selection signal on the bit line. When the selector transistors of the memory cell are n-channel transistors, the output voltage from the memory cell is reduced by a threshold voltage value of the n-channel MOS transistor. However, when the driver MOS transistors are n-channel transistors and the selector MOS transistors are p-channel MOS transistors, there can be obtained an advantage that the reduction of the output voltage by the threshold voltage value of the n-channel MOS transistor is prevented.

There can be disposed precharge transistors which are turned on in a recovery operation and which are turned off in a read or write operation. In the refresh operation, the precharge transistors and the selector transistors of the memory cell to be refreshed are turned on.

To precharge bit lines in a short period of time by supplying a sufficient precharge current thereto, it is favorable that a ratio between a gate width and a gate length of each of the precharge transistors is set to be more than a ratio between a gate width and a gate length of each of the driver transistors or the selector transistors.

There can be disposed write transistors which are connected to the bit lines and which are turned on in the write operation.

To conduct a data write operation in a short period of time by supplying a sufficient write current to the memory cell, it is favorable that a ratio between a gate width and a gate length of each of the write transistors is set to be more than a ratio between a gate width and a gate length of each of the driver transistors or the selector transistors.

The driver transistors and the selector transistors can be configured in bulk structure. However, to reduce the area occupied by the memory cell, it is favorable that the driver transistors are configured in bulk structure and each of the selector transistors is laminated above an associated one of the driver transistors, the selector transistors being configured in vertical structure.

To avoid a wrong write operation by the refresh operation, it is favorable that dummy bit lines DBA0, DBB0, etc. similar to bit lines are disposed to control the refresh start timing according to a level of the dummy bit lines such that the refresh operation is started after the level of the bit lines is at a predetermined high level. It is possible in this situation that adjacent to the dummy bit lines, dummy bit lines similar to the bit lines or dummy bit lines similar in a contour to the bit lines are arranged.

To increase accumulable charge by setting capacitance obtained between a drain electrode and a gate electrode of a driving transistor to exceed capacitance (CMC) obtained between a source electrode and the gate electrode of the driving transistor, it is favorable that an opposing area between a drain electrode and a gate electrode of each of the driver transistors is more than an opposing area between a source electrode and the gate electrode thereof. In this configuration, by configuring the drain and gate electrodes of the capacitor in a direction to intersect a semiconductor substrate, even if the areas of the electrodes are increased to obtain a larger capacitance value, the area of the memory cell is not increased.

To reduce the power consumption, it is favorable that by simultaneously selecting two or more of the second word lines to elongate the refresh cycle of the memory cells corresponding to the second word lines.

To reduce the area and the power consumption of the semiconductor circuit, it is favorable to construct the control unit including a frequency divider for dividing a clock signal and a shift register for shifting a selection signal at timing synchronized with an output signal from the divider. In this case, the refresh address generator circuit and the refresh address decoder are not required, and hence the area and the power consumption of the semiconductor circuit can be reduced as much.

To prevent an event in which the memory cell loses the amplifying function and the storage node cannot be restored to the original voltage, it is desirable to supply the memory cell with a power source voltage equal to or more than twice the threshold value of the transistors of the memory cell.

To reduce the power consumption, it is desired that the period of time in which the voltage of the storage node of the memory cell decreases due to, for example, a leakage current is sufficiently longer than the cycle time in which a read or write operation is conducted. In consideration thereof, it is favorable that the refresh cycle of the refresh operation is longer than the cycle of the read or write operation.

To improve reliability of the readout data, it is desirable to dispose an input circuit capable of generating parity information to conduct an error check and an output circuit capable of correcting an error of readout data read from the memory cell according to the readout data and the parity information.

Next, description will be given of advantages obtained according to the representative aspects of present invention described in this specification.

It is possible to prevent reduction in performance of a system employing a semiconductor memory device. Additionally, the memory refresh operation is conducted during one cycle without entirely using the cycle so that a read or write operation can be effectively conducted in any cycle. This consequently prevents reduction in performance of a system employing such a semiconductor memory device.

Other objects, features and advantages of the invention will become apparent from the following description of the embodiments of the invention taken in conjunction with the accompanying drawings.

DESCRIPTION OF THE EMBODIMENTS

Figure 10:
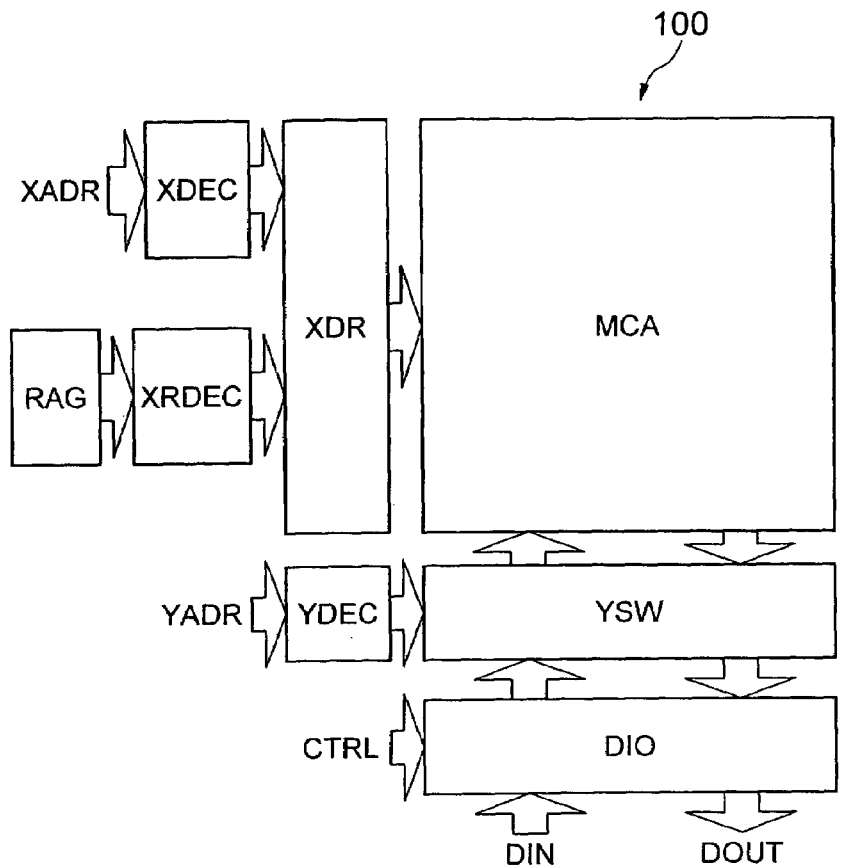
FIG. 10 is a block diagram showing a general configuration of a pseudo SRAM in an example of a semiconductor memory device according to the present invention.

FIG. 10 shows a pseudo SRAM as an example of a semiconductor memory device according to the present invention.

The pseudo SRAM shown in FIG. 10 includes a row address decoder XDEC to decode a row address inputted thereto, a refresh address generator circuit RAG to generate a refresh address, a refresh address decoder XRDEC to decode a refresh address, a word line driver XDR to apply a selection pulse voltage to a word line corresponding to the row address, a memory cell array MCA including a plurality of memory cells disposed in the form of an array, a column address decoder YDEC to decode a column address YADR, a column selector circuit YSW to couple a data line selectively to common data line according to a decoded output signal from the column address decoder YDEC, and a data input/output circuit DI0 which writes a data input signal DIN in a selected cell according to a memory control signal CTRL and which amplifies information in a selected cell to produce a data output signal DOUT. The pseudo SRAM is formed on one semiconductor substrate such as a substrate of monocrystalline silicon using a known semiconductor integrated circuit manufacturing technique. The word line driver XDR is configured to apply a selection pulse voltage also to a word line corresponding to the refresh address. The refresh address generator is an example of a control module according to the present invention.

Figure 11:
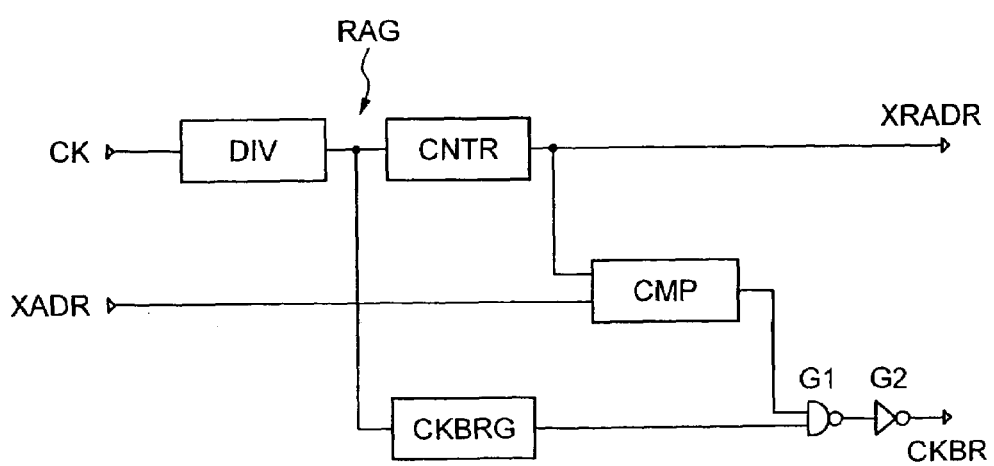
FIG. 11 is a block diagram showing a configuration of a refresh address generator circuit in the pseudo SRAM shown in FIG. 10.

FIG. 11 shows an example of a configuration of the refresh address generator RAG shown in FIG. 10. The configuration of FIG. 11 includes a clock signal CK, a row address signal XADR, a refresh address signal XRADR, and a refresh address clock signal CKBR. The configuration also includes a frequency divider DIV, a counter CNTR, an address comparator circuit CMP, and a refresh address clock signal generator CKBRG.

The divider DIV divides a frequency of the clock signal CK to determine a frequency for the refresh operation. A period of time in which the voltage of a storage node of a cell decreases due to, for example, a leakage current is sufficiently longer than a cycle time for the read or write operation. Therefore, by setting the refresh cycle to be longer than the read cycle and the write cycle, power consumption can be considerably reduced.

The counter CNTR receives an output signal from the divider DIV to generate a refresh address to continuously and sequentially select the word lines. The refresh address clock signal generator CKBRG generates a refresh address clock signal having an appropriate delay and an appropriate pulse width with using an output signal from the divider DIV so that a selection pulse voltage is applied to a word line for the refresh operation during a bit line recovery operation conducted immediately after information is read from a memory cell or immediately after information is written in a memory cell. The address comparator CMP compares an information read or write address with the refresh address. If the addresses match each other, the refresh operation is not required, and hence the comparator CMP operates to inhibit the production of the refresh address clock signal CKBR.

Figure 12:
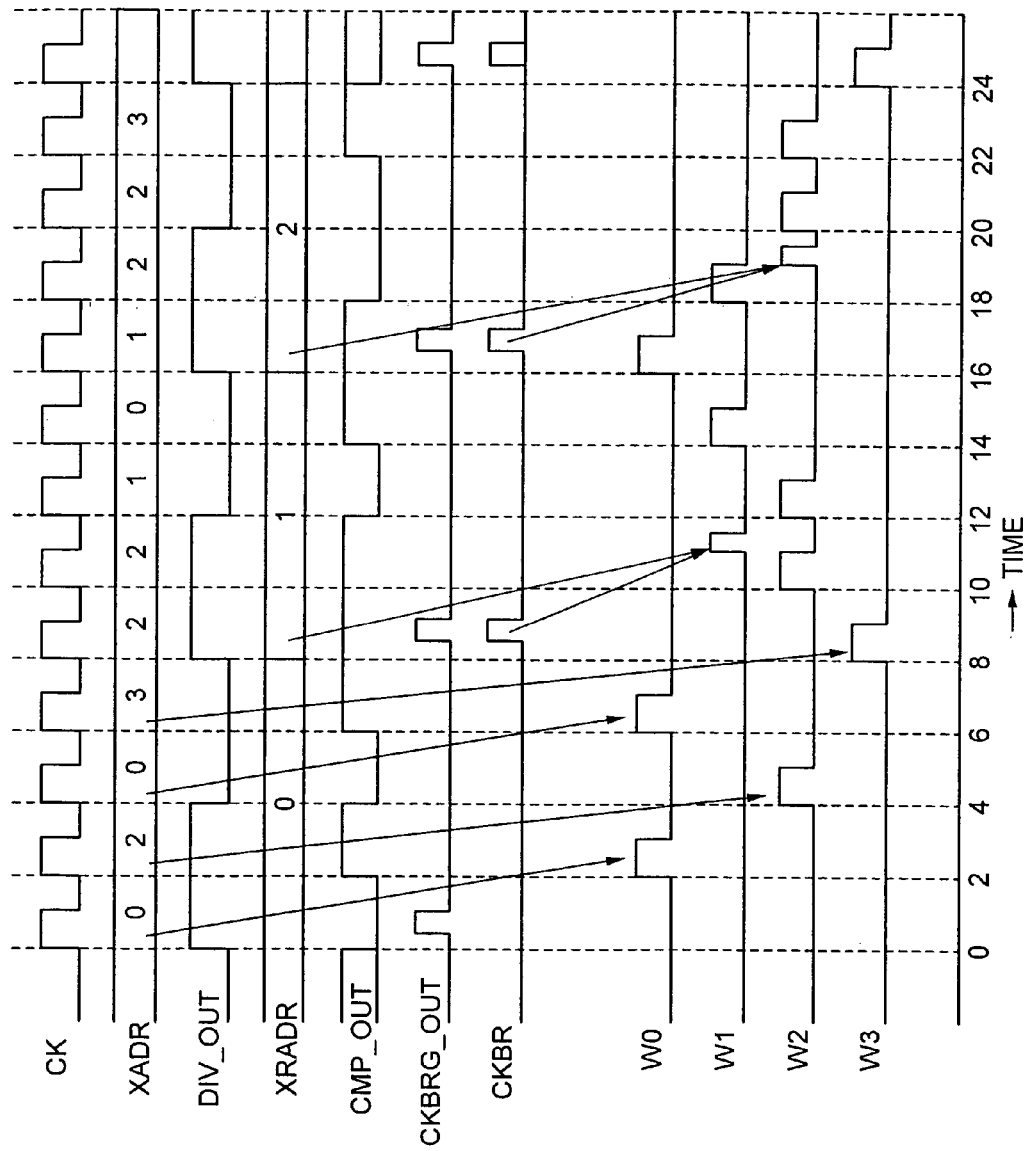
FIG. 12 is a signal timing chart showing operation of the refresh address generator circuit.

FIG. 12 shows waveforms of signals in main sections of the refresh address generator of FIG. 11. FIG. 12 includes a clock signal CK and a row address signal XADR. Numerals in waveforms indicate word line numbers assigned to respective word lines. Specifically, "0" indicates that the signal XADR selects word line 0. DIV_OUT is an output signal from the divider DIV and is used to divide the clock signal CK by four in this example. That is, the frequency for the refresh operation is set to one fourth of that of the clock CK (the refresh frequency is actually less than the frequency of the clock CK by several orders of magnitude in ordinary cases, however, the refresh frequency is set to one fourth of that of the clock CK in the example for convenience of description). XRADR is a refresh address signal generated by the counter CNTR according to the output signal DIV_OUT from the divider DIB. As in the case of the address XADR, numerals in waveforms indicate word line numbers assigned to associated word lines. CMO_OUT indicates an output waveform from the address comparator CMP. In the example, when the address XADR matches the fresh address XRADR, CMO_OUT goes down to an "L" level (indicating a low level). CKBRG_OUT is an output waveform from the generator CKBRG and has an appropriate delay and an appropriate pulse width with respect to DIV_OUT outputted from the divider DIV so that a selection pulse voltage is applied to a word line for the refresh operation during a bit line recovery operation conducted immediately after information is read from a memory cell or immediately after information is written in a memory cell. CKBR is an actual refresh address clock signal. When the address for the information read or write operation matches with the refresh address, the refresh operation is not required. Therefore, a logical operation is conducted using CKBRG_OUT and CMP_OUT to generate the clock signal only when CMP_OUT is at an "H" level (indicating a high level). W0 to W3 are selection signals for word lines W0 to W3, respectively. Corresponding to the address signal XADR, one of the word lines W0 to W3 is selected in a first half of each clock cycle. Concurrently, corresponding to the refresh address XRADR and the refresh address clock signal CKBR, one of the word lines W0 to W3 is selected in a last half of each clock cycle for every fourth clock cycle when the address XADR does not match the refresh address XRADR.

As above, the refresh operation is conducted during one cycle without using up the cycle and hence the read or write operation can be effectively conducted in any cycle. Therefore, it is possible to prevent reduction in performance of a system employing the memory.

Description will now be given in detail of the configuration of the respective modules.

Figure 13:
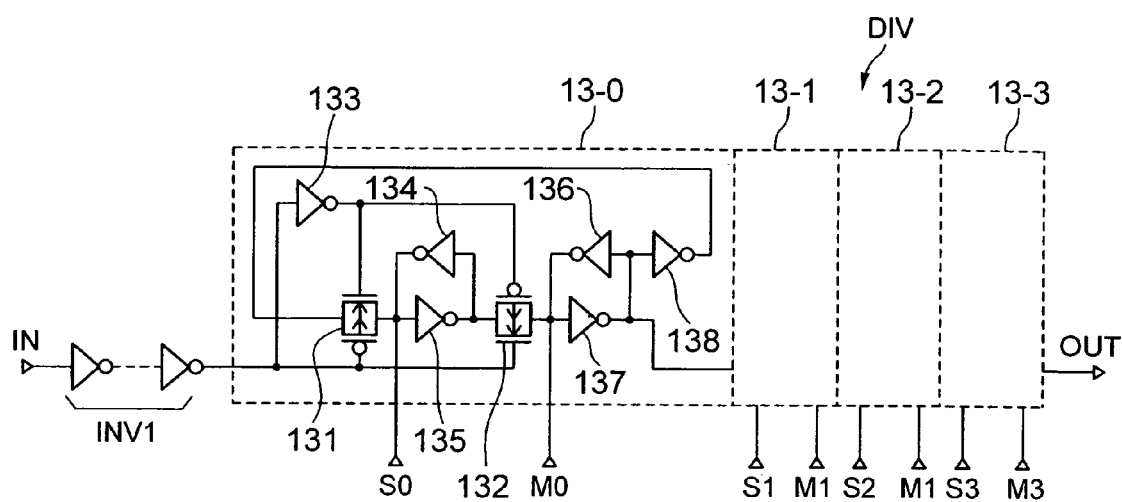
FIG. 13 is a block diagram showing a configuration of main sections of FIG. 11.

FIG. 13 shows an example of the configuration of the frequency divider DIV in FIG. 11.

The configuration includes a clock input signal IN and a divided signal output OUT. In the example, four slave-master latch circuit 13-0 to 13-3 are connected in series to each other to construct a frequency divider to divide a frequency by 16 (fourth power of two). The latch circuits 13-0 to 13-3 are the same to each other in constitution. As shown in the configuration example, the latch circuit includes six inverters 133 to 138 and two complementary MOS (CMOS) transfer gates 131 and 132. In the circuit, by appropriately setting the number of input inverters INV1 and initial setting signals S0 to S3 and levels of M0 to M3 of the respective latch circuits, it is possible to generate a divided signal synchronized with desired switching timing of the input signal.

Figure 14:
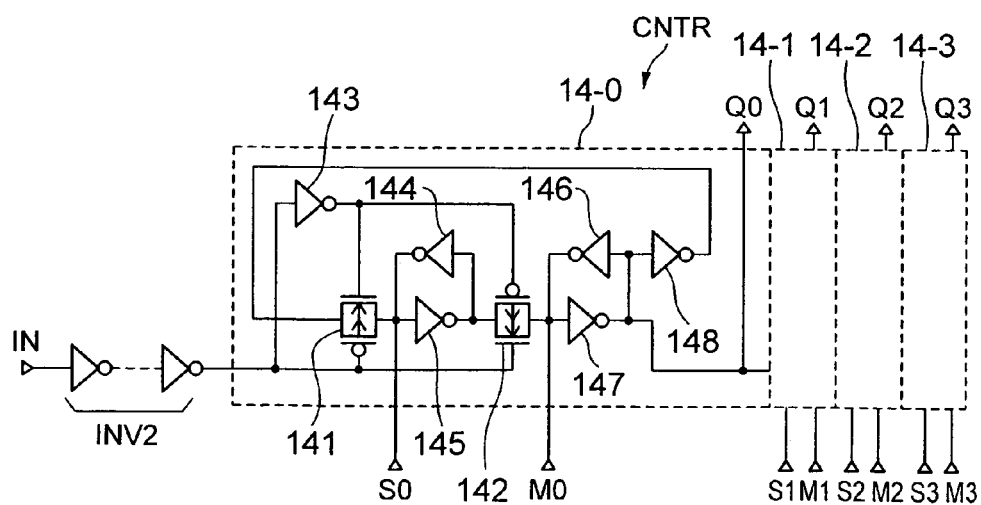
FIG. 14 is a block diagram showing a configuration of main sections of FIG. 11.

FIG. 14 shows an example of the configuration of the counter CNTR in FIG. 11.

The configuration "IN" indicates a divided signal from the divider DIV of FIG. 13 and count signal outputs Q0 to Q3. In the example, four slave-master latch circuits 14-0 to 14-3 are connected in series to each other to construct a binary counter including four bits, namely, modulo 16 (fourth power of two). The latch circuits 14-0 to 14-3 are the same in constitution to each other. As shown in a configuration example, the latch circuit includes six inverters 143 to 148 and two CMOS transfer gates 141 and 142. In the circuit, by appropriately setting the number of input inverters INV2 and initial setting signals S0 to S3 and levels of M0 to M3 of the respective latch circuits, it is possible to set an initial value to the counter CNTR.

Figure 15:
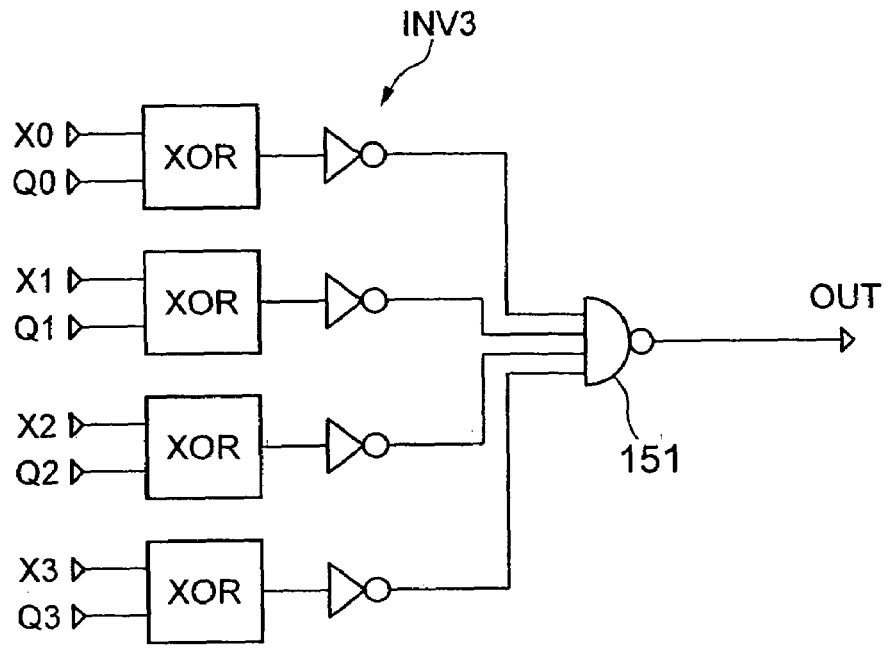
FIG. 15 is a block diagram showing a configuration of main sections of FIG. 11.

FIG. 15 shows an example of constitution of the address comparator circuit CMP in FIG. 11. Although not limitative, X0 to X3 are inputted from an external device to indicate an address for an information read or write operation and Q0 to Q3 are a count signal, i.e., a refresh address outputted from the counter CNTR. XOR is a gate to calculate an exclusive logical sum using the address signal and the count signal XR0 to XR8. Results of the operation are fed via inverters INV3 to a NAND gate 151. The gate 151 produces a comparison result. The result is outputted from an output terminal OUT.

Figure 16:
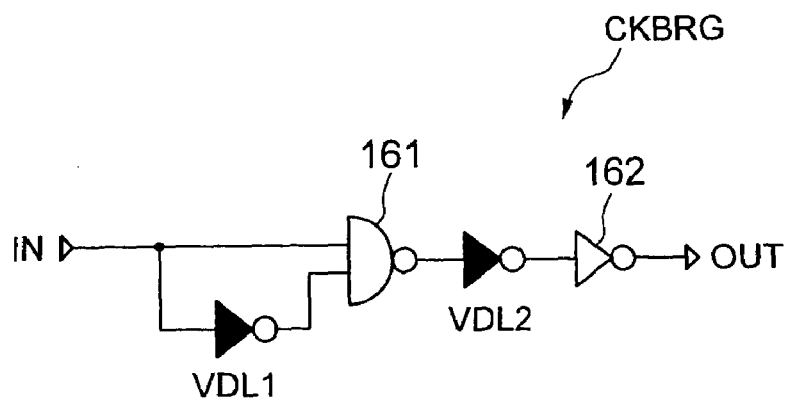
FIG. 16 is a block diagram showing a configuration of main sections of FIG. 11.

FIG. 16 shows an example of constitution of the refresh address clock signal generator CKBRG in FIG. 11.

In FIG. 16, IN indicates a divided signal from the divider DIV, and OUT is a refresh address clock signal. VDL1 is a variable delay circuit to adjust the pulse width of the clock signal and VDL2 is a variable delay circuit to adjust the delay time of the clock signal. A NAND gate 161 produces a signal having a pulse width determined by the delay time of the delay circuit VDL1 and delivers the signal to the delay circuit VDL2. The circuit VDL2 delays the signal and sends the signal via an inverter 162.

Figure 17:
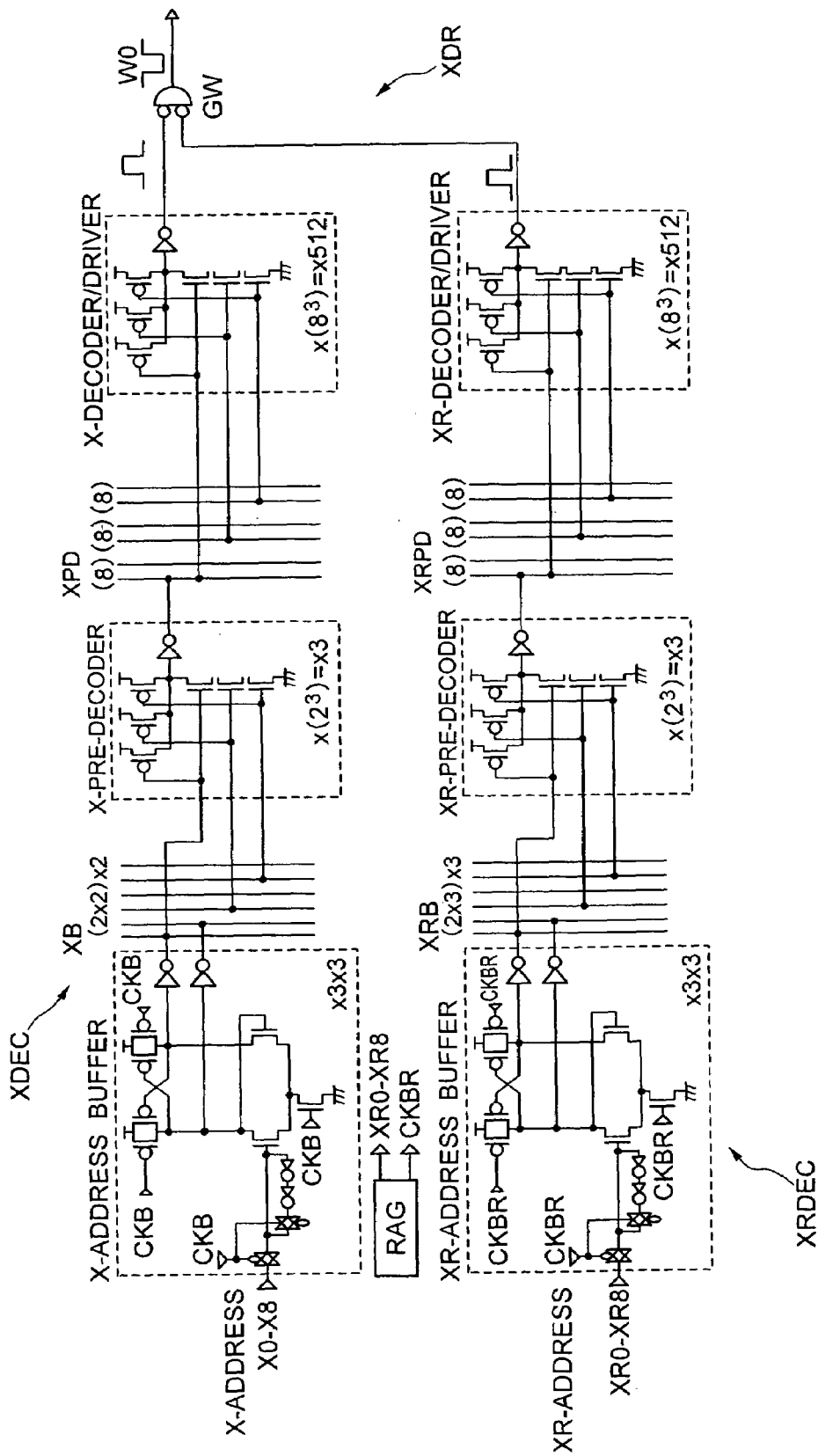
FIG. 17 is a circuit diagram showing a configuration example of a row address decoder, a refresh address decoder, and a word line driver of FIG. 10.

FIG. 17 shows a configuration example of the row address decoder XDEC, the refresh address decoder XREDEC, and the word line driver XDR. In FIG. 17, X-ADDRESS BUFFER is a row address input circuit, X0 to X8 are row address signals, and CKB is a clock signal to determine timing to obtain the address signals. In the configuration, X-PRE-DECODER is a row address predecoder and X-DECODER/DRIVER is a row address main decoder/word line driver. RAG is a refresh address generator circuit, and XR-ADDRESS buffer is a refresh address input circuit, XR0 to XR8 are refresh address signals, and CKBR is a refresh address clock signal. moreover, XR-PRE-DECODER is a refresh address predecoder, XR-DECODER/DRIVER is a refresh address main decoder/word line driver. GW is a NOR gate operating to apply a selection pulse voltage to a word line selected by either one of the row address signal and the refresh address signal.

Figure 18:
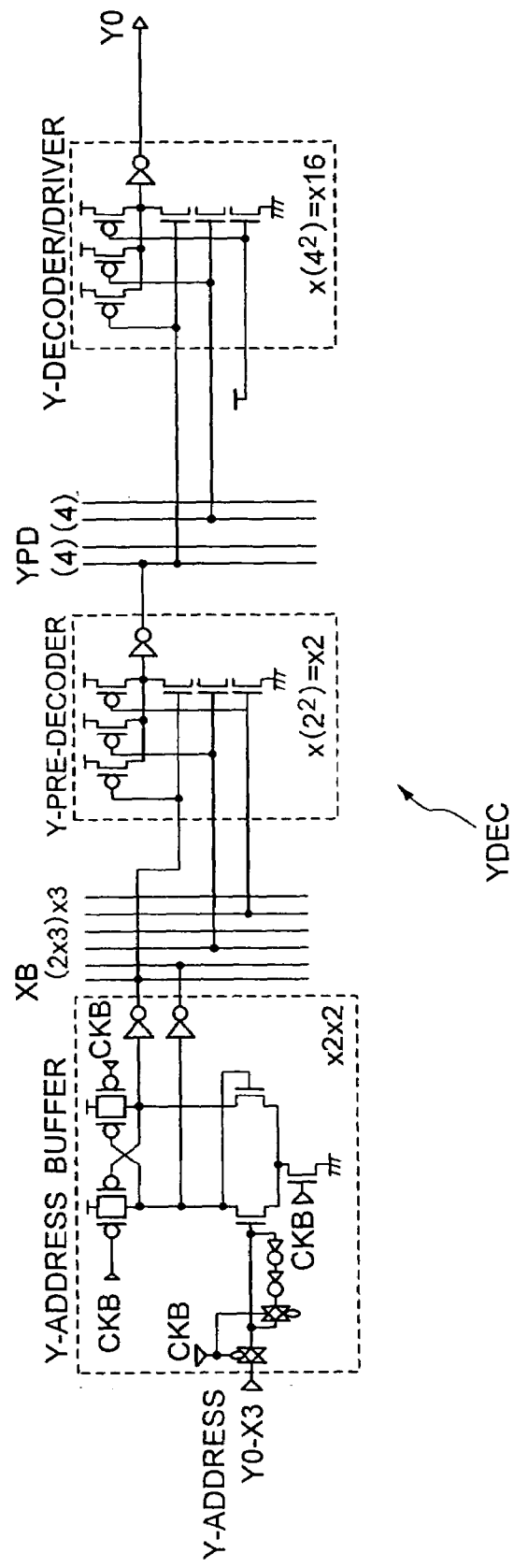
FIG. 18 is a block diagram showing a configuration of main sections of FIG. 10.

FIG. 18 shows a configuration example of the column address decoder YDEC in FIG. 10. As shown in FIG. 18, although not particularly limitative, the decoder YDEC includes a column address input circuit Y-ADDRESS BUFFER to receive column address signals Y0 to Y3, a column address decode line YB disposed in a stage after the input circuit Y-ADDRESS BUFFER, a column address predecoder Y-PRE-DECODER to predecode signals received via the decode line YB, a column address decode line YPD disposed in a stage after the decoder Y-PRE-DECODER, and a column address main decoder/column selector driver Y-DECODER/DRIVER which decodes signals received via the decode line YPD and which can drive a column selector circuit according to the decoded signals.

Figure 19:
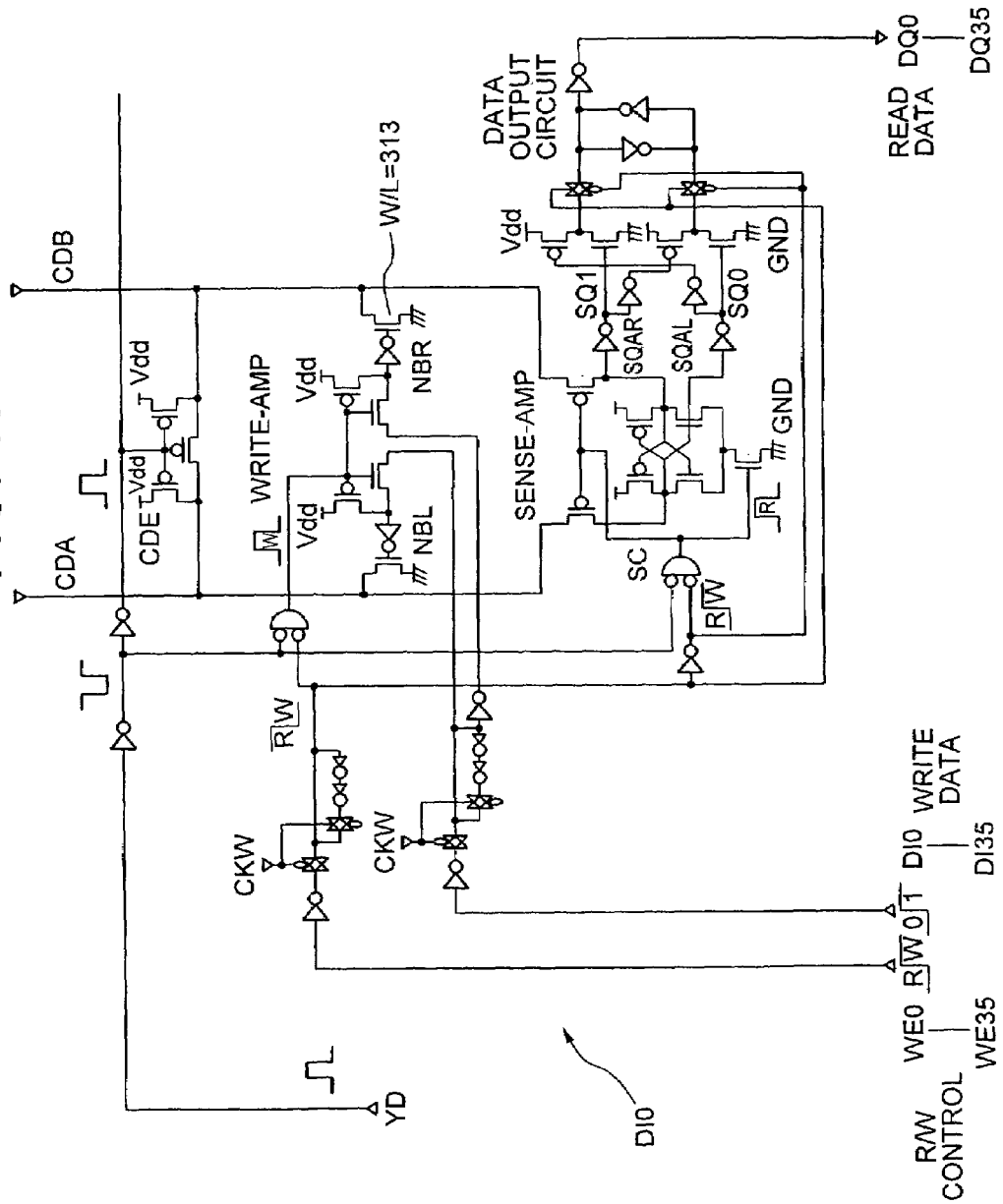
FIG. 19 is a block diagram showing a configuration of main sections of FIG. 10.

FIG. 19 shows an example of constitution of the data input/output circuit DI0 in FIG. 10.

Figure 20:
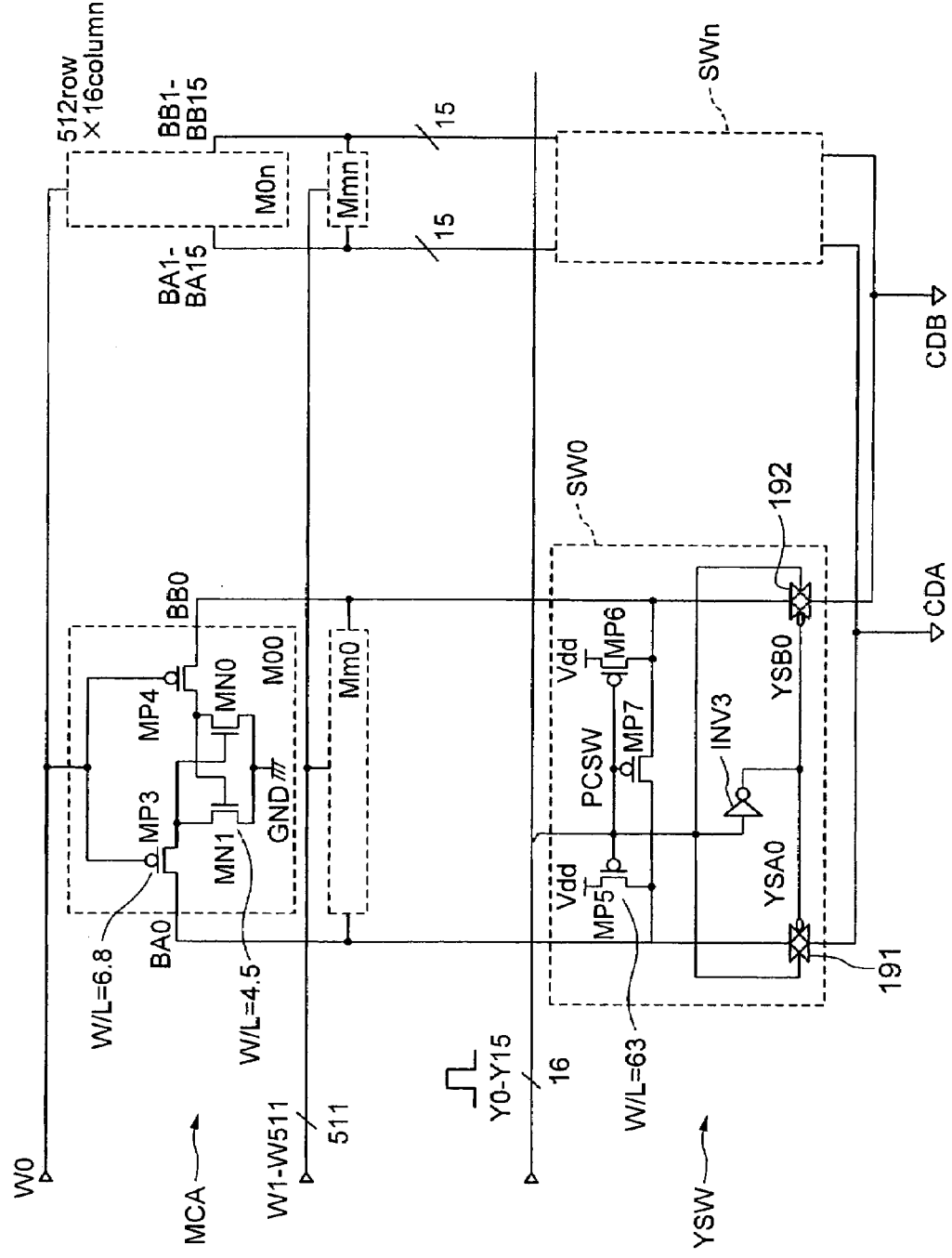
FIG. 20 is a circuit diagram showing a configuration example of a memory cell and a column selector circuit of FIG. 10.

As shown in FIG. 19, the circuit DI0 includes a common data line precharge circuit CDE which precharges and equalizes common data lines CDA and CDB, a write circuit WRITE-AMP to write input data DI0 to DI35 in memory cells according to read/write control signals WE0 to WE35, a sense amplifier SENSE-AMP to amplify signals on the common data lines CDA and CDB according to the read/write control signals WE0 to WE35, and a data output circuit DATA OUTPUT CIRCUIT which reads the signals amplified by the sense amplifier SENSE-AMP to output the amplified signal as readout data DQ0 to DQ35 to an external device. The write amplifier WRITE-AMP is activated when the associated read/write control signals WE0 to WE35 are set to an "H" level. The sense amplifier SENSE-AMP and the data output circuit DATA OUTPUT CIRCUIT are operated when the signals WE0 to WE35 are set to an "L" level and a read operation is indicated. The common data line precharger CDE, the write circuit WRITE-AMP, and the sense amplifier SENSE-AMP are operated at timing synchronized with a clock signal YD. The write circuit WRITE-AMP includes an n-channel MOS transistor NBL to drive the common data line CDA according to write data and an n-channel MOS transistor NBR to drive the common data line CDB according to write data. The transistors NBL and NBR are write transistors and are required to conduct a data write operation by supplying a sufficient write current. Therefore, its gate size W/L are set to 313 larger than a gate size (W/L=4.5) of the driving MOS transistors MN1 and MN2 and a gate size (W/L=6.8) of the selection MOS transistors MP3 and MP4), which will be described later (FIG. 20).

Figure 4:
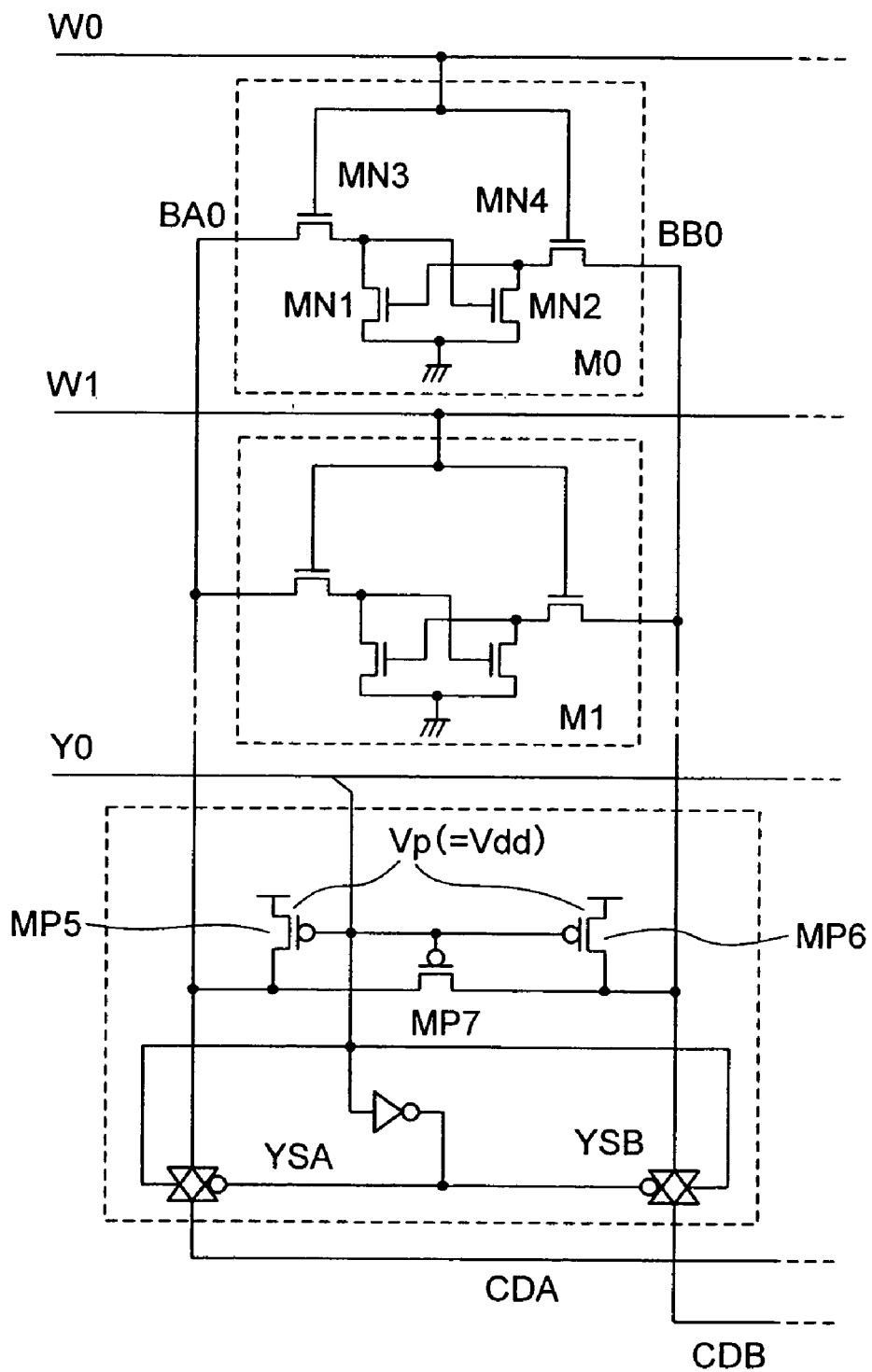
FIG. 4 a circuit diagram showing another example main sections of a circuit for comparison with the pseudo SRAM.
Figure 5:
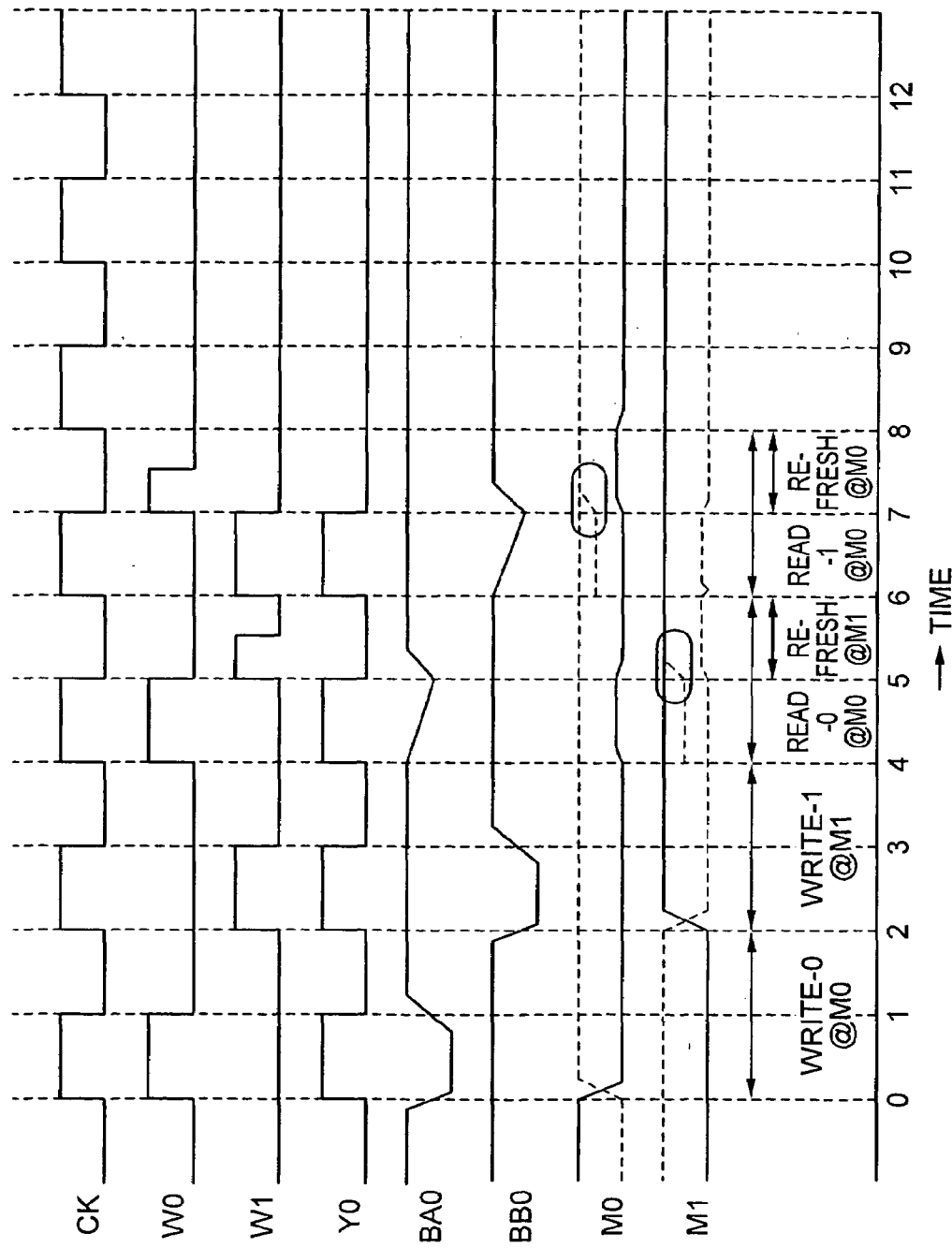
FIG. 5 is a signal timing chart showing an operation example of the circuit shown in FIG. 4.

FIG. 4 shows a configuration of main sections of the memory cell array MCA and the column selector circuit YSW of the pseudo SRAM in FIG. 10. FIG. 5 shows waveforms of signals for operation of the circuit shown in FIG. 4.

In FIG. 4, memory cells M0 and M1 keep information therein according to which one of the transistors MN1 and MN2 is on, that is, which of the drain nodes (storage nodes) has high potential. In the cell configuration, MN1 and MN2 form a flip-flop circuit to achieve an amplifying function. Basic operations of the memory such as a read operation, a write operation, and a refresh operation will be described by referring to FIGS. 4 and 5. Bit lines BA0 and BB0 have a maximum voltage which may be equal to an external power source voltage Vdd or which may be a voltage obtained by reducing Vdd. In this description, the maximum voltage is Vdd for simplicity of explanation.

First, a precharge operation is conducted before a memory cell operation to initialize the bit lines BA0 and BB0 to a fixed precharge voltage Vp. In this example, Vp is set to Vdd. In the precharge operation (e.g., during a period from point of time 3 to point of time 4 in FIG. 5), a Y selection signal Y0 is set to an "L" level to turn precharge p-channel MOS transistors MP5, MP6, and MP7 on. Thereafter, the signal Y0 is set to an "H" level. When the transistors are turned off, the precharge voltage is kept in a floating state in a parasitic capacitor of the bit lines.

Next, when it is desired to read information from, for example, the memory cell M0, a selection pulse voltage is first applied to the word line W0 (during a period from point of time 4 to point of time 5 in FIG. 5). Assume that MN1 is on in M0. The potential of the bit line BA0 decreases and that of the bit line BB0 is kept at Vdd. In this case, since the Y selection signal Y0 is at an "H" level and Y switches YSA and YSB are on, the information voltage is outputted via the Y switches to the common data lines CDA and CDB. Therefore, by sensing the potential of CDA and CDB by a sense amplifier, not shown, connected to the lines CDA and CDB to determine which one thereof has a higher value and by amplifying the higher potential thus determined, the read operation is completed. During a period from point of time 5 to point of time 6 in FIG. 5, a bit line recovery operation is conducted to restore the bit line potential lowered as above. This corresponds to the precharge operation for a subsequent operation. An operation to read information from the memory cell M1 can be conducted in almost the same way as for the memory cell M0 as indicated by waveforms during the period from time 6 to time 7 shown in FIG. 5.

Figure 6:
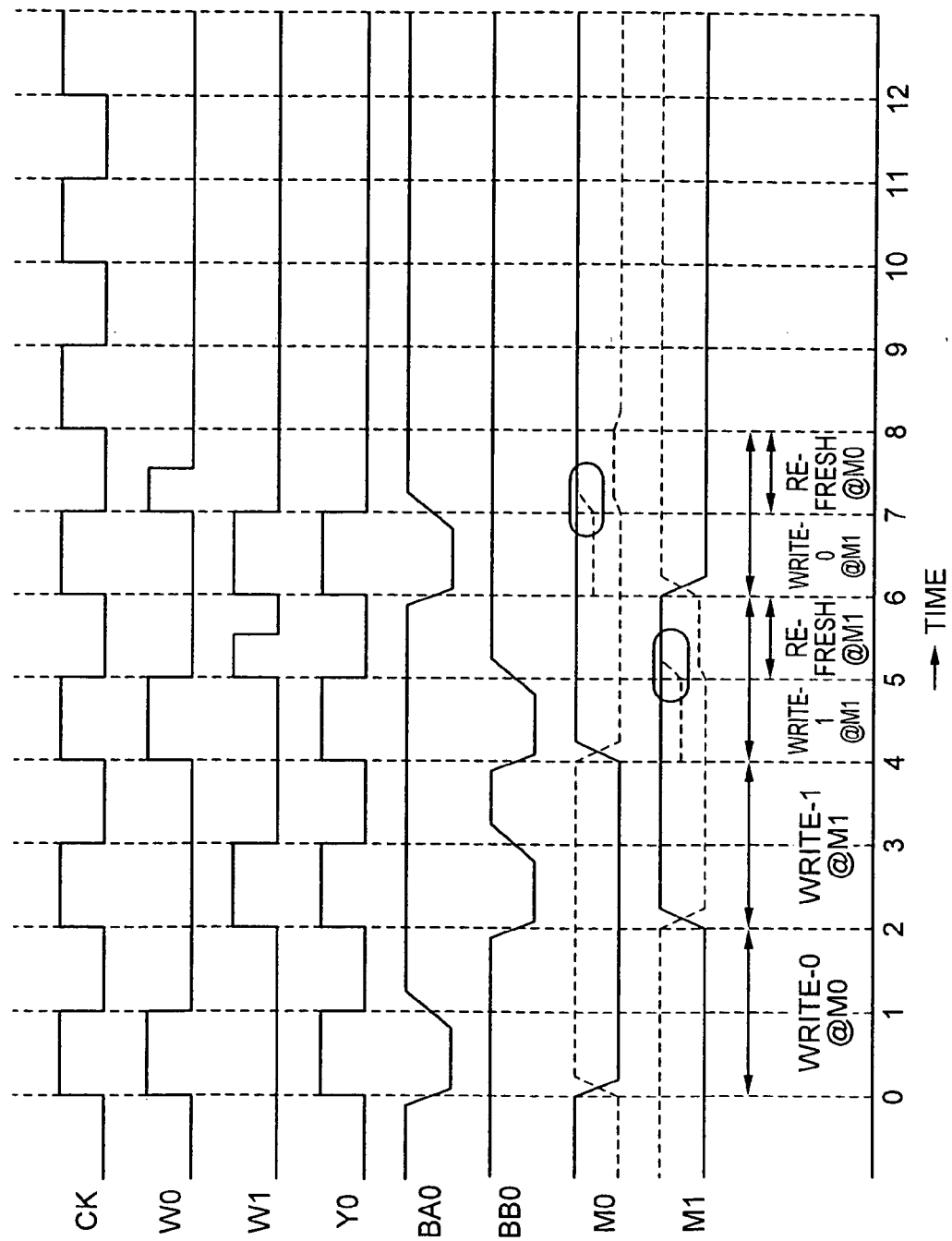
FIG. 6 is a signal timing chart showing another operation example of the circuit shown in FIG. 4.

Next, when it is desired to write information in, for example, the memory cell M0, a selection pulse voltage is applied to the word line W0 (during a period from time 0 to time 1 in FIG. 5). According to the write information from an external device, the potential of the bit line BA0 or BB0 is reduced from Vdd to 0 volt (V). Through the operation, the on or off state of each of the transistors MN1 and MN2 of the memory cell M0 is forcibly replaced by a voltage of the write information. A period from point of time 1 to point of time 2 in FIG. 6 is a bit line recovery period to restore the bit line potential lowered as above. This corresponds to the precharge operation for a subsequent operation. An operation to write information in the memory cell M1 can be conducted in almost the same way as for the memory cell M0 as indicated by waveforms during the period from time 2 to time 3 in FIG. 5.

Next, to refresh information in the memory cell M0, a selection pulse voltage is applied to the word line W0 during the bit recovery period (from time 7 to time 8 in FIG. 5) immediately after, for example, an information readout operation from M1 (during a period from time 6 to time 7 in FIG. 5). Since the Y selection signal Y0 is at an "L" level in this case, the p-channel MOS transistors MP5 to MP7 are on and the memory cell has an amplifying function, the storage node reduced in potential due to, for example, a leakage current is charged via MP5 to MP7 and via MN3 or MN4 depending on the storage information. The storage node is hence restored to the initial voltage (as enclosed by an ellipse in FIG. 5). In this situation, in all non-selection memory cells, not shown, on the selection word line W0, information thereof is refreshed. That is, when a selection pulse voltage is applied to W0, the precharge p-channel MOS transistors, not shown, corresponding to the nonselection memory cells are on. Moreover, each of these memory cells also has an amplifying function. Therefore, the storage nodes reduced in potential due to, for example, a leakage current are charged via the MOS transistors and are restored to the initial voltage. An operation to refresh information in M1 and all nonselection memory cells on the word line W1 can be conducted in the same way as for the nonselection memory cells on W0 as indicated in a period from time 5 to time 6 in FIG. 5. That is, the refresh operation is conducted for each word line. When a pulse is applied to the selected word line, the refresh operation is simultaneously carried out for all memory cells on the word line. Therefore, the storage node in the memory cell reduced in potential due to, for example, a leakage current can be restored to the initial voltage. By sequentially selecting all word lines in a continuous fashion, all memory cells are restored and hence the information stored in the entire chip can be retained.

By applying the word line selection pulse to a word line as described above, it does not occur that information of any memory cell on the word line is destroyed. Therefore, it is not required to dispose a sense amplifier on each bit line to amplify a signal voltage to conduct the rewrite operation in each memory cell. That is, in the readout operation, it is not required to concurrently conduct operations such as a readout of a slight or quite weak signal, amplification of the signal, and a rewrite operation thereof for each memory cell on the selected word line. In the write operation, it is not required that a readout operation of a signal and amplification thereof are conducted before a write operation and then a rewrite operation is conducted for all nonselection cells on the selected word line.

Since the refresh operation is achieved during the bit line recovery period after the information readout, the refresh operation can be conducted during one cycle without using up the cycle. This consequently results in that the read operation or the write operation can be effectively conducted in any cycle. It is therefore possible to prevent reduction in performance of a system including the memory.

FIG. 6 shows other waveforms of signals in the pseudo SRAM of FIG. 4. FIG. 5 includes a period from time 4 to time 6 allocated to an information readout operation from the cell M0, a bit line recovery, and a refresh operation for the cell M1 and a period from time 6 to time 8 allocated to an information readout operation from the cell M1, a bit line recovery, and a refresh operation of the cell M0. FIG. 6 includes a period from time 4 to time 6 allocated to an information (1) write operation in the cell M0, a bit line recovery, and a refresh operation of the cell M1 and a period from time 6 to time 8 allocated to an information (0) write operation in the cell M1, a bit line recovery, and a refresh operation of the cell M0. That is, the different point therebetween resides in that while the refresh operation is conducted during a bit recovery period after the information readout operation in FIG. 5, the refresh operation is conducted during a bit recovery period after the information write operation in FIG. 6. The other operations of FIG. 6 are the same as those of FIG. 5.

In FIG. 6, to refresh information in M0, a selection pulse voltage is applied to the word line W0 during the bit recovery period (from time 7 to time 8 in FIG. 6) immediately after, for example, an information write operation in M1 (during a period from time 6 to time 7 in FIG. 5). Since the Y selection signal Y0 is at an "L" level in this case, the p-channel MOS transistors MP5 to MP7 are on. Moreover, since the memory cell has an amplifying function, the storage node reduced in potential due to, for example, a leakage current is charged via the MP5 to MP7 and via MN3 or MN4 depending on the storage information. The storage node is hence restored to the initial voltage (as enclosed by an ellipse in FIG. 6). In this case, in all nonselection memory cells, not shown, on the selection word line W0, information thereof is refreshed. That is, when a selection pulse voltage is applied to W0, the precharge p-channel MOS transistors, not shown, corresponding to the nonselection memory cells are on. Each of these memory cells also has an amplifying function, and hence the storage nodes reduced in potential due to, for example, a leakage current are charged via the MOS transistors to be restored to the initial voltage. An operation to refresh information in M1 and all nonselection memory cells on the word line W1 can be conducted in a bit recovery period immediately after the information write operation in M0 as indicated in a period from time 5 to time 6 in FIG. 6. That is, the refresh operation is conducted for each word line. When a pulse is applied to the selected word line, the refresh operation is simultaneously carried out for all memory cells on the word line. Therefore, the storage node in the memory cell reduced in potential due to, for example, a leakage current can be restored to the initial voltage. By continuously and sequentially selecting all word lines, all memory cells are restored and hence the information stored in the entire chip can be kept retained.

Also in the configuration shown in FIG. 6, by applying the word line selection pulse to a word line as described above, it does not occur that information of any memory cell on the word line is destroyed. Therefore, it is not required to dispose a sense amplifier on each bit line to amplify a signal voltage to conduct the rewrite operation in each memory cell. That is, in the readout operation, it is not required to concurrently conduct operations including a readout of a quite weak or slight signal, amplification of the signal, and a rewrite operation thereof for each memory cell on the selected word line. In the write operation, it is not required that a readout operation of a signal and amplification thereof are conducted before a write operation and a rewrite operation is conducted for all nonselection cells on the selected word line.

Since the refresh operation is carried out during the bit line recovery period after the information readout, the refresh operation can be conducted during one cycle without completely using up the cycle. This consequently results in that there exists no cycle in which the read operation or the write operation cannot be effectively conducted. It is therefore possible to prevent reduction in performance of a system using the memory.

Figure 1:
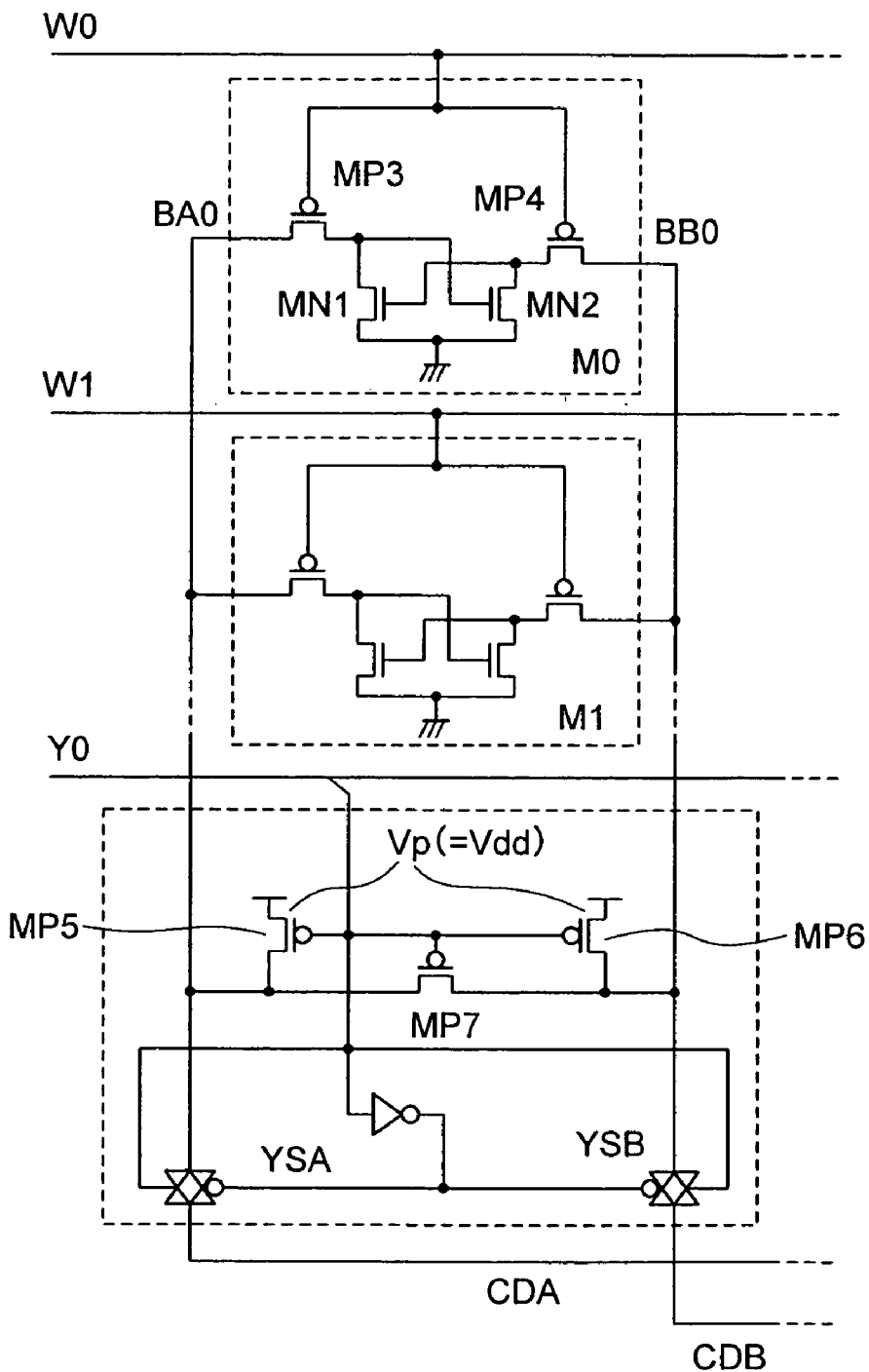
FIG. 1 is a circuit diagram schematically showing main sections of a memory cell array and a column selector circuit of a pseudo SRAM in an example of a semiconductor memory device according to the present invention.
Figure 7:
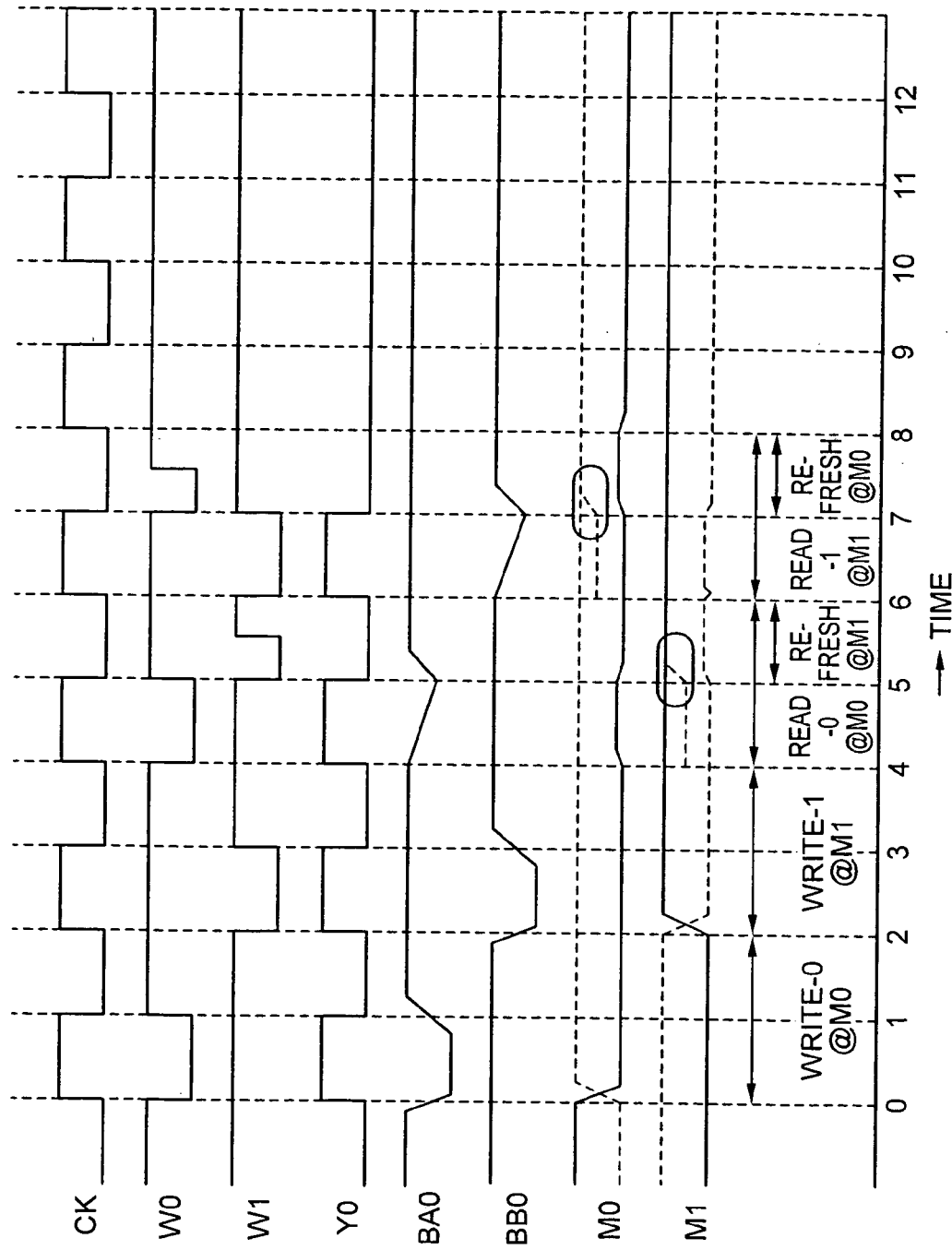
FIG. 7 is a signal timing chart showing an operation example of the circuit shown in FIG. 1.

FIG. 1 shows a configuration of main sections of the memory cell array MCA and the column selector circuit YSW in the pseudo SRAM shown in FIG. 10. FIG. 7 shows waveforms of signals in the memory cell array.

FIG. 1 differs from FIG. 4 in that while an n-channel MOS transistor is used to connect a storage node of a memory cell to a bit line in FIG. 4, a p-channel MOS transistor is used in FIG. 1 for the same purpose. In association therewith, the selection pulse of each of the word lines W0 and W1 is reverse in polarity to that of FIG. 5. For the other operations, FIGS. 4 and 1 are the same to each other and FIGS. 5 and 7 are the same to each other. Therefore, description will now be given of the transistor to connect a storage node of a memory cell to a bit line.

In FIG. 4, to refresh information in the memory cell M0, a selection pulse voltage is applied to the word line W0. In this operation, The storage node reduced in potential due to, for example, a leakage current is charged via the p-channel MOS transistors MP5 to MP7 and via the n-channel MOS transistor MN3 or MN4 depending on the storage information. The storage node is hence restored to the initial voltage. When MN3 or MN4 is an n-channel MOS transistor, the storage node is charged, strictly speaking, only up to Vdd-Vt (Vt is a threshold voltage of the n-channel MOS transistor). For Vt<<Vdd, there does not occur any trouble. However, if Vt is more than about Vd/2, a trouble occurs. For example, when Vt is more than Vdd/2, a voltage Vm of the storage node after the restoration thereof is represented as below.

$$Vm = Vdd - Vt < Vdd/2 < Vt$$

This means that the gate voltage of MN1 or MN2 is less than Vt. Therefore, the memory cell cannot serve the amplifying function and hence the storage node cannot be restored to the initial voltage.

On the other hand, the leakage current of each of the n-channel MOS transistors MN1 and MN2 of the memory cell reduces the voltage of the storage node of the memory cell. It is hence required to possibly reduce the leakage current. If the leakage current is large, it is required to frequently conduct the refresh operation and the power consumption of the memory increases as a result. If the leakage current of each of the n-channel MOS transistors MN3 and MN4 of the memory cell is large, a leakage current passing through a path Vdd-MP5-BA0-MN3-MN1 to ground or a path Vdd-MP6-BB0-MN4-MN2 to ground increases. This also results in increase in the power consumption of the memory. It is therefore required to appropriately set the threshold voltage Vt of these n-channel MOS transistors to a predetermined slightly large value. The power source voltage Vdd is decreasing year after year with development of the fine-processing technique of MOS transistors. Consequently, it is quite probable that Vt becomes more than Vdd/2 in future. For example, when Vt is 0.75 volt (V), the troublesome situation takes place if Vdd is less than 1.5 volt. Therefore, it is desirable that the power source voltage Vdd supplied to memory cells is equal to or more than twice the threshold voltage of transistors constituting the memory cells.

Since a p-channel MOS transistor are used to connect a storage node to a bit line FIG. 1, the voltage Vm of the storage node after the restoration is equal to Vdd. If Vt is not more than about Vdd, the troublesome situation does not occur. Therefore, it is possible to set Vdd to a value, for example, less than 1.5 volt.

Figure 8:
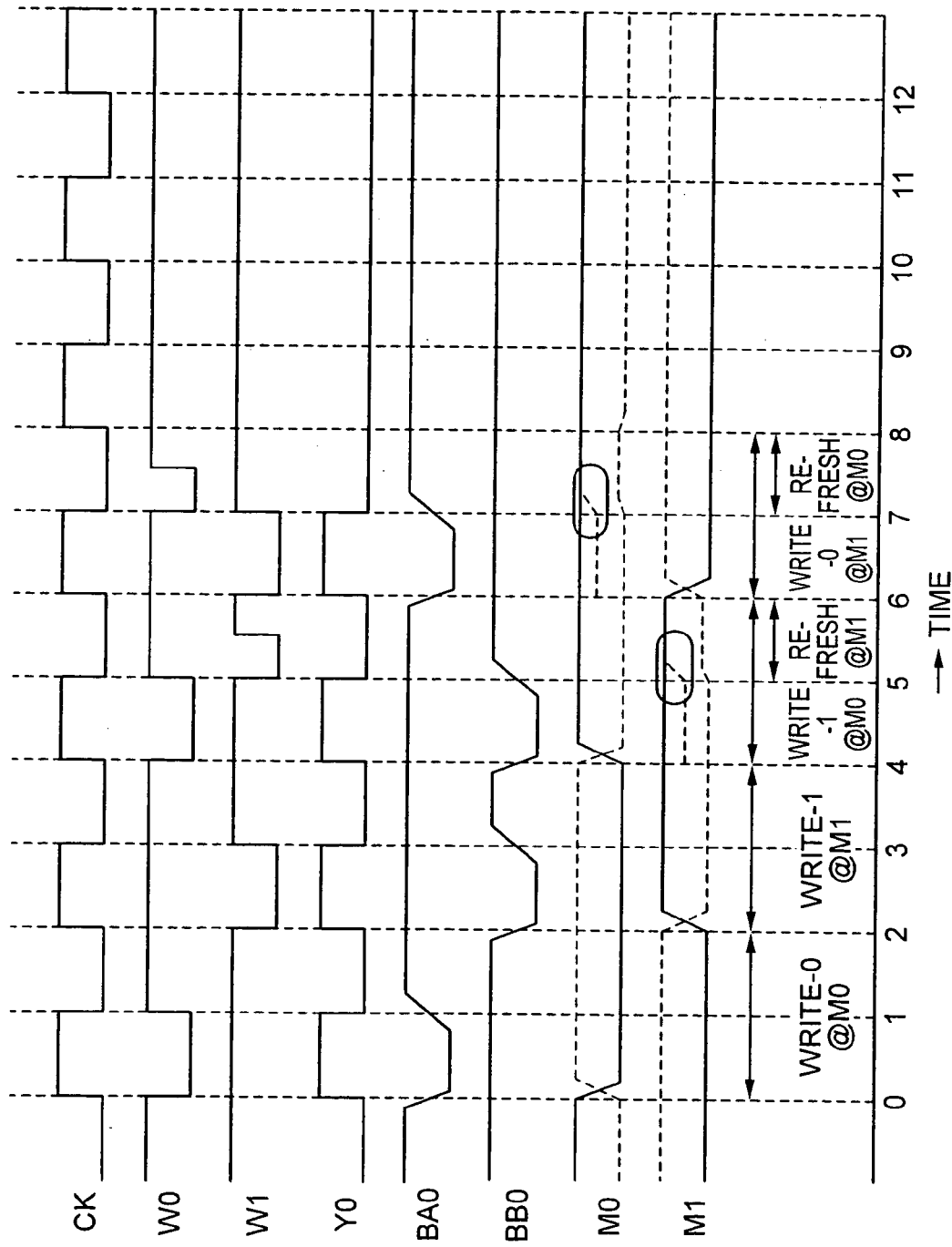
FIG. 8 is a signal timing chart showing another operation example of the circuit shown in FIG. 1.

FIG. 8 shows other waveforms of signals in the memory circuit shown in FIG. 1.

Since p-channel MOS transistors MP3 and MP4 are used to connect a storage node to a bit line, the selection pulse of each of the word lines W0 and W1 in FIG. 8 is reverse to that shown in FIG. 6.

Description will now be given of a basic operation of a DRAM including one-transistor cells as a memory circuit to be compared with the pseudo SRAM. The DRAM is quite general at present and includes one-transistor cells each of which including one n-channel MOS transistor. In this regard, the maximum voltage of the data line B0 is equal to the external power source voltage Vdd or a voltage obtained by lowering Vdd. In the description below, the voltage is set to Vdd for convenience of explanation.

Figure 3:
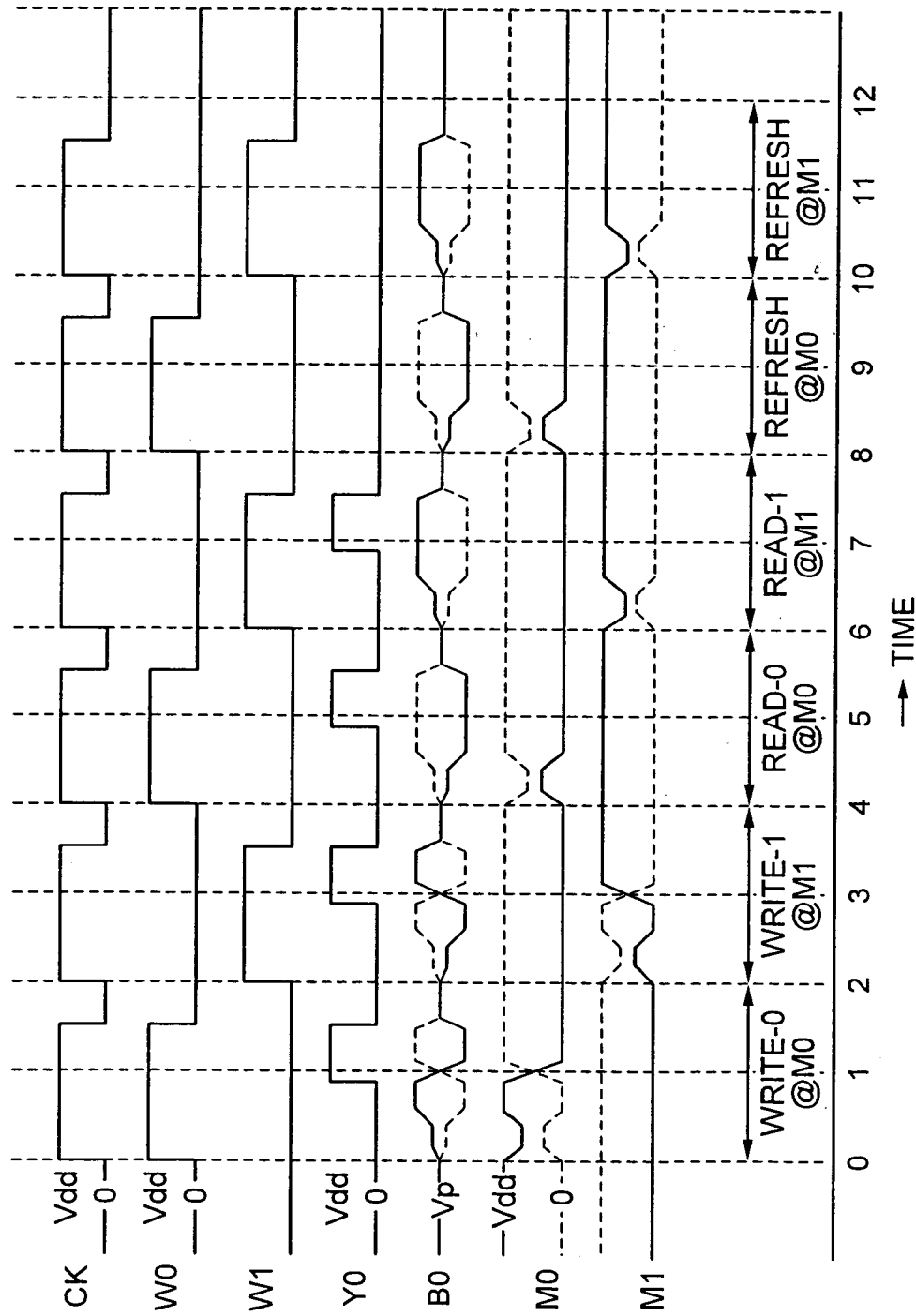
FIG. 3 is a signal timing chart showing an operation example of the circuit shown in FIG. 2.

A precharge operation is conducted before a memory cell operation to initially set the data line B0 to a fixed precharge voltage Vp (for example, during a period from time 3.5 to time 4 of FIG. 3). In general circuit design, Vp is set to Vdd/2. The precharge operation is carried out by turning a precharge switch PCSW on. When the switch turns off, the precharge voltage Vp is kept in a data line capacitor CB in a floating state.

Next, information is read from, for example, the memory cell M0. A selection pulse voltage is first applied to the word line W0 (during a period from time 4 to time 5.5 of FIG. 3). In the operation, a signal voltage Vs associated with an information voltage (Vdd or 0) of the capacitor CS of M0 appears on the data line B0 in the form of a positive or negative signal relative to the precharge voltage Vp. The signal voltage Vs is represented as below.

$$Vs=CS/(CS+CD)\times Vdd/2$$

Since CS<<CD in general, Vs is quite a low voltage and is amplified by the sense amplifier SA. The amplifier SA operates according to the precharge voltage Vp as a reference voltage. For Vs>Vp, the amplifier SA produces an output voltage of Vdd. For Vs<Vp, the amplifier SA produces an output voltage of 0 volt. By turning the Y switch (YS) on, the amplified information voltage is outputted to the common data line CDA to thereby complete the readout operation. In this operation, information of each nonselection memory cell, not shown, on the selected word line is read to its associated data line to be amplified by an amplifier corresponding thereto. Attention is to be paid to a point that when a word line selection pulse is applied to a word line, information is destroyed in all memory cells on the word line. That is, when a selection pulse is applied to the word line, the information voltage is considerably lowered from Vdd to 2×Vs, which is equivalent to an event that the information is destroyed. To overcome this difficulty, it is required to arrange a sense amplifier on each data line to amplify the signal voltage Vs to rewrite the amplified voltage again in each memory cell. Therefore, in the read operation, the operations such as a readout of a quite weak signal, amplification thereof, and a rewrite operation thereof are concurrently conducted for all memory cells on the selected word line. Only information on the data line corresponding to the selected memory cell is obtained as readout information to an external device.

Next, to write information in, for example, the memory cell M0, a selection pulse voltage is applied to the word line W0 (during a period from time 0 to time 1.5 of FIG. 3) and information voltage of Vdd or 0 volt is applied to the data line B0. However, as described above, it is required to prevent the information destruction in the nonselection cells in association with the application of the word line selection pulse. Therefore, a read operation is conducted before the write operation. That is, the read operation described above is first conducted for all memory cells on W0 to once keep a cell amplification voltage in the respective data lines. Thereafter, the selected data line B0 is linked with the common data line DCA by turning the Y switch (YS) on to forcibly replace the amplification voltage on the data line B0 by a write information voltage from an external device to charge the capacitor of the selected cell. In this operation, the amplification voltage on other nonselection data lines is simultaneously rewritten in the respective nonselection cells. As a result, regardless of the read or write operation for the selected cell, a readout of a quite weak signal, amplification thereof, and a rewrite operation thereof are conducted for the nonselection memory cells on the word line associated with the selected cell.

Next, the refresh operation of the DRAM can be achieved by sequentially conducting the cell readout operation for all word lines (for example, a refresh operation of M0 is conducted during a period of time 8 to time 9.5 of FIG. 3 and a refresh operation of M1 is conducted during a period of time 10 to time 11.5 of FIG. 3). That is, the refresh operation is conducted for each word line. When a pulse is applied to a selected word line, a readout operation of a quite weak signal, amplification thereof, and a rewrite operation thereof are conducted for all memory cells on the word line. This resultantly refreshes all memory cells on the word line at the same time. Even when the voltage of a storage node of a memory cell is reduced due to, for example, a leakage current, the storage node is restored to the initial voltage through the operation described above. By continuously and sequentially selecting the word lines, all memory cells are restored, and hence the storage information of the overall chip is kept retained.

However, to prevent an event in the DRAM in which the voltage of a storage node of a memory cell is lowered due to, for example, a leakage current to result in the information destruction thereof, it is required to continuously and sequentially select the word lines to refresh all memory cells. As a result, in a cycle in which the refresh operation is conducted, the read or write operation cannot be carried out. This reduces performance of a system employing the DRAM.

In contrast thereto, in the read operation of the pseudo SRAM 100, it is not required to concurrently conduct the operations such as a readout of a quite weak signal, amplification thereof, and a rewrite operation thereof for all memory cells on the selected word line. In the write operation of the SRAM 100, it is not required to conduct the operations such as the readout operation before the write operation, the amplify of the readout voltage, and the rewrite operation of the voltage in all nonselection cells on the selected word line. Since the refresh operation is carried out during a bit recovery period after an information write operation, the refresh operation can be conducted during one cycle without using up the cycle. Therefore, there exists no cycle in which the read operation or the write operation cannot be effectively conducted. It is consequently possible to prevent reduction in performance of a system using the memory.

FIG. 20 shows another configuration example of the memory cell array MCA and the column selector circuit YSW of FIG. 10.

The memory cell array MCA of FIG. 20 includes a plurality of word lines W0 to W511, complementary bit lines (BA0, BB0) to (BA15, BB15) arranged to intersect the word lines W0 to W511, and a plurality of memory cells M00 to Mmn disposed at intersections between the word lines W0 to W511 and the complementary bit lines (BA0, BB0) to (BA15, BB15). Although not particularly limitative, the memory cells are formed in 512 rows corresponding to the word lines and in 16 columns corresponding to the complementary bit lines. The memory cells M00 to Mmn are mutually equal in constitution to each other. As shown in a representative configuration example of M00, the cell includes driver MOS transistors MN1 and MN2 and selector MOS transistors MP3 and MP4 coupled with the transistors MN1 and MN2. The transistors MN1 and MN2 are n-channel MOS transistors and the transistors MP3 and MP4 are p-channel MOS transistors. Source electrodes of MN1 and MN2 are commonly connected to a ground line GND (Vss). A drain electrode of MN1 is coupled with a gate electrode of MN2 and is linked via a selector MOS transistor MP3 with the bit line BA0. Similarly, a drain electrode of MN2 is coupled with a gate electrode of MN1 and is linked via a selector MOS transistor MP4 with the bit line BB0. Gate electrodes of MP3 and MP4 are coupled with the word line W0. When the word line W0 is driven to a selection level ("L" level) in a conductive state, the write and read operations are possible in a predetermined memory cell. The gate size W/L of MN1 and MN2 is 4.5 and that of M03 and MP4 is 6.8.

The column selector circuit YSW includes a plurality of switch circuits SWO to SWn arranged in association with the complementary bit lines (BA0, BB0) to (BA15, BB15). The switch circuits SWO to SWn are equal in the configuration to each other. As shown in a representative configuration example of SWO, the switch includes p-channel transistors MP5 and MP6 to precharge the complementary bit lines (BA0, BB0), a p-channel MOS transistor MP7 to equalize the complementary bit lines (BA0, BB0), Y switches 191 and 192 to selectively couple the complementary bit lines (BA0, BB0) to the common data lines CDA and CDB according to the Y selection signal Y0 outputted from the column address decoder YDEC, and an inverter INV3 to drive the Y switches 191 and 192. A sufficient precharge current is required to achieve a high-speed precharge operation of a bit line. Therefore, the gate size W/L of the transistors MP5 and MP6 is 63 larger than that of the transistors MN1, MN2, MP3, and MP4.

Figure 9:
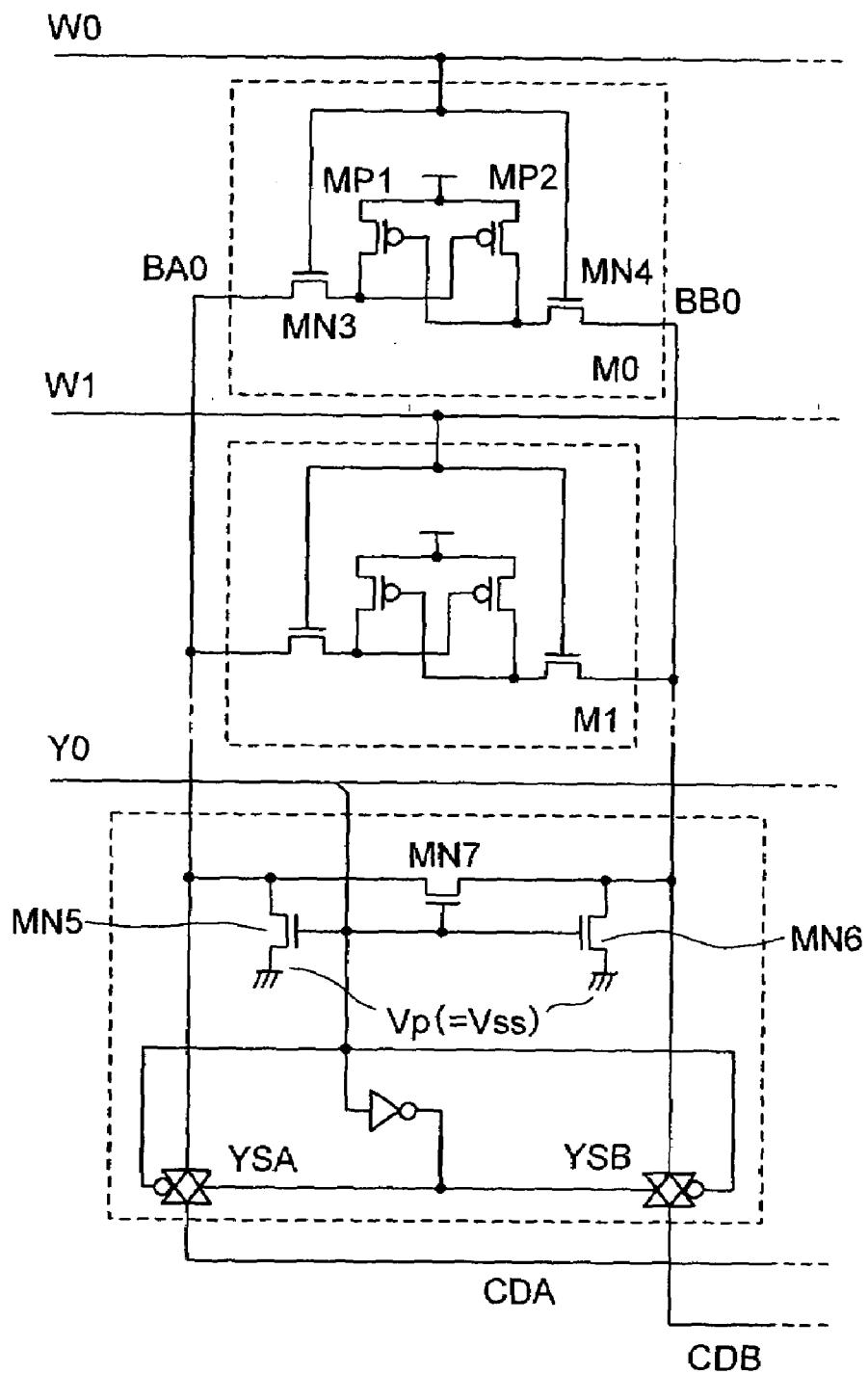
FIG. 9 is a circuit diagram showing main sections of a memory cell array and a column selector circuit of the pseudo SRAM.

FIG. 9 shows another configuration example of memory cells.

When the two cross-coupled MOS transistors are p-channel MOS transistors, an n-channel MOS transistor is used to connect a storage node to a bit line to reverse the relationship of potential in the periphery of the memory cell.

Figure 21:
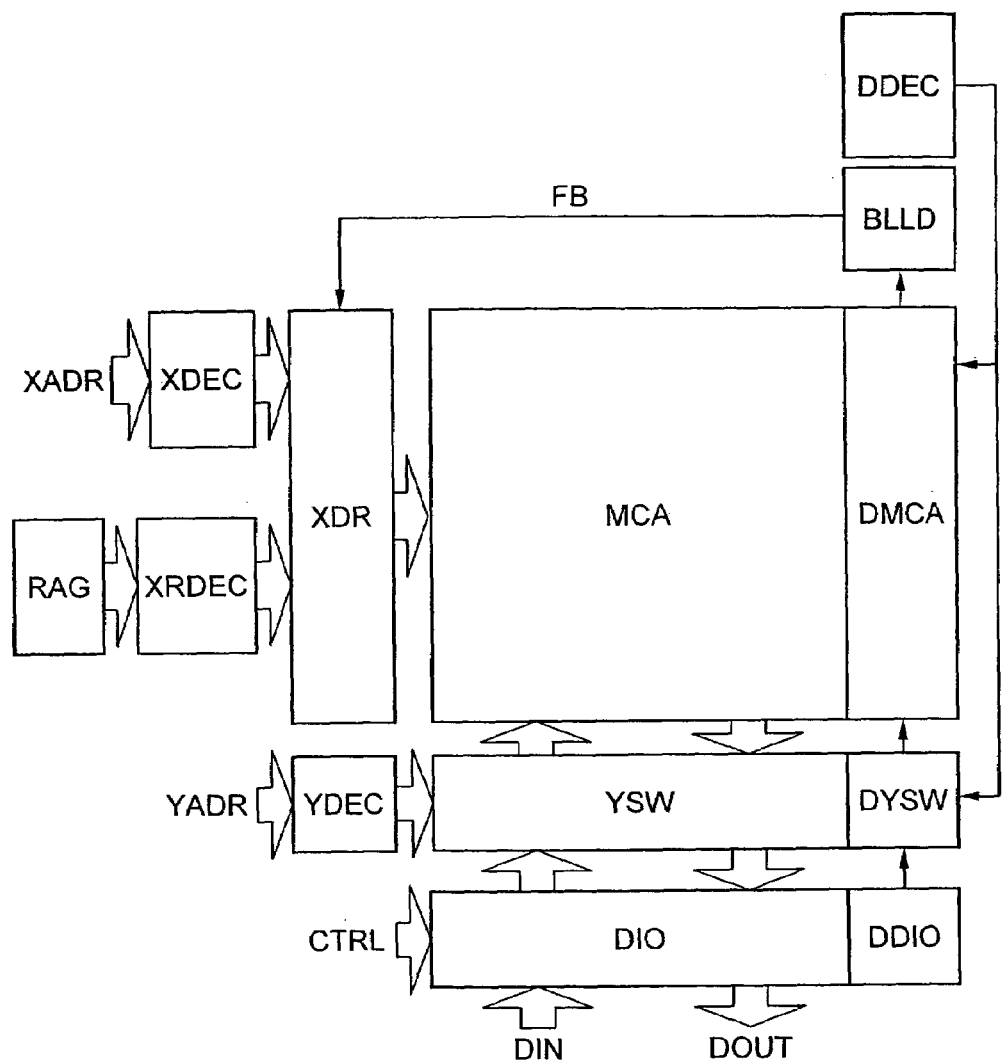
FIG. 21 is a block diagram showing a configuration example of the pseudo SRAM.

FIG. 21 shows another configuration example of the pseudo SRAM.

The configuration shown in FIG. 21 differs from that of FIG. 10 in that FIG. 21 includes a dummy memory cell array DMCA including dummy memory cells at intersections between dummy word lines and dummy bit lines, a dummy address decoder DDEC to generate a signal to drive the dummy word lines to a selection level, a dummy column selector circuit DYSW to select the dummy data lines, a dummy input/output circuit DDIO to conduct input/output operations of dummy data, and a dummy bit line level detector circuit BLLD capable of detecting a level of the dummy bit lines. Thanks to the configuration, timing of a word line selection pulse applied in the refresh operation can be set with higher precision.

In an operation to conduct the refresh operation during the bit line recovery after an information write operation, if the refresh operation is started too early, there may occur a case in which a wrong write operation is conducted for a memory cell to be refreshed. To prevent this event, it is required to start the refresh operation when the bit line level is set to a predetermined slightly high level after the bit line recovery is started. Therefore, during the refresh cycle, a write operation is conducted using the dummy address decoder DDEC, the dummy column selector circuit DYSW, and the dummy data input/output circuit DDIO in the dummy cells, not shown, in the dummy memory cell array DMCA at the same timing as for the memory cell of the SRAM. Next, during the bit line recovery after the write operation, the dummy bit line level detector BLLD detects a level of the dummy bit line, not shown, in the dummy memory cell array DMCA. When the bit line is at a predetermined slightly high level, a control signal FB is supplied to the word line driver XDR to allow the driver XDR to generate a refresh word line selection pulse for a refresh operation.

Thanks to the operation, it is possible to start the refresh operation after the bit line level is set to a predetermined high level, and the wrong write operation due to the refresh operation can be prevented.

Figure 22:
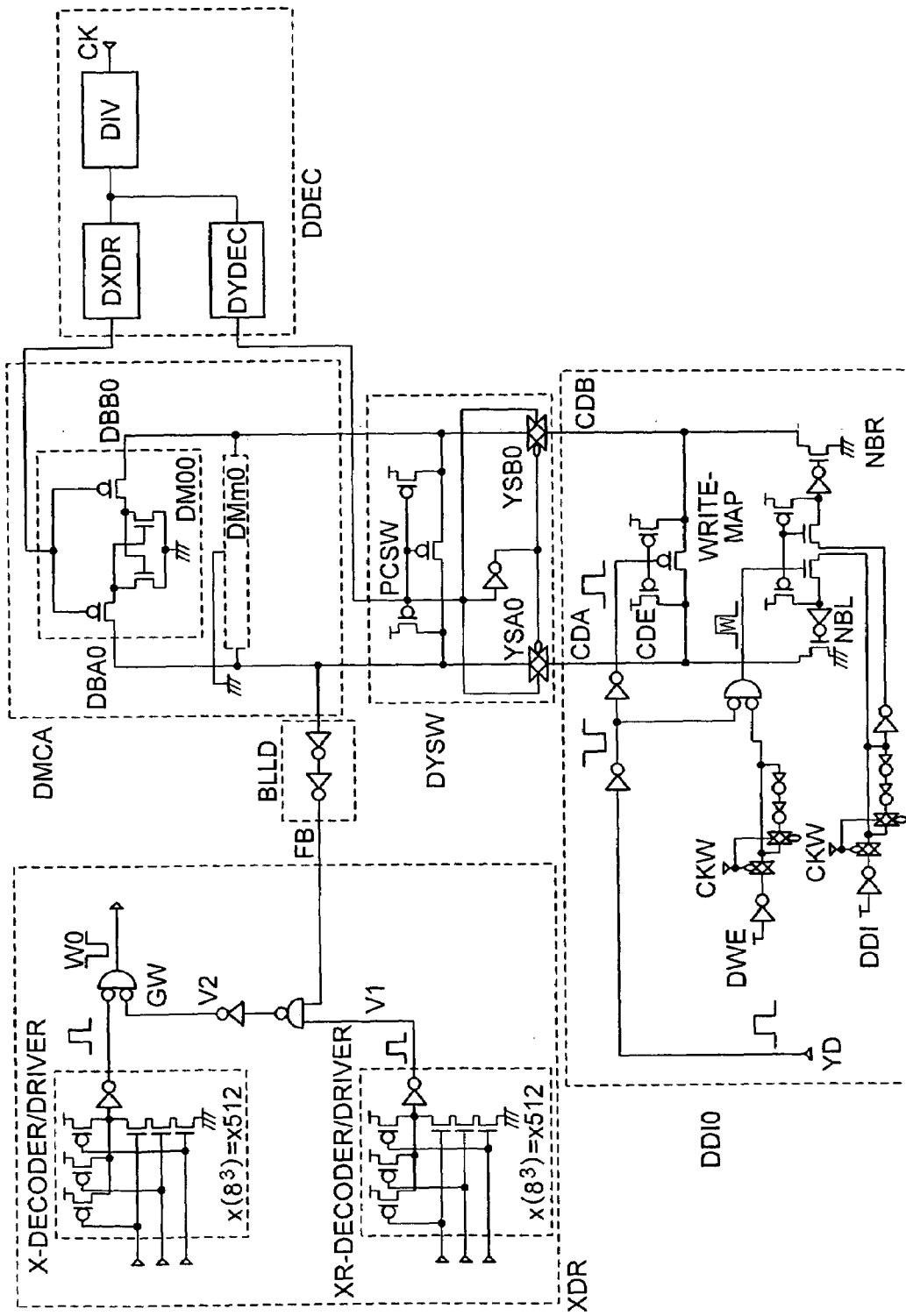
FIG. 22 is a block diagram showing a configuration of main sections of FIG. 21.

FIG. 22 shows a configuration example of the dummy address decoder DDEC, the dummy memory cell array DMCA, the dummy column selector circuit DYSW, the dummy input/output circuit DDIO, and the dummy bit line level detector BLLD shown in FIG. 21.

The dummy address decoder DDEC includes dummy memory cells DM00 to DMm0 and dummy bit lines DBA0 and DBB0. Each of the dummy memory cells DM00 to DMm0 includes, like the memory cell of the memory cell array MCA, two driver MOS transistors and two selector MbS transistors coupled with the driver MOS transistors. The two driver MOS transistors are n-channel MOS transistors and the two selector MOS transistors are p-channel MOS transistors.

The dummy address decoder DDEC includes a frequency divider DIV to divide a clock signal CK inputted thereto, a dummy word line driver DXDR to drive the dummy word lines, and a dummy column address decoder DYDEC to generate an operation control signal for the dummy column selector DYSW. The dummy address decoder DDEC conducts, in cooperation with the circuits DYSW and DDIO, a write operation for the dummy memory cell DM00 during a cycle for a refresh operation.

The dummy column selector circuit DYSW includes a precharge circuit PCSW to precharge the dummy bit lines according to a signal outputted from the address decoder DYDEC and switch circuits YSAO and YSBO to selectively couple the dummy data lines with the common data lines CDA and CDB according to signals outputted from the address decoder DYDEC.

The dummy data input/output circuit DDIO includes a write amplifier which is activated in response to a dummy write enable signal to amplify data inputted from an input terminal DDI and a precharge circuit to precharge the common data lines CDA and CDB.

The dummy bit line level detector BLLD includes, although not particularly limitative, two inverters connected in series to each other and has a function to detect a level of the dummy bit line DBA0 during the bit line recovery after a write operation. When the bit line is at a predetermined high level, a refresh enable signal FB is asserted to allow generation of a refresh word line selection pulse. The signal FB is transferred to the word line driver XDR.

Figure 23:
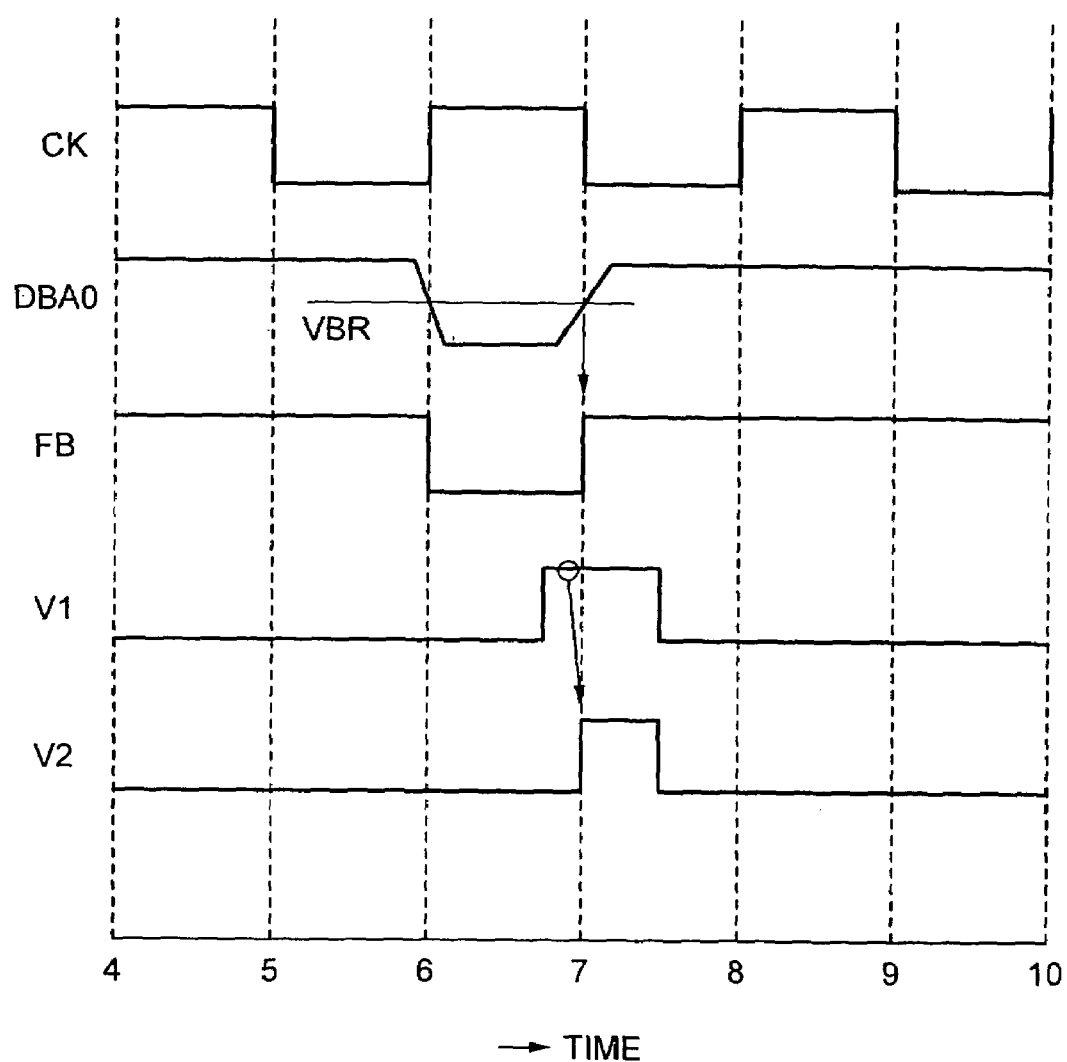
FIG. 23 is a signal timing chart showing operation of main sections of FIG. 22.

FIG. 23 shows waveforms to indicate operation timing, for example, for the dummy bit lines DBA0 and the control signal FB to allow generation of a refresh word line selection pulse shown in FIG. 22. According to circuit design of this example, when the level of the dummy bit line DBA0 is more than VBR, the signal FB is set to an "H" level. Therefore, an output signal V1 from a refresh address main decoder/word line driver XR-DECODER/DRIVER becomes effective after the signal FB is changed to an "H" level. An effective refresh word line selection pulse has a waveform indicated by V2.

Figure 24:
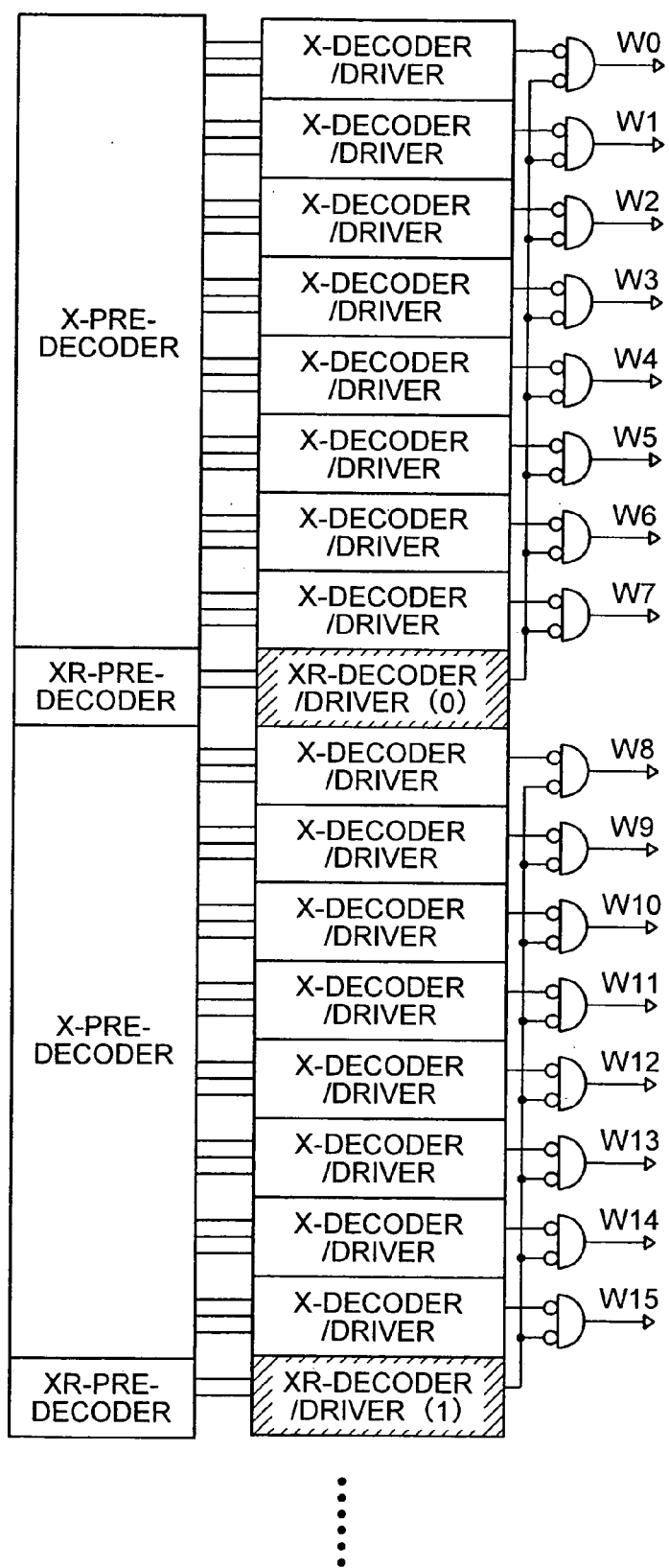
FIG. 24 is a block diagram showing a configuration of main sections of FIG. 10.

FIG. 24 shows another example of constitution of the row address decoder XDEC, the refresh address decoder XRDEC, and the word line driver XDR of FIG. 10. In this configuration, X-PRE-DECODER is a row address predecoder and X-DECODER/DRIVER is a row address main decoder/word line driver. Additionally, XR-PRE-DECODER is a refresh address decoder and XR-DECODER/DRIVER is a refresh address main decoder/word line driver. In FIG. 17, the refresh operation is conducted for one word line. In contrast thereto, in the configuration of FIG. 24, signals W0 to W7 are produced through a logical operation between an output signal from a refresh address main decoder/word line driver XR-DECODER/DRIVER (0) and an output signal from the row address main decoder/word line driver X-DECODER/DRIVER. Similarly, signals W8 to W15 are generated through a logical operation between an output signal from a refresh address main decoder/word line driver XR-DECODER/DRIVER (1) and an output signal from the row address main decoder/word line driver X-DECODER/DRIVER. As a result, eight word lines, for example, W0 to W7 or W8 to W15 are simultaneously refreshed. When a plurality of word lines are simultaneously refreshed, the refresh cycle can be elongated as much, and hence the power consumption is reduced.

Figure 25:
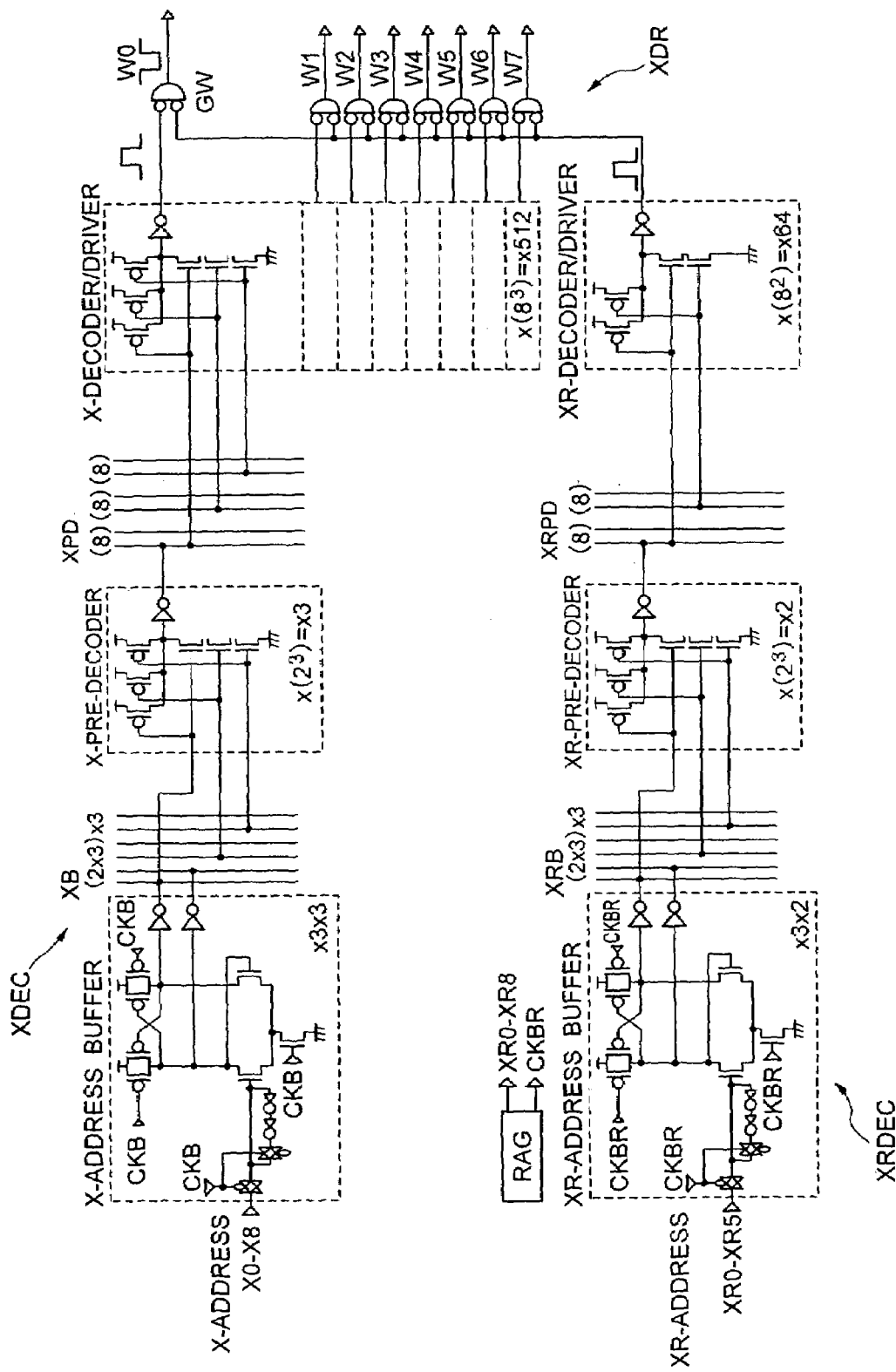
FIG. 25 is a block diagram showing a configuration example of main sections of FIG. 24.

FIG. 25 shows another example of constitution of the row address decoder XDEC, the refresh address decoder XRDEC, and the word line driver XDR of FIG. 24. In this configuration, X-ADDRESS BUFFER is a row address input circuit, X0 to X8 are row address signals, and CKB is a clock signal to determine timing to obtain an address signal. X-PRE-DECODER indicates a row address predecoder and X-DECODER/DRIVER is a row address main decoder/word line driver. RAG is a refresh address generator circuit described above. XR-ADDRESS BUFFER indicates a refresh address input circuit, XR0 to XR5 are refresh address signals, and CKBR is a refresh address clock signal. XR-PRE-DECODER is a refresh address predecoder and XR-DECODER/DRIVER is a refresh address main decoder/word line driver.

Figure 26:
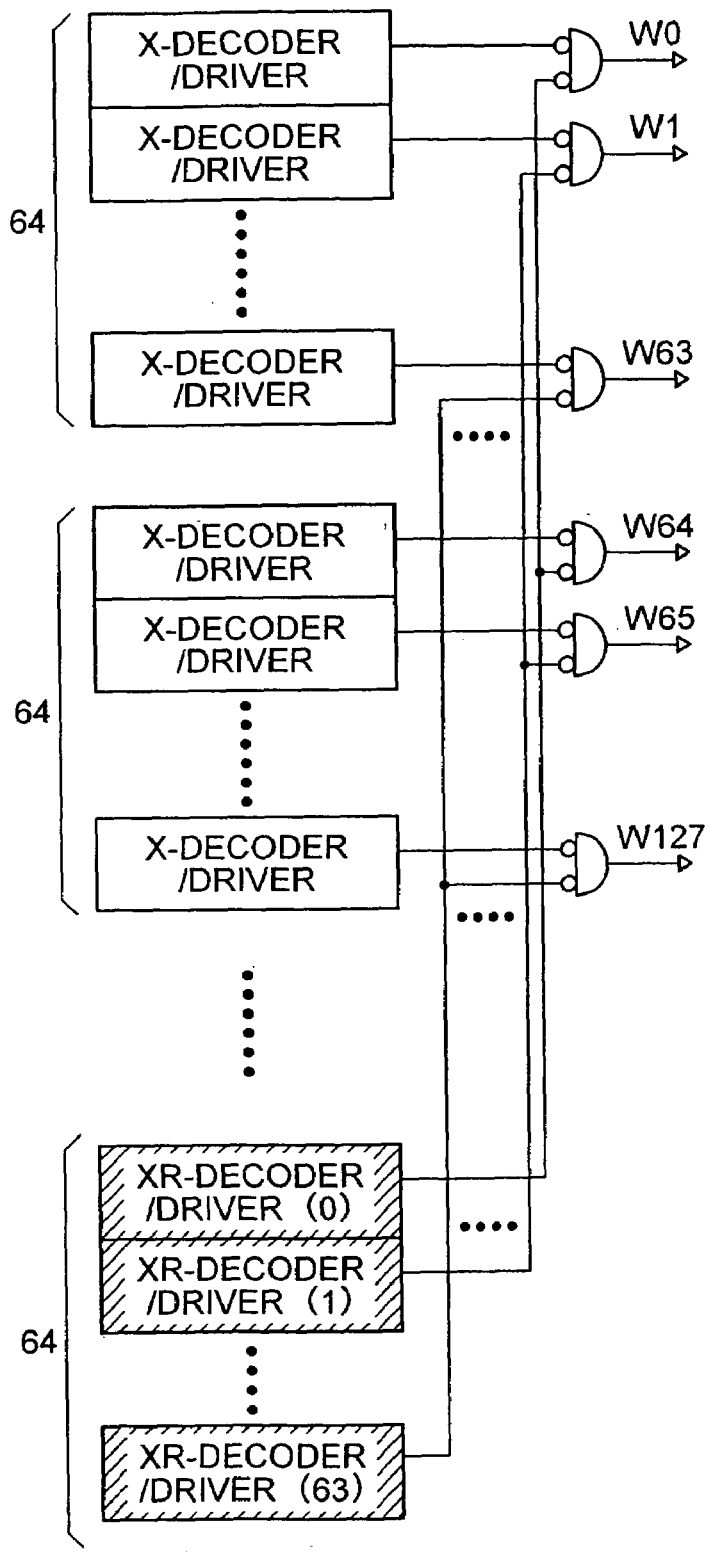
FIG. 26 is a block diagram showing another configuration example of main sections of FIG. 10.

FIG. 26 shows another example of the configuration of the row address decoder XDEC, the refresh address decoder XRDEC, and the word line driver XDR of FIG. 10. Also in this configuration, as in FIG. 24, eight word lines are refreshed at the same time. When a plurality of word lines are simultaneously refreshed, the refresh cycle can be elongated as much, and hence the power consumption is accordingly reduced. In this example, when the word lines to be simultaneously selected are distributed (XR-DECODER/DRIVER (0) to XR-DECODER/DRIVER (63) are coupled with gates to select every 64th word line in this case), it is possible to prevent concentration of currents flowing through the bit line in the refresh operation. This leads to advantages that, for example, noise is reduced and disconnection of wiring due to electro-migration is prevented.

Figure 27:
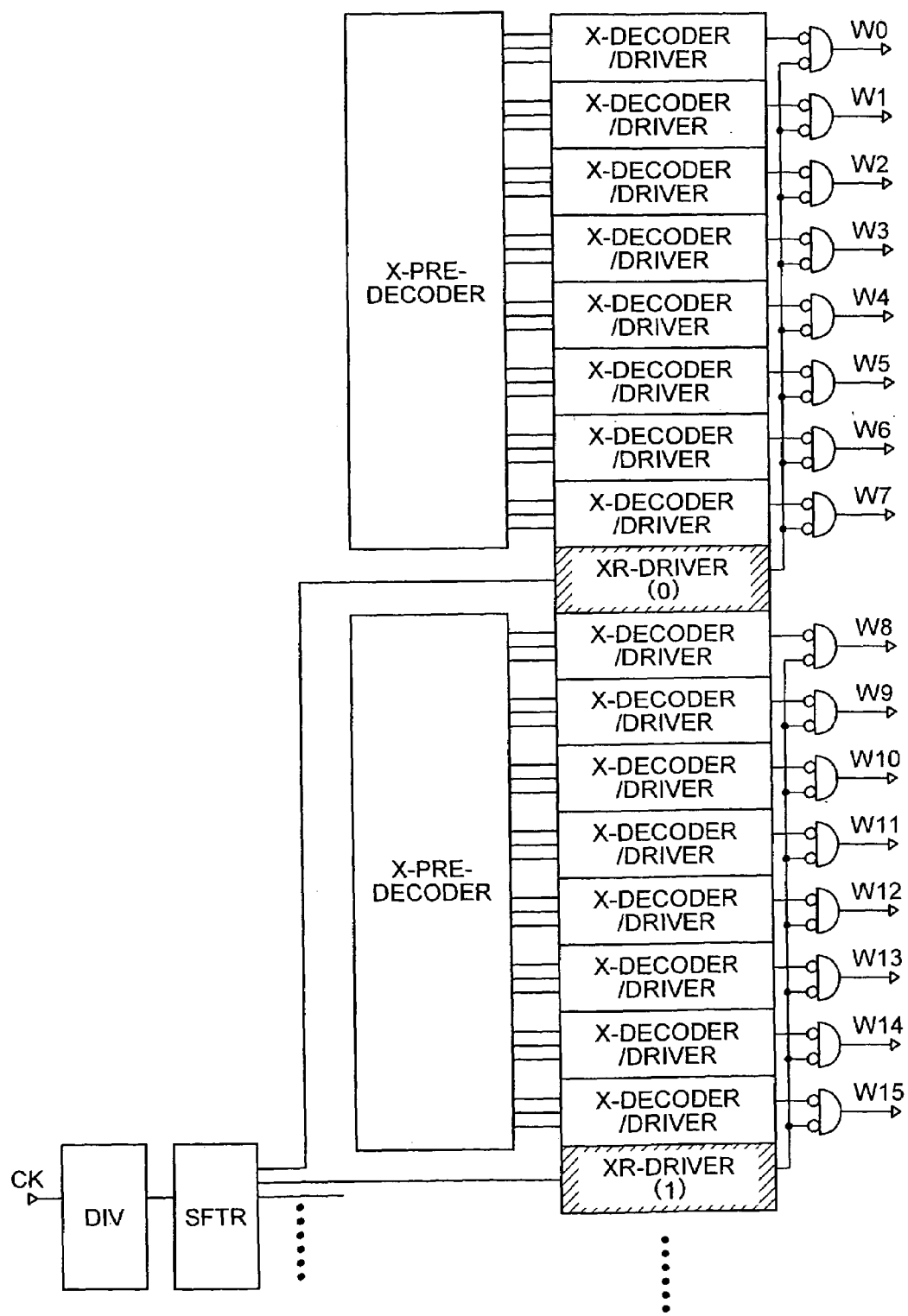
FIG. 27 is a block diagram showing another configuration example of main sections of FIG. 10.

As shown in FIG. 27, it is also possible that in place of the refresh address predecoder XR-PRE-DECODER shown in FIG. 24, a frequency divider DIV to divide a clock signal and a shift register SFTR to shift a selection signal at timing synchronized with an output signal from the divider DIV are disposed such that a word line to be refreshed is selected according to an output signal from the shift register SFTR. In this configuration, the refresh address generator RAG and the refresh address decoder XRDEC of FIG. 10 are not required. This consequently reduces the area and the power consumption necessary for the system. In this case, the configuration of the control device of the present invention includes the divider DIV and the shift register SFTR.

Figure 28:
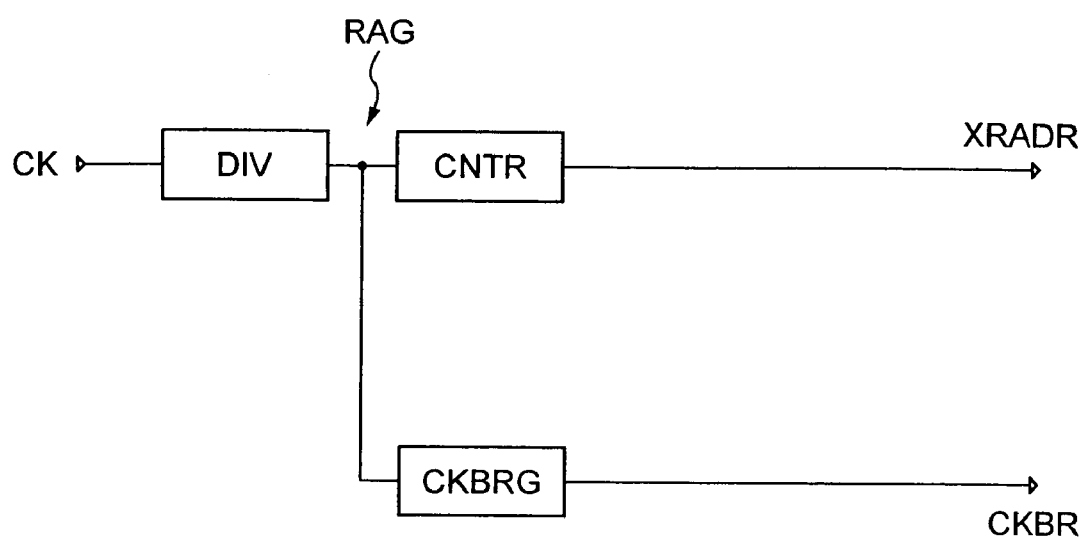
FIG. 28 is a block diagram showing another configuration example of main sections of FIG. 10.

FIG. 28 shows another configuration example of the refresh address generator circuit RAG. In FIG. 11, there is disposed, for example, an address comparator circuit CMP to compare an address for an information read or write operation with a refresh address. If the addresses match each other, the refresh operation is not required, and hence the output of the refresh address clock signal CKBR is prevented. In the present example, however, the address comparator CMP is dispensed with such that even if the addresses match each other, the refresh operation is carried out. In this configuration, the address comparator CMP is not required, and hence the area and the power consumption can be reduced.

Figure 29:
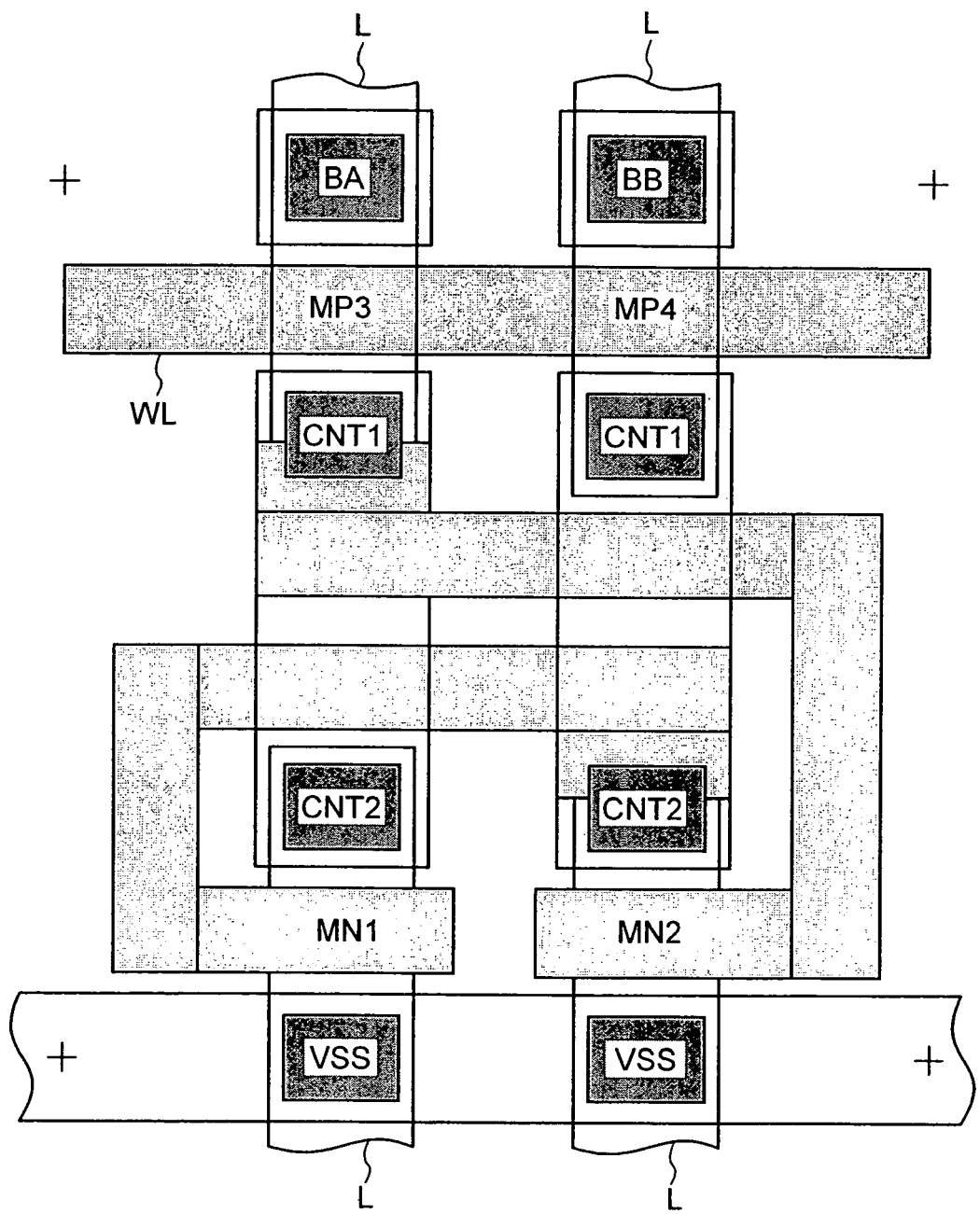
FIG. 29 is a diagram to explain another layout of the memory cells.

FIG. 29 shows a concrete example of a configuration of the memory cell M0. In the configuration, a rectangular area indicated by four plus signs "+" includes one memory cell. These plus signs are used only to facilitate understanding of the configuration and are not actually formed on a semiconductor substrate. FIG. 29 shows only primary conductive layers of the memory cell and areas or regions connecting the layers to each other. Other elements such as an insulator layer formed between conductive layers are not shown. In the configuration, L is a semiconductor active region and MN1 and MN2 as well as MP3 and MP4 respectively indicate gate electrodes of the n-channel MOS transistors MN1 and MN2 of FIG. 1 and gate electrodes of the p-channel MOS transistors MP3 and MP4 of FIG. 1. CTN1 is a contact zone to connect a drain of the p-channel MOS transistor to the conductive layer. CTN2 is a contact zone to connect a drain of the n-channel MOS transistor to the conductive layer. BA and BB are contact zones each of which connects a source of the p-channel MOS transistor to a bit line. VSS is a contact zone to connect a source of the n-channel MOS transistor to a power source line. WL indicates a word line. By arranging above and below the cell a memory cell obtained by rotating the pertinent cell by 180°, the contact zones BA and BB can be shared between the central cell and its adjacent cell thereabove, and VSS can be shared between the central cell and the adjacent cell therebelow. By sharing part of the pattern in this way, there can be obtained an advantage of reduction of the memory in size.

Figure 30:
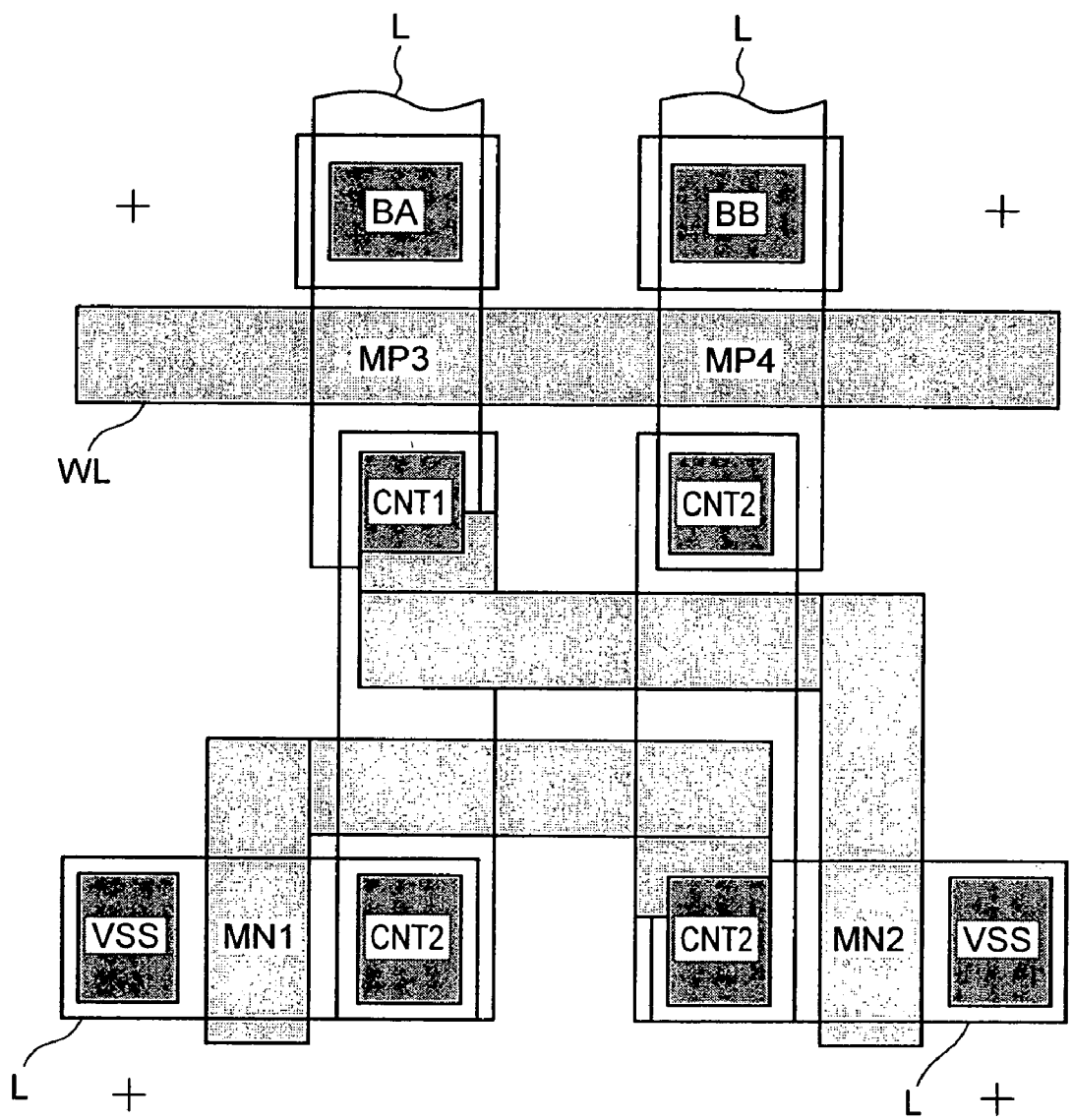
FIG. 30 is a diagram to explain another layout of the memory cells.

FIG. 30 shows another configuration example of the memory cell M0. In the configuration, a rectangular area indicated by four plus signs "+" designates one memory cell. These plus signs are used only for easy understanding of the configuration and are not actually formed on a semiconductor substrate. FIG. 30 shows only primary conductive layers of the memory cell and areas connecting the layers to each other. Other elements such as an insulator layer formed between conductive layers are not shown. In the configuration, L is a semiconductor active region, and MN1 and MN2 as well as MP3 and MP4 respectively indicate gate electrodes of the n-channel MOS transistors MN1 and MN2 of FIG. 1 and gate electrodes of the p-channel MOS transistors MP3 and MP4 of FIG. 1. CTN1 is a contact zone to connect a drain of the p-channel MOS transistor to the conductive layer. CTN2 is a contact zone to connect a drain of the n-channel MOS transistor to the conductive layer. BA and BB are contact zones each of which connects a source of the p-channel MOS transistor to a bit line. VSS is a contact zone to connect a source of the n-channel MOS transistor to a power source line. WL indicates a word line. By arranging above and below the cell a memory cell obtained by rotating the above cell by 180°, the contact zones BA and BB can be shared between the central cell and its adjacent cell thereabove, and VSS can be shared between the central cell and the adjacent cells on the right and left sides thereof. By sharing part of the pattern in this way, there can be obtained an advantage of reduction of the memory in size.

Figure 31:
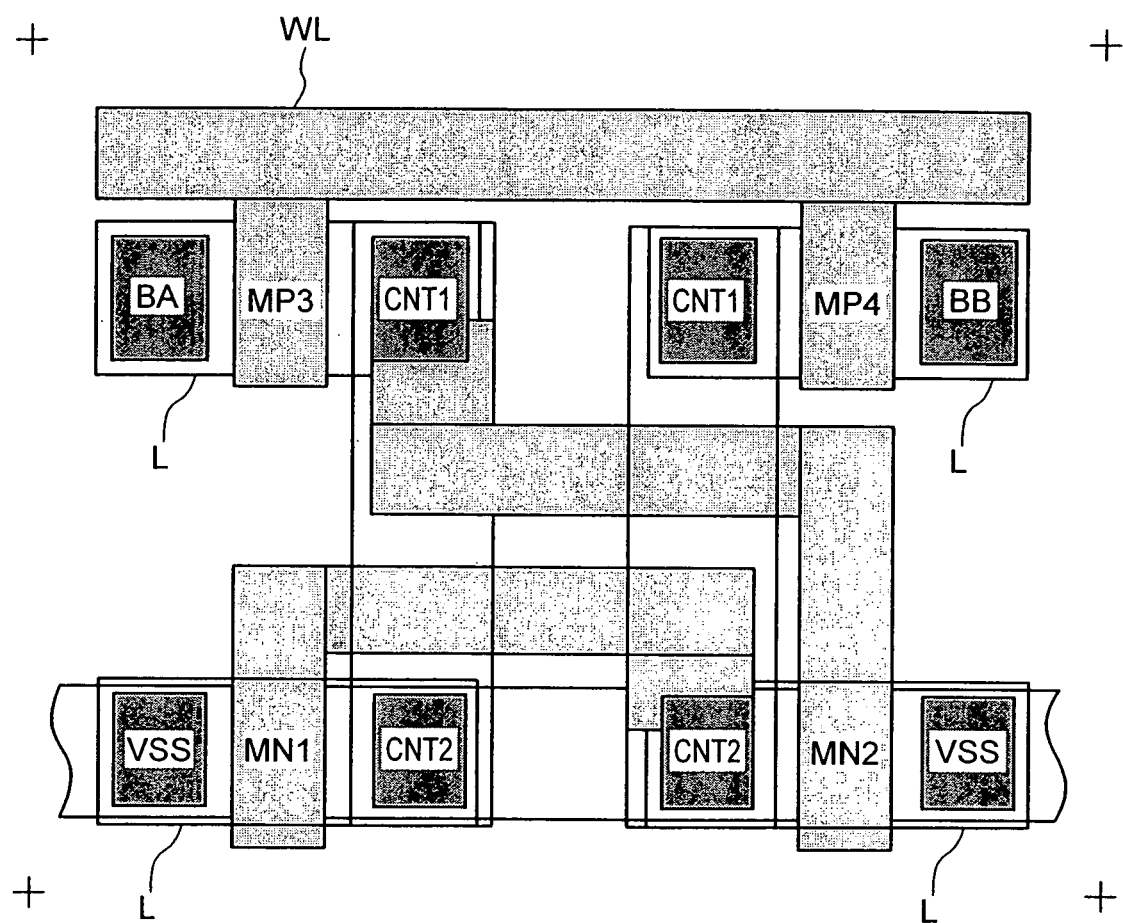
FIG. 31 is a diagram to explain another layout of the memory cells.

FIG. 31 shows another configuration example of the memory cell M0. In the configuration, a rectangular area formed by four plus signs "+" includes one memory cell. These plus signs are used only for easy understanding of the configuration and are not actually formed on a semiconductor substrate. FIG. 31 shows only primary conductive layers of the memory cell and areas connecting the layers to each other. Other elements such as an insulator layer formed between conductive layers are not shown. In the configuration, L is a semiconductor active region and MN1 and MN2 as well as MP3 and MP4 respectively indicate gate electrodes of the n-channel MOS transistors MN1 and MN2 of FIG. 1 and gate electrodes of the p-channel MOS transistors MP3 and MP4 of FIG. 1. CTN1 is a contact zone to connect a drain of the p-channel MOS transistor to the conductive layer. CTN2 is a contact zone to connect a drain of the n-channel MOS transistor to the conductive layer. BA and BB are contact zones each of which connects a source of the p-channel MOS transistor to a bit line. VSS is a contact zone to connect a source of the n-channel MOS transistor to a power source line. WL indicates a word line.

Figure 32:
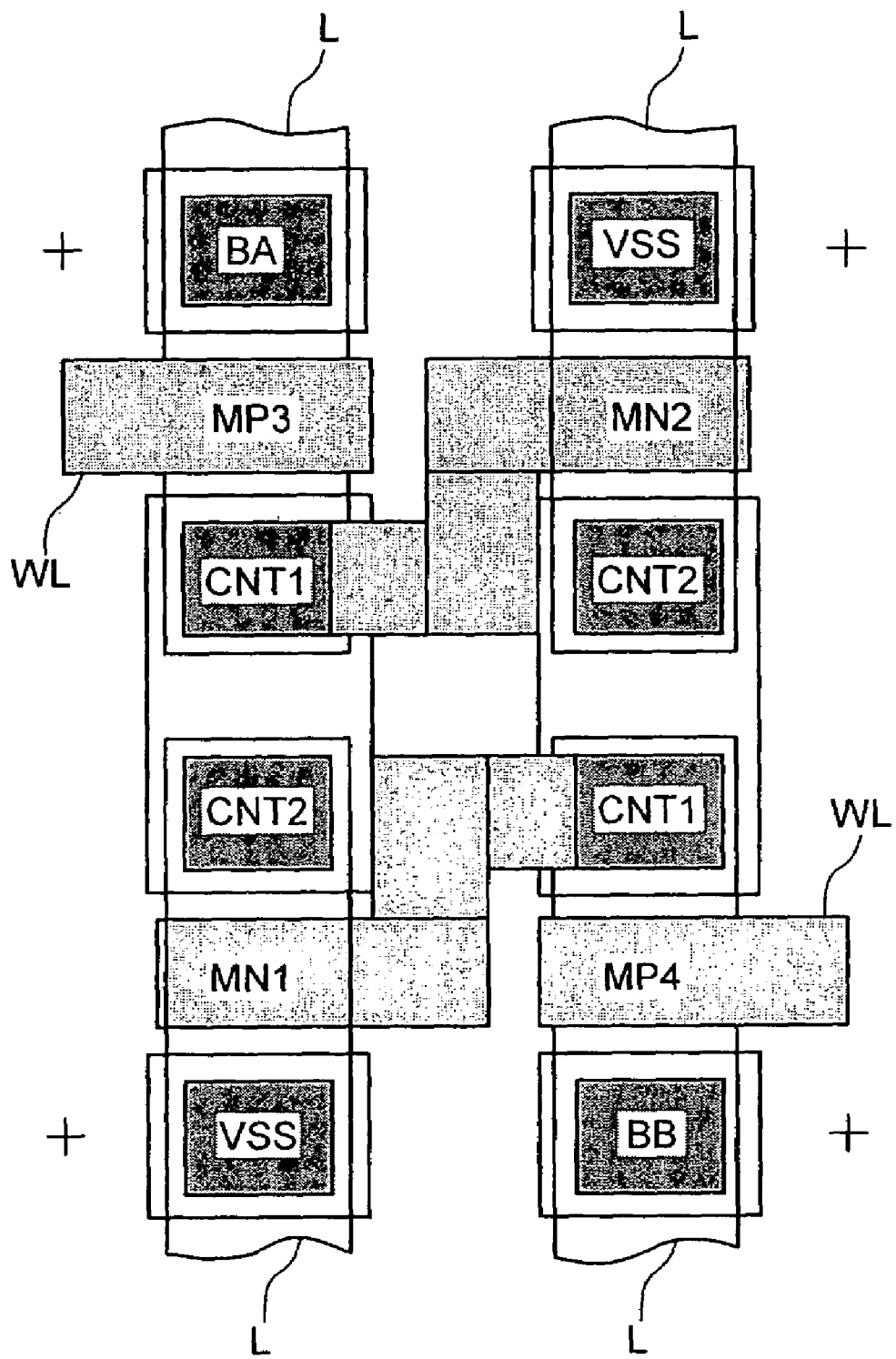
FIG. 32 is a diagram to explain another layout of the memory cells.

FIG. 32 shows another configuration example of the memory cell M0. In the configuration, a rectangular area drawn by four plus signs "+" includes one memory cell. These plus signs are used only for easy understanding of the configuration and are not actually formed on a semiconductor substrate. FIG. 32 shows only primary conductive layers of the memory cell and areas connecting the layers to each other. Other elements such as an insulator layer formed between conductive layers are not shown. In the configuration, L is a semiconductor active region and MN1 and MN2 as well as MP3 and MP4 respectively indicate gate electrodes of the n-channel MOS transistors MN1 and MN2 of FIG. 1 and gate electrodes of the p-channel MOS transistors MP3 and MP4 of FIG. 1. CTN1 is a contact zone to connect a drain of the p-channel MOS transistor to the conductive layer. CTN2 is a contact zone to connect a drain of the n-channel MOS transistor to the conductive layer. BA and BB are contact zones each of which connects a source of the p-channel MOS transistor to a bit line. VSS is a contact zone to connect a source of the n-channel MOS transistor to a power source line. WL indicates a word line. By arranging above and below the central cell a memory cell which is axi-symmetric with respect to the central cell, the contact zones BA, BB, and VSS can be shared between the central cell and the adjacent cells above and below the central cell. By sharing part of the pattern in this way, there can be obtained an advantage of reduction of the memory in size.

Figure 33:
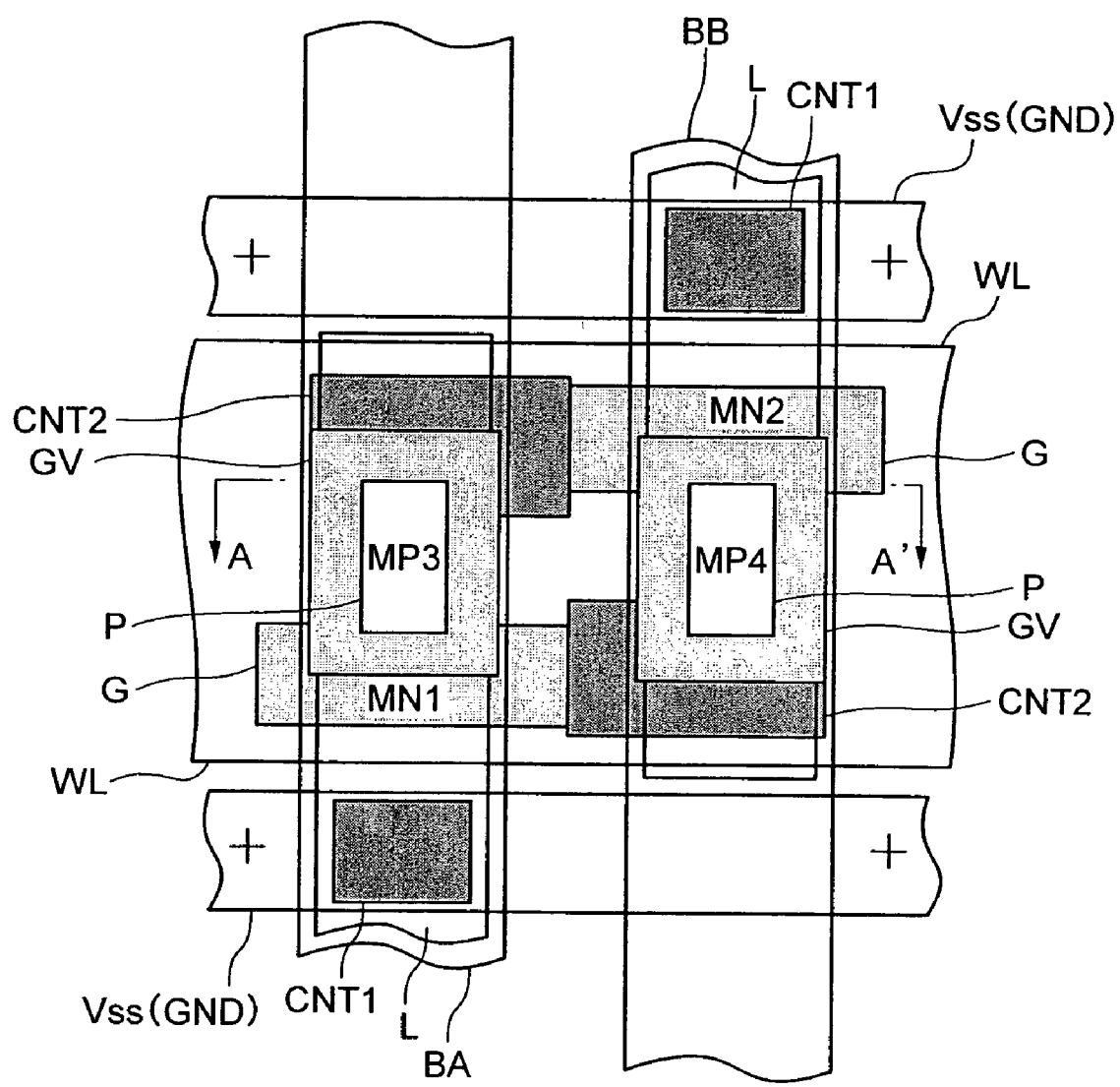
FIG. 33 is a diagram to explain another layout of the memory cells.
Figure 34:
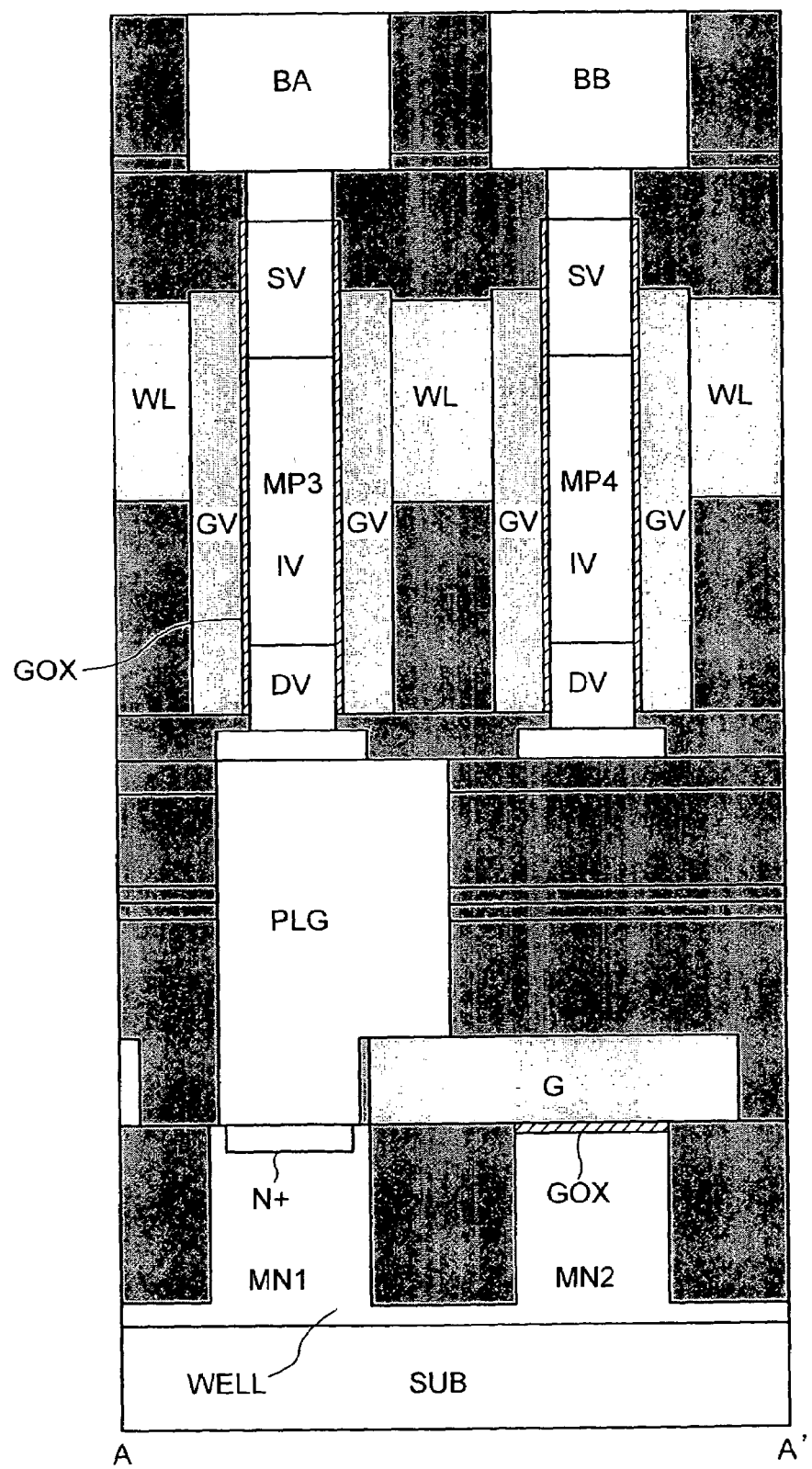
FIG. 34 is a cross-sectional view along line A–A' of FIG. 33.

FIG. 33 shows another configuration example of the memory cell M0. FIG. 34 shows a cross-sectional view of FIG. 33 along line A–A'. In the configuration of FIG. 33, a rectangular area indicated by four plus signs "+" includes one memory cell. These plus signs are used only for easy understanding of the configuration and are not actually formed on a semiconductor substrate. FIG. 33 shows only primary conductive layers of the memory cell and areas connecting the layers to each other. Other elements such as an insulator layer formed between conductive layers are not shown.

A p-type well WELL is formed in a principal surface of a semiconductor substrate (to be referring to as "substrate" hereinbelow) SUB formed using, for example, p-type monocrystalline silicon. In an active region of which a peripheral region is defined by element isolation grooves of the p-type well WELL, two driver MOS transistors MN1 and MN2 are formed as part of a memory cell M0. The element isolating grooves are filled with an insulator film such as a silicon oxide film to form element isolating zones.

As shown in FIG. 33, the active region L has a rectangular pattern in a plan view extending in a vertical direction (Y direction) of FIG. 33. In a region of one memory cell, two active regions L and L are disposed in parallel to each other. Of the two transistors MN1 and MN2, the transistor MN1 is formed in a first active region L and the transistor MN2 is formed in a second active region L.

The first active region L is formed to be continuous to an active region L of a memory cell adjacent to and above the pertinent memory cell. The second active region L is formed to be continuous to an active region L of a memory cell adjacent to and below the pertinent memory cell.

The MOS transistors MN1 and MN2 of the memory cells adjacent to each other in a perpendicular direction (above and below) are configured to be axi-symmetric to each other with respect to a horizontal boundary line of FIG. 33 in a pattern in a plan view. The transistors MN1 and MN2 of the memory cells adjacent to each other in a horizontal direction (right and left) are configured to be point-symmetric to each other in a pattern of a plan view. As a result, the memory size can be reduced.

As shown in FIG. 34, each of the driver MOS transistors MN1 and MN2 includes a gate insulating film GOX formed mainly on a surface of the p-type well WELL, a gate electrode G formed above the insulator film GOX, and $n^+$-type semiconductor regions $N^+$ (source and drain regions) formed in p-type wells on both sides of the gate electrode G. The gate electrode G of each of the transistors MN1 and MN2 is formed using a conductive film primarily made of n-type polycrystalline silicon and has a rectangular pattern in a plan view extending in a horizontal direction vertical to the extending direction, i.e., the perpendicular direction of the active region L. That is, in the driver MOS transistors MN1 and MN2, the channel width direction is the horizontal direction and the channel length direction is the perpendicular direction.

As shown in FIGS. 33 and 34, two vertical MOS transistors MP3 and MP4, each of which has a vertical channel between the source and the drain extending perpendicularly to a substrate surface, as part of the memory cell M0 are formed respectively above the driver MOS transistors MN1 and MN2, each of which has a horizontal channel between the source and the drain extending parallel with the substrate surface. The transistor MP3 is above the transistor MN1 such that these transistors overlap with each other. The transistor MP4 is above the transistor MN2 such that these transistors overlap with each other.

Two transistors MP3 and MN1 and two transistors MP4 and MN2 of the memory cell are arranged point-symmetric to each other in a rectangular area enclosed by the four plus signs. As a result, the memory cell size can be reduced.

Each of the transistors MP3 and MP4 primarily includes a laminated region P including a lower semiconductor layer DV, an intermediate semiconductor layer IV, and an upper semiconductor layer SV laminated in this order in a direction vertical to the principal surface of the substrate, the laminated region P having a contour of a quadrangular prism (or an elliptic cylinder) in a pattern in a plan view; a gate insulator film GOX formed on a side surface of the laminated region P, and a gate electrode GV formed to cover a side wall of the laminated region P.

The gate insulator film GOX includes, for example, a silicon oxide film including a single-layer film produced by low-temperature thermal oxidation at a temperature equal to or less than 800° C. (e.g., wet oxidation) or by chemical vapor deposition (CVD). Or, the film GOX includes a laminated film including a film produced by oxidation at a low temperature and a film produced by CVD. By producing the gate insulator film GOX by the low-temperature process as above, it is possible to reduce fluctuation in, for example, a threshold value (Vth) of the vertical MOS transistors.

The gate electrode GV includes, for example, a silicon film made of n-type polycrystalline silicon. The lower semiconductor layer DV of the laminated region P includes, for example, p-type polycrystalline silicon and serves as either one of the source and the drain of the vertical MOS transistor. The intermediate semiconductor layer IV includes, although not particularly limitative, a nondoped silicon film made of, for example, nondoped polycrystalline silicon and substantially serves as a substrate of the vertical MOS transistor. The side wall of the layer IV serves as a channel region. The upper semiconductor layer SV includes a p-type silicon film made of, for example, p-type polycrystalline silicon and serves as the other one of the drain and the drain of the vertical MOS transistor. The upper semiconductor layer SV is formed in an upper section of the vertical MOS transistor and is electrically connected to complementary bit lines BA and BB extending to cross the upper section of the laminated region P. That is, in the vertical MOS transistor, the lower semiconductor layer DV serves as either one of the source and the drain and the upper semiconductor layer SV serves as the other one of the source and the drain. However, in the description below, the lower semiconductor layer DV serves as the source and the upper semiconductor layer SV serves as the drain for convenience of explanation.

As above, the vertical MOS transistor is a so-called vertical channel MOS transistor including a source, a substrate (channel region), and a drain laminated in a direction vertical to the principal surface of the substrate such that a channel current flows in a direction vertical to the principal surface of the substrate. That is, the channel length direction of the vertical MOS transistor is vertical to the principal surface of the substrate. The channel length thereof is defined as a gap between the lower semiconductor layer DV and the upper semiconductor layer SV in a direction vertical to the principal surface of the substrate. The channel width of the vertical MOS transistor is defined as a length of an outer periphery of a side wall of the laminated region in the form of a quandrangular prism. As a result, the channel width of the vertical MOS transistor can be increased.

The vertical MOS transistor includes a complete-depletion silicon-on-insulator (SOI) vertical MOS transistor in which the intermediate semiconductor layer IV as a substrate of the vertical MOS transistor is completely depleted in an off state in which the power source voltage (Vdd) is applied to the gate electrode GV. Therefore, an off leakage current IOFF(P) can be less than an on current ION(P), and hence a memory cell can be implemented. The threshold value Vth of the vertical p-type transistor is controlled according to a work function of the gate electrode GV. The gate electrode can be formed using a p-type silicon film (p-type polycrystalline silicon film), a p-type SiGe film, a nondoped SiGe film, an n-type SiGe film, or a refractory metal film. In the description, the intermediate semiconductor layer IV is a nondoped silicon film. However, the present invention is not restricted by the example. By doping n-type or p-type impurity into the intermediate semiconductor layer and by adjusting a profile of the channel impurity in a direction vertical to the principal surface of the substrate, it is possible to completely deplete the intermediate semiconductor layer as the substrate of the vertical MOS transistor so that the off leakage current IOFF(P) can be decreased as compared with the on leakage current ION(P).

As shown in FIG. 34, the lower semiconductor layer (source) DV of the vertical MOS transistor MP3 is electrically connected via a connecting conductive layer formed below the layer DV and a plug PLG in a contact hole formed below the conductive layer to an $n^+$-type semiconductor region (drain) $N^+$ of the driver MOS transistor MN1. The plug PLG is also connected to a gate electrode G of the driver MOS transistor MN2. Although not shown in FIG. 34, the plug in the contact hole to connect the lower semiconductor layer (source) DV of the vertical MOS transistor MP3 to the $n^+$-type semiconductor region (drain) of the driver MOS transistor MN1 is also connected to a gate electrode G of the driver MOS transistor MN1. That is, the two contact holes formed in the memory cell and the plug therein serve as conductive layers to cross-couple the driver MOS transistors and the vertical MOS transistors. The connecting conductive layer includes a metal film primarily made of tungsten silicide ($WSi_2$) and the plug includes a metal film primarily made of tungsten (W).

In the memory described above, a memory cell includes two driver MOS transistors and two vertical MOS transistors. The vertical MOS transistors are formed respectively above the driver MOS transistors, and the associated transistors overlap with each other. Thanks to the configuration, the area occupied by the memory cell is equal to that substantially occupied by the two driver MOS transistors. Therefore, the area of the memory cell is about one third of that of a memory cell of complete CMOS type including six MOS transistors in the same design rule.

Since a p-type vertical MOS transistor is formed above an n-channel driver MOS transistor, a zone to isolate a p-type well from an n-type well is not required in an area occupied by one memory cell. The isolation zone is required in a memory cell of complete CMOS type in which a load MOS transistor of p-channel type is formed in an n-type well of a substrate. Therefore, the area occupied by the memory cell is further reduced and is about one fourth of that of a memory cell of complete CMOS type including six MOS transistors in the same design rule. It is consequently possible to implement a high-speed, large-capacity memory.

Figure 35A:
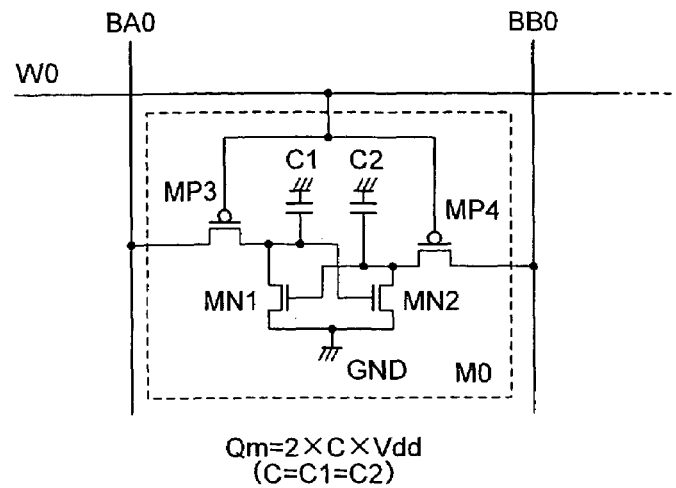
FIGS. 35A, 35B, and 35C are circuit diagrams showing another configuration of the memory cells.
Figure 35B:
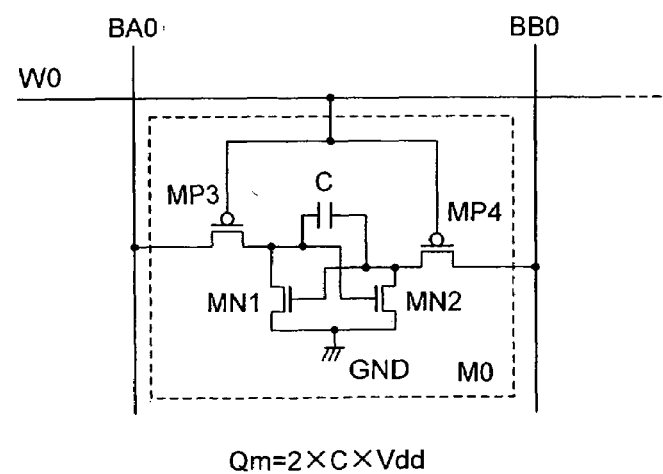
Figure 35C:
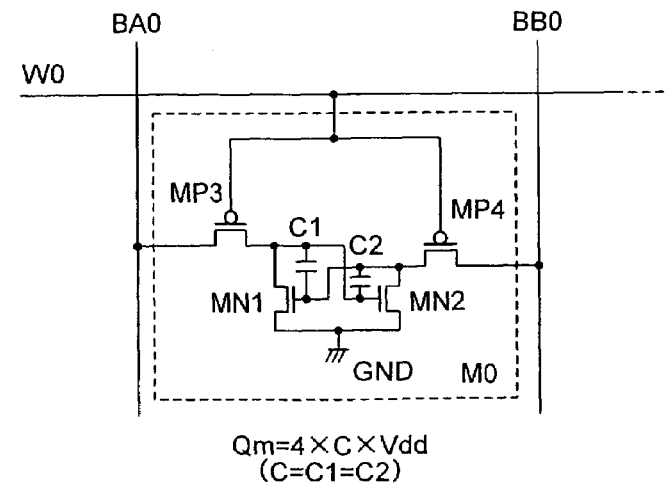

FIGS. 35A, 35B, and 35C show examples of the memory cell M0 in which capacitors are added to the storage node to reduce a software error in M0. The memory cell described above includes four transistors and hence accumulates an amount of charge less than a memory cell including six transistors. Therefore, a software error takes place more easily in the 4-transistor memory cell than in the 6-transistor memory cell. FIG. 35A shows an example in which capacitors C1 and C2 are respectively disposed between two storage nodes and ground G. Assume each capacitor has a capacitance value of C. The accumulation charge Qm of the memory cell is represented as $Qm=2\times C\times Vdd$ (not including charge accumulated by parasitic capacitors other than the capacitors C). It is also possible to couple the capacitors C1 and C2 with the power source on the high-potential side (Vdd).

FIG. 35B shows an example in which a capacitor C is connected between two storage nodes. Assume that the capacitor has a capacitance value of C. The accumulation charge Qm of the memory cell is represented as $Qm=2\times C\times Vdd$. That is, in the configuration of FIG. 35B, the capacitor can accumulate an amount of charge twice as much as that of the two capacitors of FIG. 35A. The memory size can be hence reduced as much. FIG. 35C shows an example in which a capacitor is connected between a source and a gate of each driver MOS transistor. Assume that the capacitor has a capacitance value of C. The accumulation charge Qm of the memory cell is represented as $Qm=4 \times C \times Vdd$. That is, in the configuration of FIG. 35C, the capacitor can accumulate an amount of charge twice as much as that of the two capacitors of FIG. 35A or the capacitor of 35B. This leads to an advantage that the memory size can be reduced as much.

Figure 36:
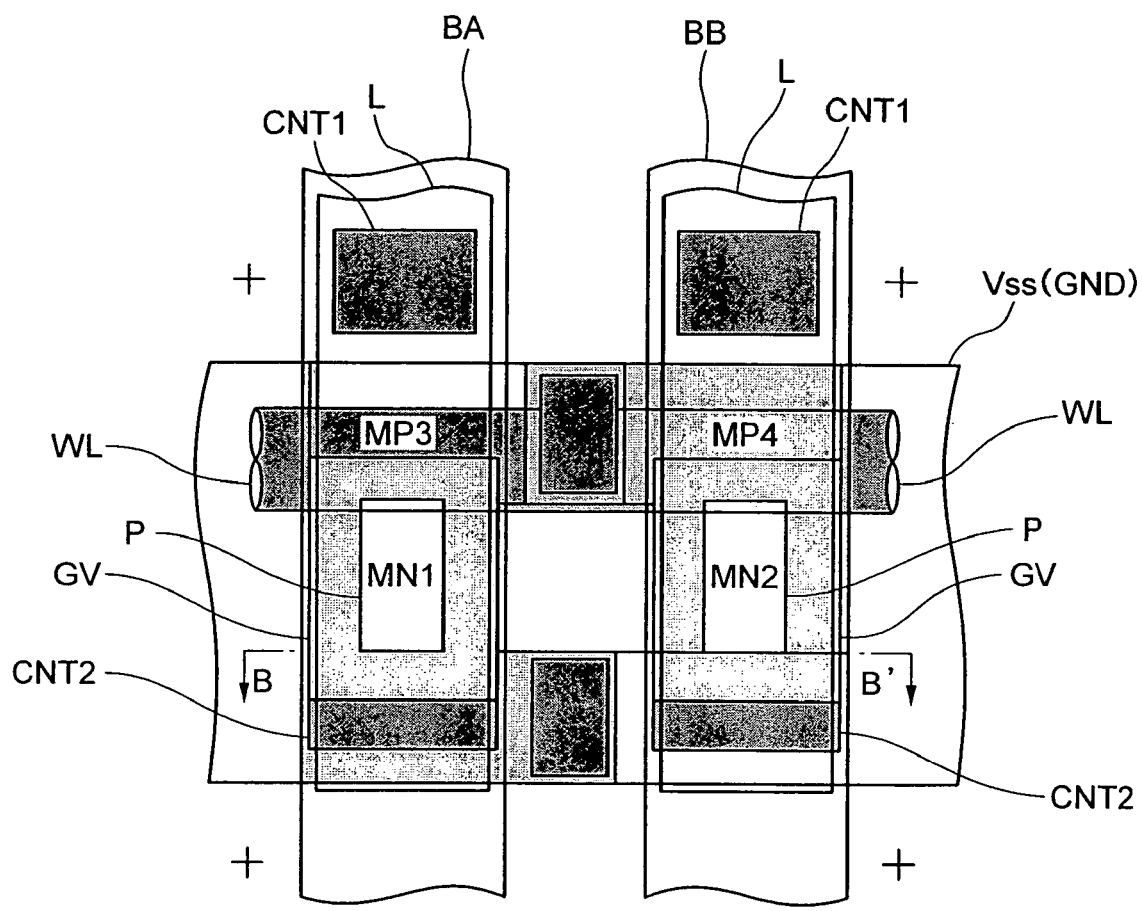
FIG. 36 is a diagram to explain another layout of the memory cells.
Figure 37:
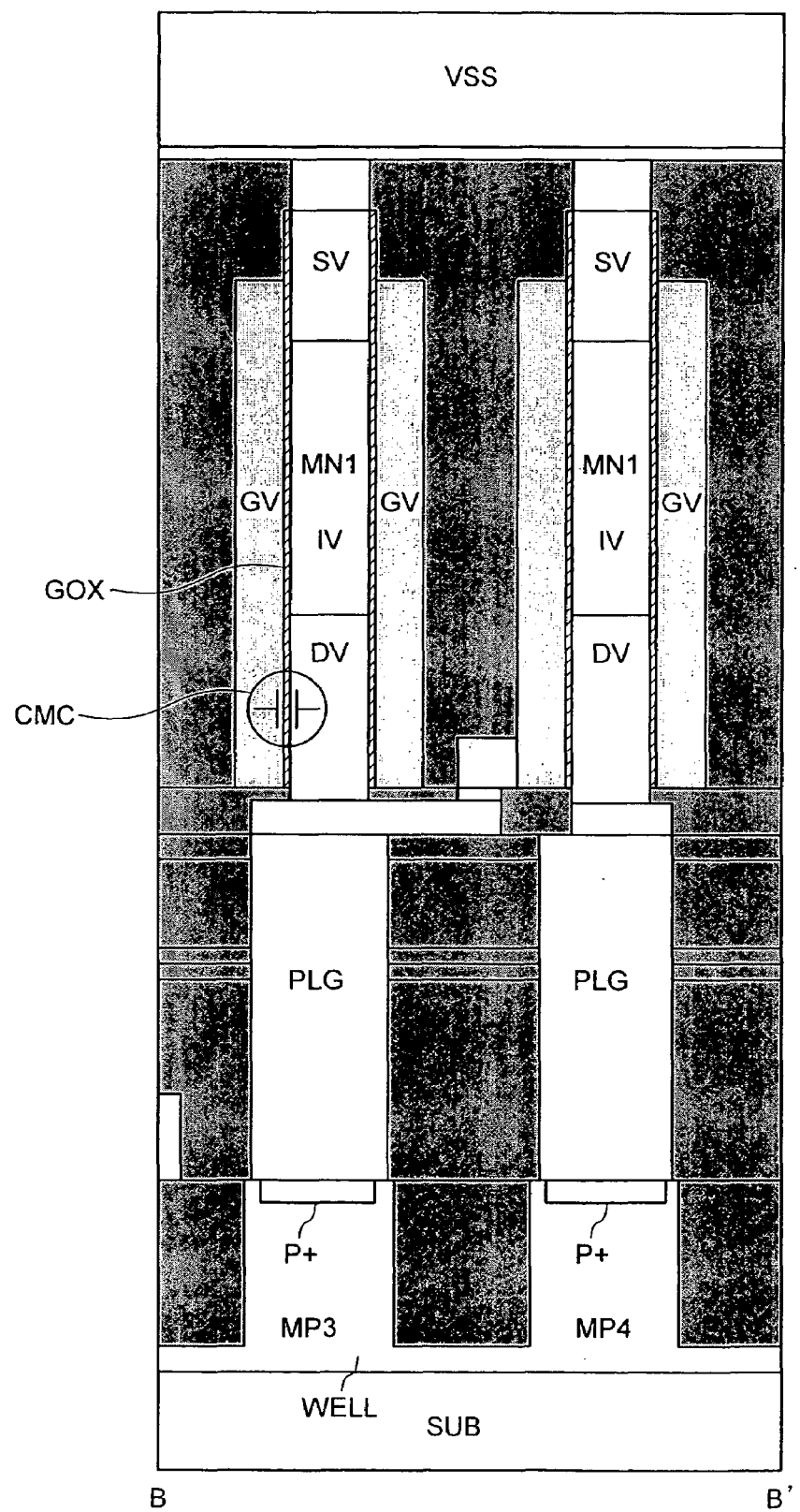
FIG. 37 is a cross-sectional view along line B–B' of FIG. 36.

FIG. 36 shows another example of the configuration of the memory cell M0. FIG. 37 shows a cross-sectional view of FIG. 36 along line B–B'. In the configuration of FIG. 36, a rectangular area indicated by four plus signs "+" includes one memory cell. These plus signs are used only for easy understanding of the configuration and are not actually formed on a semiconductor substrate. FIG. 36 shows only primary conductive layers of the memory cell and areas connecting the layers to each other. Other elements such as an insulator layer formed between conductive layers are not shown.

FIGS. 36 and 37 considerably differ from FIGS. 33 and 34 in that the two driver MOS transistors MN1 and MN2, each of which has a vertical channel between the source and the drain extending perpendicularly to a substrate surface, as part of the memory cell M0 are formed above the selector MOS transistors MP3 and MP4, each of which has a horizontal channel between the source and the drain extending parallel with the substrate surface. The vertical MOS transistor MN1 is formed above the transistor MP3 such that these transistors overlap with each other. The vertical MOS transistor MN2 is formed above the transistor MP4 such that these transistors overlap with each other.

The transistors MP3 and MN1 and the transistors MP4 and MN2 of the memory cell are arranged to be axisymmetric to each other with respect to a vertical central line of the rectangular area enclosed by four plus signs "+". As a result, the memory size can be reduced.

Each of the transistors MN1 and MN2 primarily includes a laminated region P including a lower semiconductor layer DV, an intermediate semiconductor layer IV, and an upper semiconductor layer SV laminated in this order in a direction vertical to the principal surface of the substrate, the laminated region P having a contour of a quadratic prism (or an elliptic cylinder) in a pattern in a plan view; a gate insulator film GOX formed on a side surface of the laminated region P, and a gate electrode GV formed to cover a side wall of the laminated region P.

Attention is to be attracted to a point that a capacitor CMC is formed using the lower semiconductor layer DV, the insulator film GOX, and the gate electrode GV. The capacitor is disposed between a source and a gate of the driver MOS transistor. The capacitor can therefore accumulate a large amount of charge described as above and hence the software error can be reduced as much. In this example, the driver MOS transistor is formed such that an opposing area between a drain electrode and a gate electrode of the transistor is more than that between a source electrode and the gate electrode of the transistor. As a result, the capacitor formed by the drain electrode and the gate electrode of the transistor is more in capacitance than the capacitance (CMC) between the source electrode and the gate electrode of the transistor. Since the electrodes to form the capacitors are fabricated to intersect the semiconductor substrate, even when the areas of the electrodes are increased to obtain a larger capacitance value, the area of the memory cell is not increased.

Figure 38:
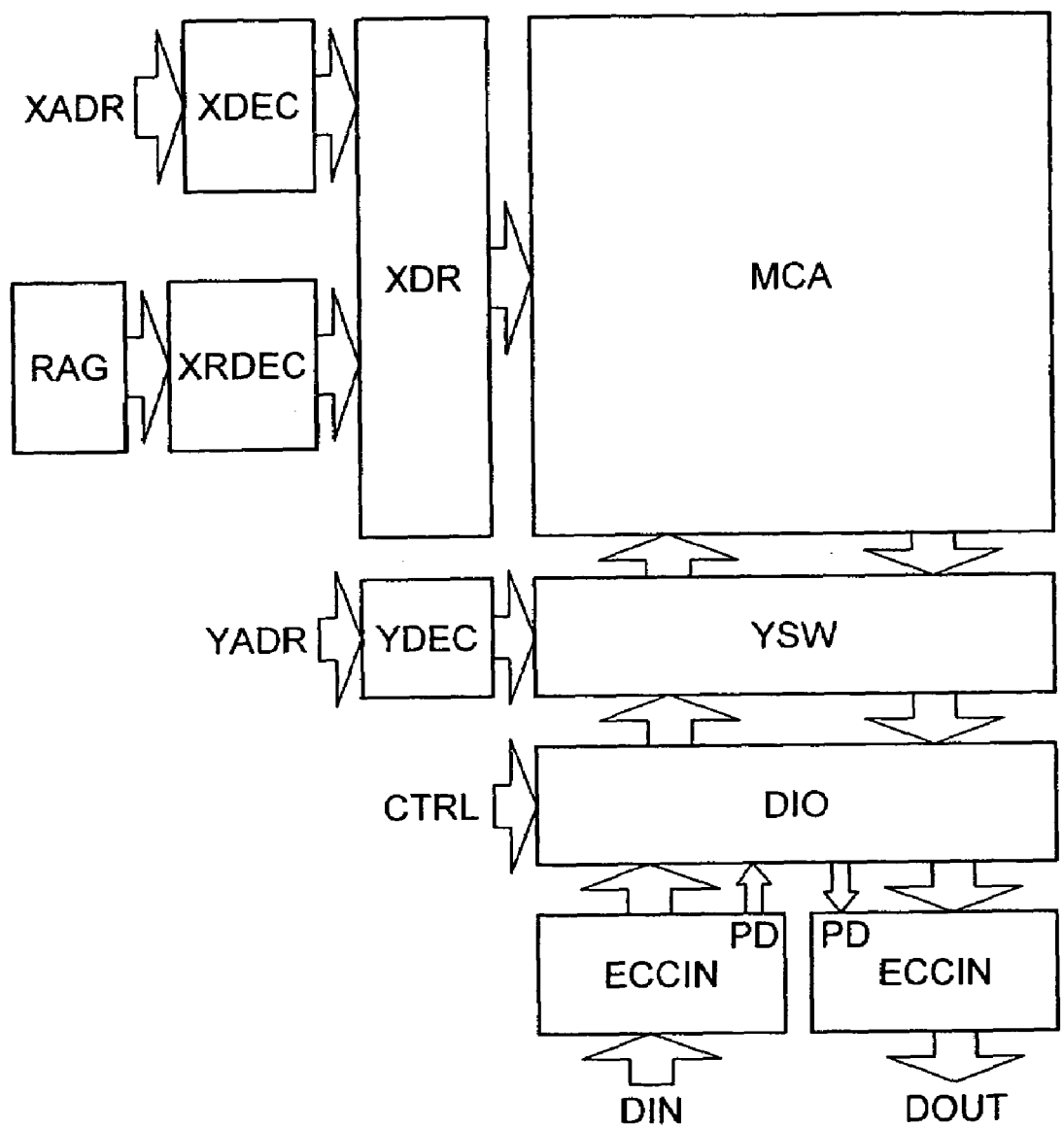
FIG. 38 is a block diagram showing another configuration example of the pseudo SRAM.

FIG. 38 shows another example of the configuration of the pseudo SRAM. In this example, to reduce the software error in the memory, an error check and correction (ECC) function is disposed in the memory. The configuration of this example is implemented by adding an ECC input circuit ECCIN and an ECC output circuit ECCOUT to the configuration shown in FIG. 10. The input circuit ECCIN generates parity information PD to conduct an error check for input data DIN. The input data DIN and the parity information PD are inputted to the data input/output circuit DIO. The circuit DIO writes the input data DIN and the parity information PD in a selected memory cell. When it is desired to read from the memory cell data beforehand written therein by the circuit DIO, the data and the associated parity information are simultaneously read therefrom and are fed to the ECC output circuit ECCOUT. Using the readout data and the parity information PD, the output circuit ECCOUT conducts an error check for the data. If an error is detected, the circuit ECCOUT corrects the error and outputs the data therefrom. If no error is detected, the circuit ECCOUT outputs the data without conducting the error correction.

Figure 39:
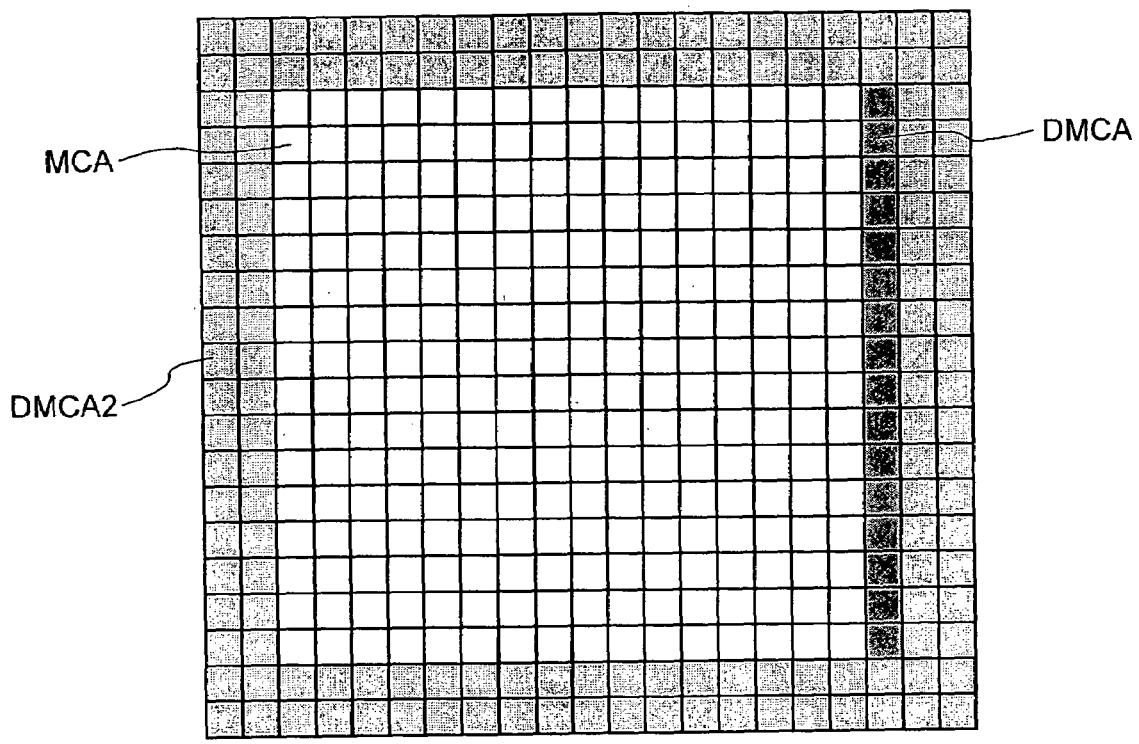
FIG. 39 is a block diagram to explain a layout of a dummy memory cell array shown in FIG. 21.

FIG. 39 shows a layout example of the dummy memory cell array DMCA of FIG. 21. In FIG. 39, MCA is a memory cell array including a plurality of memory cells disposed in the form of a matrix. DMCA indicates the dummy memory cell array DMCA shown in FIG. 21. DMCA 2 is called "contour dummy" and is arranged to enclose the memory cell arrays MCA and DMCA. It has been known that in general, when the layout pattern becomes irregular, characteristics of a transistor associated with the irregularity change. Therefore, in the example in which the contour dummy is disposed as above, the transistors of the memory cell arrays MCA and DMCA are not allocated in a periphery of the overall configuration of the arrays. This leads to an advantage that the characteristics of these transistors are kept unchanged.

Figure 40:
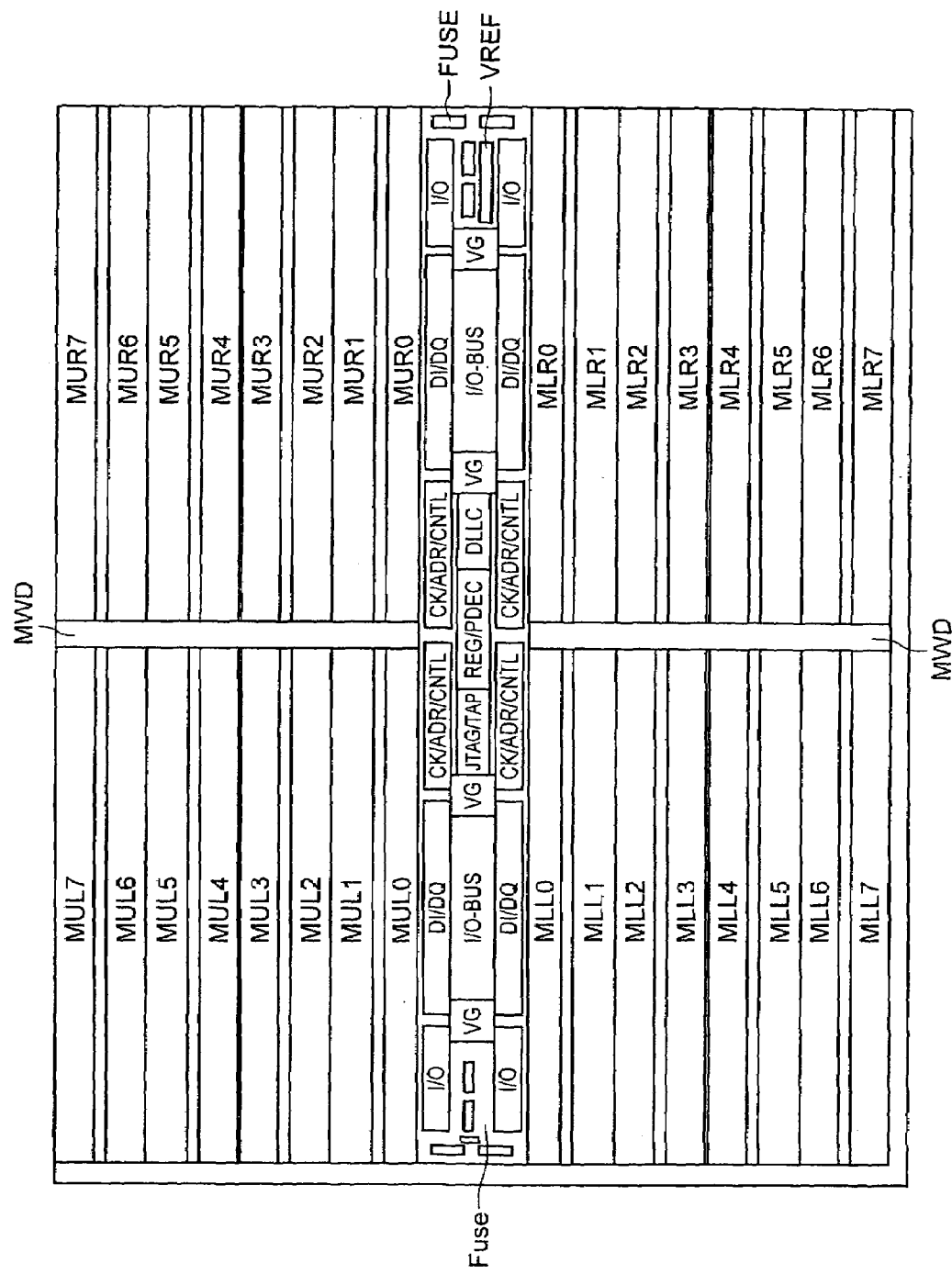
FIG. 40 is a diagram to explain a geometric layout example of main blocks of the pseudo SRAM.

FIG. 40 shows a geometric layout example of main blocks of the pseudo SRAM. In FIG. 40, MUL0 to MUL7, MUR0 to MUR7, MLL0 to MLL7, and MLR0 to MLR7 are memory cell arrays each of which including memory cells disposed in the form of an array. MWD is a main word driver. CK/ADR/CNTL indicates an input signal to receive input signals such as a clock signal, an address signal, and a memory control signal; DI/DQ is a data input/output circuit, and I/O is an input/output circuit for signals such as a mode change signal, a test signal, and a DC signal. This configuration is an example of a center pad scheme, and hence the CK/ADR/CNTL circuit, the DI/DQ circuit, and the I/O circuit are also placed in a central section of the chip. REG/PDEC indicates circuits such as a predecoder, DLLC is a clock synchronizing circuit, JTAG/TAP is a test circuit, and VG is an internal power source voltage generator. FUSE indicates a fuse circuit and is used, for example, to recover a memory array defect. VREF is a power source to generate, for example, a reference voltage to obtain an input signal.

The refresh address generator RAG is arranged in the CK/ADR/CNTL section or in the vicinity thereof and the refresh address decoder XRDEC is disposed in the REG/PDEC section or in the vicinity thereof.

Figure 41:
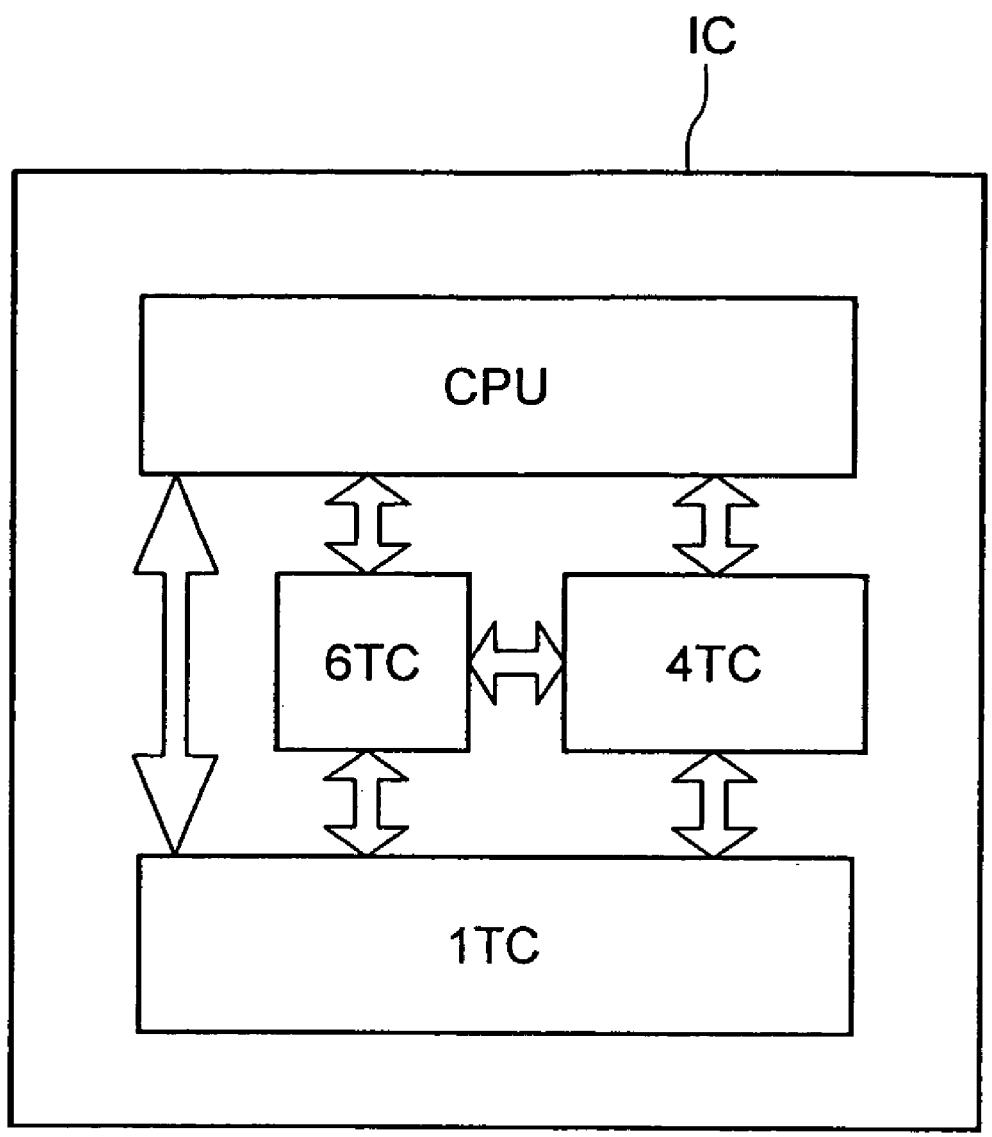
FIG. 41 is a block diagram showing a general configuration of a microcomputer employing the pseudo SRAM.

FIG. 41 shows an example of a configuration in which the pseudo SRAM is mounted on a microcomputer IC chip.

The configuration of FIG. 41 includes a central processing unit CPU and a storage 6TC including memory cells. Each memory cell includes six MOS transistors coupled with each other. The memory cell is known as shown in FIG. 1 associated with Japanese Patent Publication Reference No.

Figure 2:
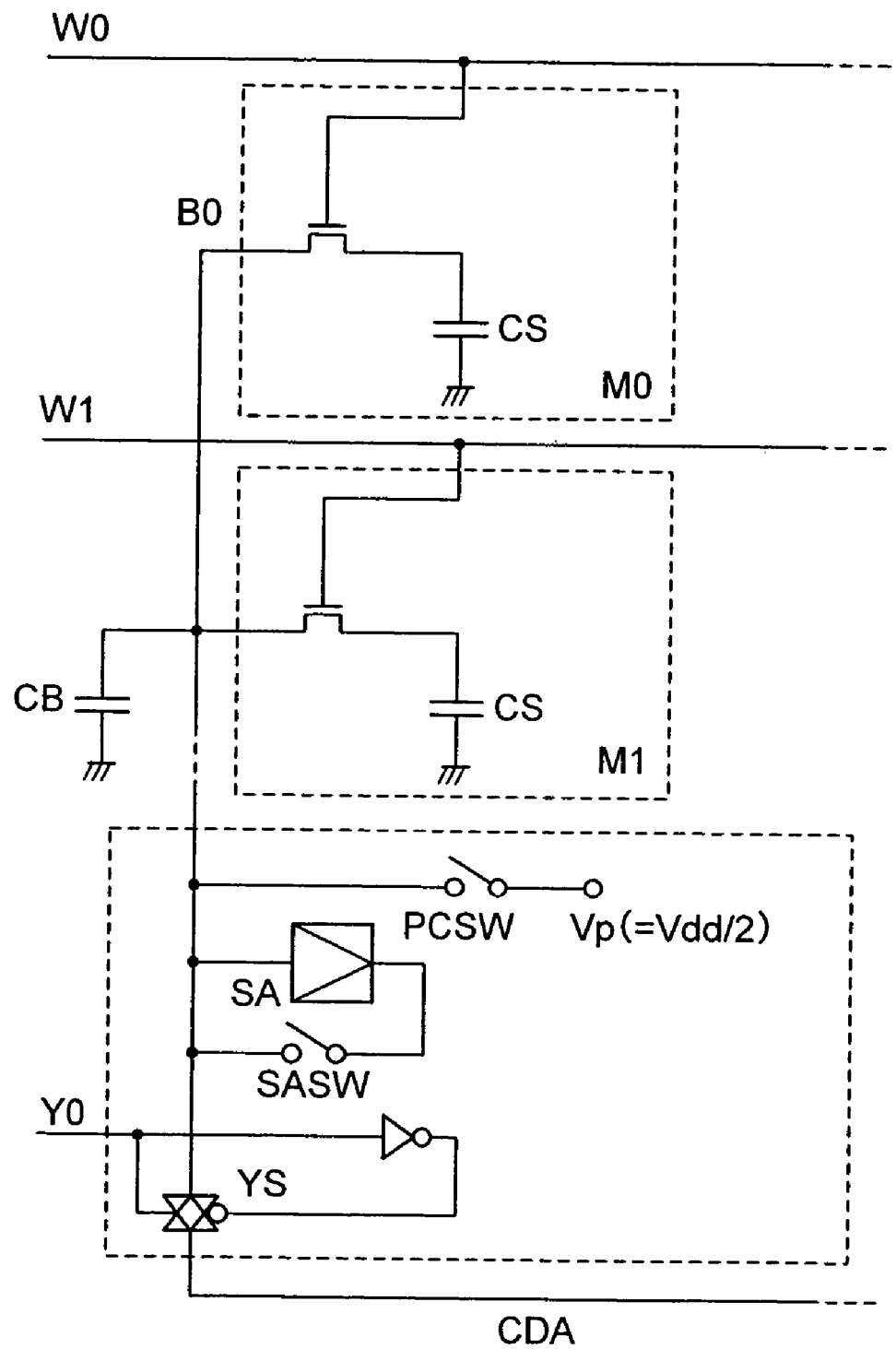
FIG. 2 a circuit diagram showing an example of main sections of a circuit for comparison with the pseudo SRAM.

10-501363. The configuration also includes storages 4TC and 1TC. The storage 4TC includes memory cells each of which includes four MOS transistors coupled with each other as shown in FIGS. 1 and 9. The storage 1TC includes memory cells each of which includes one MOS transistor and one capacitor CS coupled with each other as shown in FIG. 2. The storages 6TC, 4TC, and 1TC are different in the operation speed from each other. For example, the storage 1TC is larger in the storage capacity than the storages 6TC and 4TC, but is less in the operation speed than 6TC and 4TC. The storage 4TC is smaller in the storage capacity than the storage 1TC, but is higher in the operation speed than the storage 1TC. When memories mutually different in the storage capacity and the operation speed from each other are formed on one semiconductor substrate, the CPU can execute processing by selecting an optimal memory suitable for the processing. This advantageously improves the overall processing performance of the system.

According to the examples, there can be obtained advantages as below.

(1) By disposing the refresh address generator RAG to generate a refresh address and the refresh address decoder XRDEC to decode the refresh address, the refresh operation is conducted during a bit line recovery period after an information read or write operation. Therefore, the refresh operation can be conducted during one cycle without using up the cycle and hence the read or write operation can effectively conducted during any cycle. This prevents reduction of performance in a system using the memory.

(2) When the selector MOS transistors of a memory cell are n-channel MOS transistors, the output voltage from the memory cell is lowered by a threshold value of the n-channel MOS transistor. However, the memory cell shown in FIG. 1 includes n-channel MOS transistors as the driver MOS transistors (MN1, MN2) and p-channel MOS transistors as the selector MOS transistors (MP3, MP4). This leads to an advantage that the output voltage from the memory cell is not lowered by the threshold value of the n-channel MOS transistor.

(3) The gate size W/L is 63 for the p-channel MOS transistors MP5 and MP6 and is more than the gate size (W/L=4.5) of the driver MOS transistors MN1 and MN2 and the gate size (W/L=6.8) of the selector MOS transistors MP3 and MP4. It is therefore possible to supply a sufficient precharge current and hence the bit lines can be charged in a short period of time.

(4) The gate size W/L is 313 for the n-channel MOS transistors NBL and NBR and is more than the gate size (W/L=4.5) of the driver MOS transistors MN1 and MN2 and the gate size (W/L=6.8) of the selector MOS transistors MP3 and MP4. Therefore, by supplying a sufficient write current to the common line, it is possible to write data in the memory cell at a high speed.

(5) Both of the driver and selector MOS transistors can be formed in bulk structure. However, by forming the driver MOS transistors in bulk structure and the selector MOS transistors in vertical structure in which the selector MOS transistors are formed above the driver MOS transistors in a laminated configuration, the area occupied by the memory cell can be reduced.

(6) By disposing dummy bit lines DBA0, DBB0, etc. similar to the bit lines and by controlling the refresh start timing according to a level of the dummy bit lines, the refresh operation can be started after the level of the bit lines is at a predetermined high level. Therefore, the wrong write operation during the refresh operation can be prevented. It is possible to arrange, adjacent to the dummy bit line, a dummy bit line similar to the bit line or a dummy bit line similar in its contour to the bit line.

(7) The driver MOS transistors are formed such that the opposing area between the drain electrode and the gate electrode thereof is larger than the opposing area between the source electrode and the gate electrode thereof. Therefore, the capacitance (CMC) formed between the drain electrode and the gate electrode of the driver MOS transistor is more than the capacitance formed between the source electrode and the gate electrode, and hence a larger amount of charge can be accumulated.

(8) For the capacitance obtained between the drain electrode and the gate electrode of the driver MOS transistor, since the electrodes forming the capacitance intersect the semiconductor substrate, even when the areas of the electrodes are increased, the area of the memory cell is not increased.

(9) By selecting a plurality of word lines at the same time, the memory cells associated with the word lines are refreshed. Therefore, the refresh cycle can be elongated as much and hence the power consumption can be accordingly reduced. In this situation, when the word lines to be simultaneously selected are distributed, it is possible to prevent concentration of currents flowing through bit lines during the refresh operation. This leads to advantages that noise is reduced and disconnection of wiring due to electro-migration is prevented.

(10) It is also possible to dispose a frequency divider DIV to divide a clock signal and a shift register SFTR to shift a selection signal at timing synchronized with an output signal from the divider DIV such that a word line to be refreshed is selected according to an output signal from the shift register SFTR. In this configuration, the refresh address generator circuit RAG and the refresh address decoder XRDEC of FIG. 10 are not required. Therefore, the area and the power consumption can be reduced as much.

(11) It is possible to prevent an event in which when a power source voltage equal to or more than twice the threshold voltage of transistors of a memory cell is applied to the memory cell, the amplifying function of the memory cell is lost. Therefore, the storage nodes are not restored to the initial voltage.

(12) The period of time in which the voltage of the storage node of the memory cell decreases due to, for example, a leakage current is sufficiently longer than the cycle time for the read or write operation. In consequence, by setting the refresh cycle to be longer than the read cycle and the write cycle, the power consumption can be remarkably reduced.

(13) By disposing an ECC input circuit ECCIN capable of generating parity information for an error check and an ECC output circuit ECCOUT capable of correcting an error in readout data according to the readout data and the parity information, an error correction is conducted for the readout data. This consequently makes it possible to improve reliability of the readout data.

While the present invention has been described with reference to the specific embodiments, it is not to be restricted by those embodiments. It is to be appreciated that the embodiments can be changed or modified without departing from the scope and spirit of the present invention.

The present invention has been described with reference to cases in which the present invention is applied to a microcomputer as a field of utilization thereof. However, this does not restrict the present invention. The present invention is applicable not only to a case in which the memory device is integrally disposed in a semiconductor integrated circuit but also to a case in which the memory device is amounted as a large-scale integration (LSI) memory circuit in a board system.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A semiconductor memory device, comprising:
a plurality of word lines;
a plurality of bit lines arranged to intersect the word lines;
a plurality of memory cells arranged at intersections between the word lines and the bit lines; and
control means for selecting, in a second half of a cycle in which a first word line is selected from the word lines to conduct a read or write operation for a first memory cell coupled with the first word line, a second word line other than the first word line, and for refreshing memory cells corresponding to the second word line by an end of the cycle, wherein each of the memory cells comprises:
an amplifier section including two driver transistors of which gate electrodes and drain electrodes are respectively cross-coupled with each other; and
a switch section including selector transistors coupling the amplifier section with the bit lines according to a selection signal on the bit lines, and
either one of each of the driver transistors and each of the selector transistors is an n-channel transistor and the other one thereof is a p-type transistor.

2. A semiconductor memory device according to claim 1, further comprising precharge transistors connected to the bit lines, the precharge transistors being turned on in a recovery operation and being turned off in a read or write operation.

3. A semiconductor memory device according to claim 2, wherein in the refresh operation, the precharge transistors and selector transistors in a memory cell to be refreshed are turned on.

4. A semiconductor memory device according to claim 1, wherein the control means simultaneously selects two or more of the second word lines to refresh memory cells corresponding to the second word lines.

5. A semiconductor memory device according to claim 1, wherein the control means comprises:
a frequency divider for dividing a clock signal; and
a shift register for shifting a selection signal at timing synchronized with an output signal from the divider and
the control means selects the second word lines according to output information from the shift register to refresh memory cells corresponding to the second word lines.

6. A semiconductor memory device according to claim 1, wherein the memory cell is supplied with a power source voltage equal to or lower than 1.5 volt (V).

7. A semiconductor memory device according to claim 1, wherein a cycle of the refresh operation is longer than a cycle of the read or write operation.

8. A semiconductor memory device according to claim 1, further comprising:
an input circuit capable of generating parity information to conduct an error check; and
an output circuit capable of correcting an error of readout data read from the memory cell according to the readout data and the parity information.

9. A semiconductor memory device, comprising:
a plurality of word lines;
a plurality of bit lines arranged to intersect the word lines;
a plurality of memory cells arranged at intersections between the word lines and the bit lines; and
control means for selecting, in a second half of a cycle in which a first word line is selected from the word lines to conduct a read or write operation for a first memory cell coupled with the first word line or in another cycle, a second word line other than the first word line and refreshing memory cells corresponding to the second word line, wherein:
the memory cell comprises
an amplifier section including two driver transistors of which gate electrodes and drain electrodes are respectively cross-coupled with each other, and
a switch section including selector transistors coupling the amplifier section with the bit lines according to a selection signal on the bit line, and
precharge transistors are connected to the bit lines, the precharge transistors being turned on in a recovery operation and being turned off in a read or write operation,
a ratio between a gate width and a gate length of each of the precharge transistors being set to be more than a ratio between a gate width and a gate length of each of the driver transistors or the selector transistors.

10. A semiconductor memory device according to claim 9, further comprising write transistors connected to the bit lines, the write transistors being turned on in the write operation.

11. A semiconductor memory device according to claim 10, wherein a ratio between a gate width and a gate length of each of the write transistors is set to be more than a ratio between a gate width and a gate length of each of the driver transistors or the selector transistors.

12. A semiconductor memory device according to claim 9, wherein each of the driver transistors and the selector transistors is an n-channel MOS transistor or a p-channel MOS transistor.

13. A semiconductor memory device according to claim 12, wherein the driver transistors and the selector transistors are configured in bulk structure.

14. A semiconductor memory device according to claim 12, wherein the memory cell is supplied with a power source voltage equal to or more than twice a threshold value of the transistors of the memory cell.

15. A semiconductor memory device according to claim 12, wherein the driver transistors are configured in bulk structure and each of the selector transistors is laminated above an associated one of the driver transistors, the selector transistors being configured in vertical structure.

16. A semiconductor memory device according to claim 12, wherein the selector transistors are configured in bulk structure and each of the driver transistors is laminated above an associated one of the selector transistors, the driver transistors being configured in vertical structure.

17. A semiconductor memory device according to claim 16, wherein an opposing area between a drain electrode and a gate electrode of each of the driver transistors is more than an opposing area between a source electrode and the gate electrode thereof.

18. A semiconductor memory device according to claim 16, wherein a capacitor is formed in that the drain electrode opposes the gate electrode in each of the driver transistors, the drain and gate electrodes forming the capacitor being formed in a direction to intersect a semiconductor substrate.

19. A semiconductor memory device according to claim 9, wherein either one of each of the driver transistors and each of the selector transistors is an n-channel transistor and the other one thereof is a p-type transistor.

20. A semiconductor memory device, comprising:
a plurality of word lines;
a plurality of bit lines arranged to intersect the word lines;
a plurality of memory cells arranged at intersections between the word lines and the bit lines;
dummy bit lines similar to the bit lines; and
control means for selecting, in a second half of a cycle in which a first word line is selected from the word lines to conduct a read or write operation for a first memory cell coupled with the first word line, a second word line other than the first word line and refreshing memory cells corresponding to the second word line, wherein the memory cell comprises:
an amplifier section including two driver transistors of which gate electrodes and drain electrodes are respectively cross-coupled with each other;
a switch section including selector transistors coupling the amplifier section with the bit lines according to a selection signal on the bit line, and
the control means refresh start timing to start the refresh operation according to a level of the dummy bit lines.

21. A semiconductor memory device according to claim 20, wherein adjacent to the dummy bit lines, dummy bit lines similar to the bit lines or dummy bit lines similar in a contour to the bit lines are arranged.

22. A semiconductor memory device, comprising:
a plurality of word lines;
a plurality of bit lines arranged to intersect the word lines; and
a plurality of memory cells arranged at intersections between the word lines and the bit lines, wherein each of the memory cells comprises:
an amplifier section including two driver transistors of which gate electrodes and drain electrodes are respectively cross-coupled with each other; and
a switch section including selector transistors coupling the amplifier section with the bit lines according to a selection signal on the bit line, and
the selector transistors are configured in a bulk structure with a channel direction parallel with a substrate surface and each of the driver transistors is laminated above an associated one of the selector transistors, the driver transistors being configured in a vertical structure with a channel perpendicular to the substrate surface.

23. A semiconductor memory device according to claim 22, wherein an opposing area between a drain electrode and a gate electrode of each of the driver transistors is more than an opposing area between a source electrode and the gate electrode thereof.

24. A semiconductor memory device according to claim 22, wherein a capacitor is formed in that the drain electrode opposes the gate electrode in each of the driver transistors, the drain and gate electrodes forming the capacitor being formed in a direction to intersect a semiconductor substrate.

* * * * *

UNITED STATES PATENT AND TRADEMARK OFFICE
CERTIFICATE OF CORRECTION

| | |
|---|---|
| PATENT NO. | : 7,123,534 B2 |
| APPLICATION NO. | : 10/943895 |
| DATED | : September 20, 2004 |
| INVENTOR(S) | : Nambu et al. |

It is certified that error appears in the above-identified patent and that said Letters Patent is hereby corrected as shown below:

Col. 27 please delete claim 1 and insert the following amended claim 1.

1. A semiconductor memory device, comprising: a plurality of word lines;
    a plurality of bit lines arranged to intersect the word lines;
    a plurality of memory cells arranged at intersections between the word lines and the bit lines; and
    control means for selecting, in a second half of a cycle in which a first word line is selected from the word lines to conduct a read or write operation for a first memory cell coupled with the first word line, a second word line other than the first word line, and for refreshing memory cells corresponding to the second word line by an end of the cycle,
    wherein each of the memory cells comprises:
    an amplifier section including two driver transistors of which gate electrodes and drain electrodes are respectively cross-coupled with each other; and
    a switch section including selector transistors coupling the amplifier section with the bit lines according to a selection signal on the word lines, and
    either one of each of the driver transistors and each of the selector transistors is an n-channel transistor and the other one thereof is a p-type transistor.

Col. 27 please delete claim 4 and insert the following amended claim 4.

4. A semiconductor memory device, comprising: a plurality of word lines;
    a plurality of bit lines arranged to intersect the word lines;
    a plurality of memory cells arranged at intersections between the word lines and the bit lines; and
    control means for selecting, in a second half of a cycle in which a first word line is selected from the word lines to conduct a read or write operation for a first memory cell coupled with the first word line or in another cycle, a second word line other than the first word line and refreshing memory cells corresponding to the second word line, wherein:
    the memory cell comprises
    an amplifier section including two driver transistors of which gate electrodes and drain electrodes are respectively cross-coupled with each other, and
    a switch section including selector transistors coupling the amplifier section with the bit lines according to a selection signal on the word line, and precharge transistors are connected to the bit lines, the precharge transistors being turned on in a recovery operation and being turned off in a read or write operation,

UNITED STATES PATENT AND TRADEMARK OFFICE
CERTIFICATE OF CORRECTION

| | |
|---|---|
| PATENT NO. | : 7,123,534 B2 |
| APPLICATION NO. | : 10/943895 |
| DATED | : September 20, 2004 |
| INVENTOR(S) | : Nambu et al. |

It is certified that error appears in the above-identified patent and that said Letters Patent is hereby corrected as shown below:

> a ratio between a gate width and a gate length of each of the precharge transistors being set to be more than a ratio between a gate width and a gate length of each of the driver transistors or the selector transistors.

Col. 28 please delete claim 12 and insert the following amended claim 12.

> 12. A semiconductor memory device, comprising: a plurality of word lines;
> a plurality of bit lines arranged to intersect the word lines;
> a plurality of memory cells arranged at intersections between the word lines and the bit lines;
> dummy bit lines similar to the bit lines; and
> control means for selecting, in a second half of a cycle in which a first word line is selected from the word lines to conduct a read or write operation for a first memory cell coupled with the first word line, a second word line other than the first word line and refreshing memory cells corresponding to the second word line, wherein the memory cell comprises:
> an amplifier section including two driver transistors of which gate electrodes and drain electrodes are respectively cross-coupled with each other;
> a switch section including selector transistors coupling the amplifier section with the bit lines according to a selection signal on the word line, and
> the control means refresh start timing to start the refresh operation according to a level of the dummy bit lines.

Col. 30 please delete claim 22 and insert the following amended claim 22.

> 22. A semiconductor memory device, comprising: a plurality of word lines;
> a plurality of bit lines arranged to intersect the word lines; and
> a plurality of memory cells arranged at intersections between the word lines and the bit lines, wherein each of the memory cells comprises:
> an amplifier section including two driver transistors of which gate electrodes and drain electrodes are respectively cross-coupled with each other; and
> a switch section including selector transistors coupling the amplifier section with the bit lines according to a selection signal on the word line, and

UNITED STATES PATENT AND TRADEMARK OFFICE
CERTIFICATE OF CORRECTION

| | | |
|---|---|---|
| PATENT NO. | : 7,123,534 B2 | |
| APPLICATION NO. | : 10/943895 | |
| DATED | : September 20, 2004 | |
| INVENTOR(S) | : Nambu et al. | |

It is certified that error appears in the above-identified patent and that said Letters Patent is hereby corrected as shown below:

the selector transistors are configured in a bulk structure with a channel direction parallel with a substrate surface and each of the driver transistors is laminated above an associated one of the selector transistors, the driver transistors being configured in a vertical structure with a channel perpendicular to the substrate surface.

Signed and Sealed this

Ninth Day of September, 2008

JON W. DUDAS
*Director of the United States Patent and Trademark Office*

UNITED STATES PATENT AND TRADEMARK OFFICE
CERTIFICATE OF CORRECTION

PATENT NO.         : 7,123,534 B2
APPLICATION NO.    : 10/943895
DATED              : October 17, 2006
INVENTOR(S)        : Nambu et al.

It is certified that error appears in the above-identified patent and that said Letters Patent is hereby corrected as shown below:

Col. 27, lines 11-32, please delete claim 1 and insert the following amended claim 1.

1. A semiconductor memory device, comprising: a plurality of word lines;
a plurality of bit lines arranged to intersect the word lines;
a plurality of memory cells arranged at intersections between the word lines and the bit lines; and
control means for selecting, in a second half of a cycle in which a first word line is selected from the word lines to conduct a read or write operation for a first memory cell coupled with the first word line, a second word line other than the first word line, and for refreshing memory cells corresponding to the second word line by an end of the cycle,
wherein each of the memory cells comprises:
an amplifier section including two driver transistors of which gate electrodes and drain electrodes are respectively cross-coupled with each other; and
a switch section including selector transistors coupling the amplifier section with the bit lines according to a selection signal on the word lines, and
either one of each of the driver transistors and each of the selector transistors is an n-channel transistor and the other one thereof is a p-type transistor.

Col. 27, lines 42-45, please delete claim 4 and insert the following amended claim 4.

4. A semiconductor memory device, comprising: a plurality of word lines;
a plurality of bit lines arranged to intersect the word lines;
a plurality of memory cells arranged at intersections between the word lines and the bit lines; and
control means for selecting, in a second half of a cycle in which a first word line is selected from the word lines to conduct a read or write operation for a first memory cell coupled with the first word line or in another cycle, a second word line other than the first word line and refreshing memory cells corresponding to the second word line, wherein:
the memory cell comprises
an amplifier section including two driver transistors of which gate electrodes and drain electrodes are respectively cross-coupled with each other, and
a switch section including selector transistors coupling the amplifier section with the bit lines according to a selection signal on the word line, and precharge transistors are connected to the bit lines, the precharge transistors being turned on in a recovery operation and being turned off in a read or write operation,

UNITED STATES PATENT AND TRADEMARK OFFICE
CERTIFICATE OF CORRECTION

PATENT NO. : 7,123,534 B2
APPLICATION NO. : 10/943895
DATED : October 17, 2006
INVENTOR(S) : Nambu et al.

It is certified that error appears in the above-identified patent and that said Letters Patent is hereby corrected as shown below:

a ratio between a gate width and a gate length of each of the precharge transistors being set to be more than a ratio between a gate width and a gate length of each of the driver transistors or the selector transistors.

Col. 28, lines 38-41, please delete claim 12 and insert the following amended claim 12.

12. A semiconductor memory device, comprising: a plurality of word lines;
a plurality of bit lines arranged to intersect the word lines;
a plurality of memory cells arranged at intersections between the word lines and the bit lines;
dummy bit lines similar to the bit lines; and
control means for selecting, in a second half of a cycle in which a first word line is selected from the word lines to conduct a read or write operation for a first memory cell coupled with the first word line, a second word line other than the first word line and refreshing memory cells corresponding to the second word line, wherein the memory cell comprises:
an amplifier section including two driver transistors of which gate electrodes and drain electrodes are respectively cross-coupled with each other;
a switch section including selector transistors coupling the amplifier section with the bit lines according to a selection signal on the word line, and
the control means refresh start timing to start the refresh operation according to a level of the dummy bit lines.

Col. 30, lines 1-20, please delete claim 22 and insert the following amended claim 22.

22. A semiconductor memory device, comprising: a plurality of word lines;
a plurality of bit lines arranged to intersect the word lines; and
a plurality of memory cells arranged at intersections between the word lines and the bit lines, wherein each of the memory cells comprises:
an amplifier section including two driver transistors of which gate electrodes and drain electrodes are respectively cross-coupled with each other; and
a switch section including selector transistors coupling the amplifier section with the bit lines according to a selection signal on the word line, and

UNITED STATES PATENT AND TRADEMARK OFFICE
CERTIFICATE OF CORRECTION

PATENT NO. : 7,123,534 B2
APPLICATION NO. : 10/943895
DATED : October 17, 2006
INVENTOR(S) : Nambu et al.

It is certified that error appears in the above-identified patent and that said Letters Patent is hereby corrected as shown below:

the selector transistors are configured in a bulk structure with a channel direction parallel with a substrate surface and each of the driver transistors is laminated above an associated one of the selector transistors, the driver transistors being configured in a vertical structure with a channel perpendicular to the substrate surface.

This certificate supersedes the Certificate of Correction issued September 9, 2008.

Signed and Sealed this

Seventh Day of October, 2008

JON W. DUDAS
*Director of the United States Patent and Trademark Office*